United States Patent
Jinta

(10) Patent No.: US 7,782,121 B2
(45) Date of Patent: Aug. 24, 2010

(54) VOLTAGE SUPPLY CIRCUIT, DISPLAY DEVICE, ELECTRONIC EQUIPMENT, AND VOLTAGE SUPPLY METHOD

(75) Inventor: Seiichiro Jinta, Kanagawa (JP)

(73) Assignee: Sony Corporation, Tokyo (JP)

( * ) Notice: Subject to any disclaimer, the term of this patent is extended or adjusted under 35 U.S.C. 154(b) by 293 days.

(21) Appl. No.: 12/000,702

(22) Filed: Dec. 17, 2007

(65) Prior Publication Data
US 2008/0157744 A1    Jul. 3, 2008

(30) Foreign Application Priority Data
Dec. 28, 2006    (JP)    ............................. 2006-355771

(51) Int. Cl.
*G05F 1/10*    (2006.01)
(52) U.S. Cl. ........................... 327/536; 327/537; 363/59
(58) Field of Classification Search ................ 327/536, 327/537; 363/59
See application file for complete search history.

(56) References Cited

U.S. PATENT DOCUMENTS

| | | | | |
|---|---|---|---|---|
| 5,831,844 | A * | 11/1998 | Sudo | ............................ 363/60 |
| 6,316,760 | B1 * | 11/2001 | Koyama | .................. 250/208.1 |
| 7,274,227 | B2 * | 9/2007 | Hsu | ............................. 327/143 |
| 7,548,109 | B2 * | 6/2009 | Kajiwara et al. | ............. 327/536 |
| 2006/0256592 | A1 * | 11/2006 | Yoshida et al. | ................ 363/59 |
| 2007/0069803 | A1 * | 3/2007 | Yamamoto et al. | .......... 327/536 |
| 2008/0054992 | A1 * | 3/2008 | Kajiwara et al. | ............. 327/537 |

FOREIGN PATENT DOCUMENTS

| | | |
|---|---|---|
| JP | 2005-123864 | 5/2005 |
| JP | 2005-123865 | 5/2005 |
| JP | 2005-143068 | 6/2005 |
| JP | 2005-149624 | 6/2005 |

\* cited by examiner

*Primary Examiner*—Bao Q Vu
(74) *Attorney, Agent, or Firm*—Rader, Fishman & Grauer PLLC

(57) ABSTRACT

A voltage supply circuit including: first and second nodes; a predetermined potential; and an output transistor having its control terminal connected to the first node, its first terminal connected to the second node and its second terminal connected to an output terminal. The circuit further includes: a switching element which turns on in response to an active reset signal to connect the potential and the first and second nodes together; a first capacitor connected to the first node and supplied with a clock; a second capacitor connected to the second node and supplied with another clock; and an adjustment section adapted to adjust the clock amplitudes so that the potentials of the first and second nodes vary with a predetermined difference maintained therebetween. The reset signal is basically reverse in phase to the clocks.

14 Claims, 46 Drawing Sheets

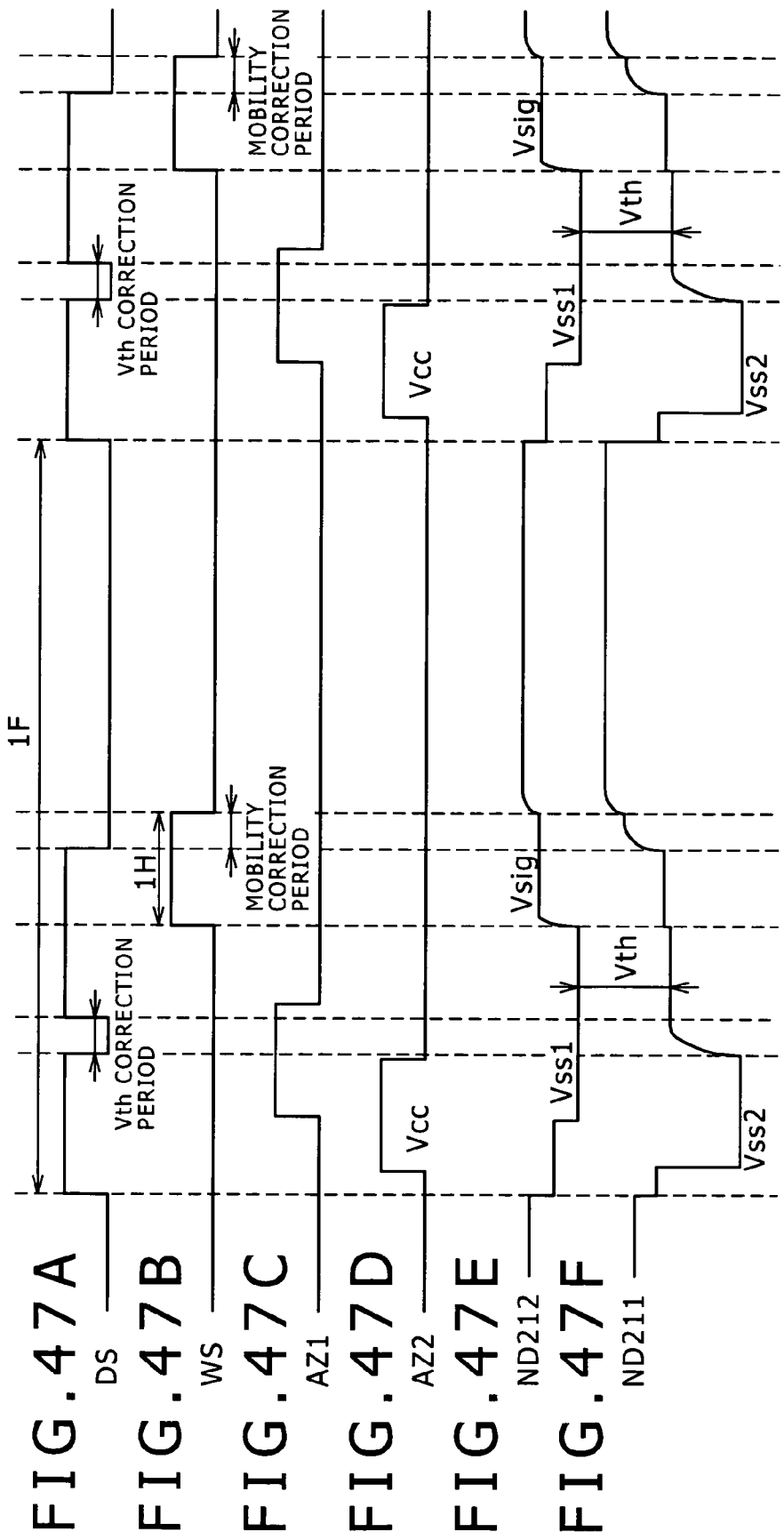

VOLTAGE SUPPLY CIRCUIT, DISPLAY DEVICE, ELECTRONIC EQUIPMENT, AND VOLTAGE SUPPLY METHOD

CROSS REFERENCES TO RELATED APPLICATIONS

The present invention contains subject matter related to Japanese Patent Application JP 2006-355771 filed with the Japan Patent Office on Dec. 28, 2006, the entire contents of which being incorporated herein by reference.

BACKGROUND OF THE INVENTION

1. Field of the Invention

The present invention relates to a voltage supply circuit including components such as a DC-DC converter adapted to supply a positive or negative drive voltage to a display device driver. The present invention also relates to a display device and electronic equipment having the same and a voltage supply method using the same.

2. Description of the Related Art

An image display device such as liquid crystal display or organic EL (Electro luminescence) display has a number of pixels arranged in a matrix form. Such a display device displays an image by controlling the optical intensity of each pixel according to image information to be displayed.

In this type of display device, a power supply circuit including a DC-DC converter may be provided in the display panel.

FIG. 1 is a circuit diagram illustrating a configuration example of a DC-DC converter. FIG. 2 is a timing diagram of the DC-DC converter illustrated in FIG. 1.

A DC-DC converter 1 illustrated in FIG. 1 has an output transistor 2 formed by an n-channel MOS (NMOS) transistor (n1). The DC-DC converter 1 also has other transistors 3 and 4 formed by p-channel MOS (PMOS) transistors (p1, p2).

A node A is formed by a connection point between the source of the output transistor 2 and the drain of the transistor 3. A node B is connected to the gate of the output transistor 2, the gate of the transistor 3 and the drain of the transistor 4.

The node A is connected to a capacitor 5 (Cap1) supplied with a clock CKg. The node B is connected to a capacitor 6 (Cap2) supplied with a clock xCKg which is reverse in phase to the clock CKg.

In the DC-DC converter 1, the gate and source of the output transistor 2 are supplied with the capacitively coupled clock pulses, thus generating a negative supply voltage Vssg.

Incidentally, the D-D converter has a CMOS configuration.

Among techniques to provide larger panel production volume is a technique in which a TFT circuit is configured using single-type transistors (transistors of identical polarity) (PMOS or NMOS).

A variety of single-type configuration circuits have been proposed for level shifter, buffer, inverter, and shift register used in this type of power supply circuit. For more information, refer to Japanese Patent Laid-Open Nos. 2005-123864, 2005-123865, 2005-143068, 2005-149624.

SUMMARY OF THE INVENTION

However, forming a panel with these circuits requires several types of power supplies.

Normally, a panel having a CMOS configuration receives two supply voltages (including GND) from external sources and generates others within itself.

This results in increased number of manufacturing processes, making it difficult to provide greater production volume.

Further, it is more advantageous in terms of cost to have a DC-DC converter in the panel rather than having one thereoutside. Therefore, it is desirable to provide a DC-DC converter in the panel even in the case of a single-type configuration.

It is desirable to provide a voltage supply circuit, a display device and electronic equipment having the same, and a voltage supply method using the same, which can be incorporated in a panel and other device formed by transistors of identical polarity and which can ensure greater production volume, reduced manufacturing processes and cost.

A voltage supply circuit according to a first embodiment of the present invention includes first and second nodes and a predetermined potential. The voltage supply circuit further includes an output transistor having its control terminal connected to the first node, its first terminal connected to the second node, and its second terminal connected to an output terminal. The voltage supply circuit still further includes a switching element which turns on in response to an active reset signal to connect the potential and the first and second nodes together. The voltage supply circuit still further includes a first capacitor connected to the first node and supplied with a clock and a second capacitor connected to the second node and supplied with another clock. The voltage supply circuit still further includes an adjustment section adapted to adjust the clock amplitudes so that the potentials of the first and second nodes vary with a predetermined difference maintained therebetween. The reset signal is basically reverse in phase to the clock.

Preferably, the adjustment section has the capability to generate first and second clocks different in amplitude from each other and feed the first clock to the first capacitor and the second clock to the second capacitor. The same section sets the first clock to an amplitude larger than that of the second clock.

Preferably, the adjustment section has an additional capacitance connected to the second node and the capability to feed a single clock in parallel to the first and second capacitors.

A display device according to a second embodiment of the present invention includes a plurality of pixel circuits arranged in a matrix manner. The display device further includes at least a scanner operable to output a drive signal adapted to drive elements forming the pixel circuits. The display device still further includes a voltage supply circuit adapted to supply a drive voltage to the scanner. The voltage supply circuit includes first and second nodes and a predetermined potential. The voltage supply circuit further includes an output transistor having its control terminal connected to the first node, its first terminal connected to the second node, and its second terminal connected to an output terminal. The voltage supply circuit still further includes a switching element which turns on in response to an active reset signal to connect the predetermined potential and the first and second nodes together. The voltage supply circuit still further includes a first capacitor connected to the first node and supplied with a clock and a second capacitor connected to the second node and supplied with another clock. The voltage supply circuit still further includes an adjustment section adapted to adjust the clock amplitudes so that the potentials of the first and second nodes vary with a predetermined difference maintained therebetween. The reset signal is basically reverse in phase to the clocks.

A third embodiment of the present invention is electronic equipment having a display device. The display device includes a plurality of pixel circuits arranged in a matrix manner. The display device further includes at least a scanner operable to output a drive signal adapted to drive elements forming the pixel circuits. The display device still further includes a voltage supply circuit adapted to supply a drive voltage to the scanner. The voltage supply circuit includes first and second nodes and a predetermined potential. The voltage supply circuit further includes an output transistor having its control terminal connected to the first node, its first terminal connected to the second node, and its second terminal connected to an output terminal. The voltage supply circuit still further includes a switching element which turns on in response to an active reset signal to connect the potential and the first and second nodes together. The voltage supply circuit still further includes a first capacitor connected to the first node and supplied with a clock and a second capacitor connected to the second node and supplied with another clock. The voltage supply circuit still further includes an adjustment section adapted to adjust the clock amplitudes so that the potentials of the first and second nodes vary with a predetermined difference maintained therebetween. The reset signal is basically reverse in phase to the clock.

A fourth embodiment of the present invention is a voltage supply method for supplying voltage using first and second capacitors and an output transistor. The first capacitor is connected to a first node and supplied with a clock. The second capacitor is connected to a second node and supplied with another clock. The output transistor has its control terminal connected to the first node, its first terminal connected to the second node, and its second terminal connected to an output terminal. The voltage supply method includes first, second and third steps. The first step connects a predetermined potential and the first and second nodes while a reset signal which is basically reverse in phase to the clock is active. The second step adjusts the clock amplitude so that the potentials of the first and second nodes vary with a predetermined difference maintained therebetween. The third step outputs a voltage commensurate with the potential of the second node from the output transistor in response to a variation in potential.

According to the embodiments of the present invention, the switching element turns on while the reset signal is active, initializing, for example, the first and second nodes to a predetermined potential level.

The first and second nodes vary in potential with change in amplitude of the first and second clocks relative to the predetermined potential.

A predetermined potential is output from the output transistor as a result of a variation in potential of the first and second nodes.

A voltage supply circuit according to one embodiment of the present invention can be incorporated in a panel formed by transistors of identical polarity, providing improved production volume and ensuring reduced manufacturing processes and cost.

BRIEF DESCRIPTION OF THE DRAWINGS

FIGS. 47A to 47F are timing diagrams illustrating the basic operation of the pixel circuit shown in FIG. 46.

DETAILED DESCRIPTION OF THE PREFERRED EMBODIMENTS

The preferred embodiments of the present invention will be described below with reference to the accompanying drawings.

First Embodiment

Figure 1:
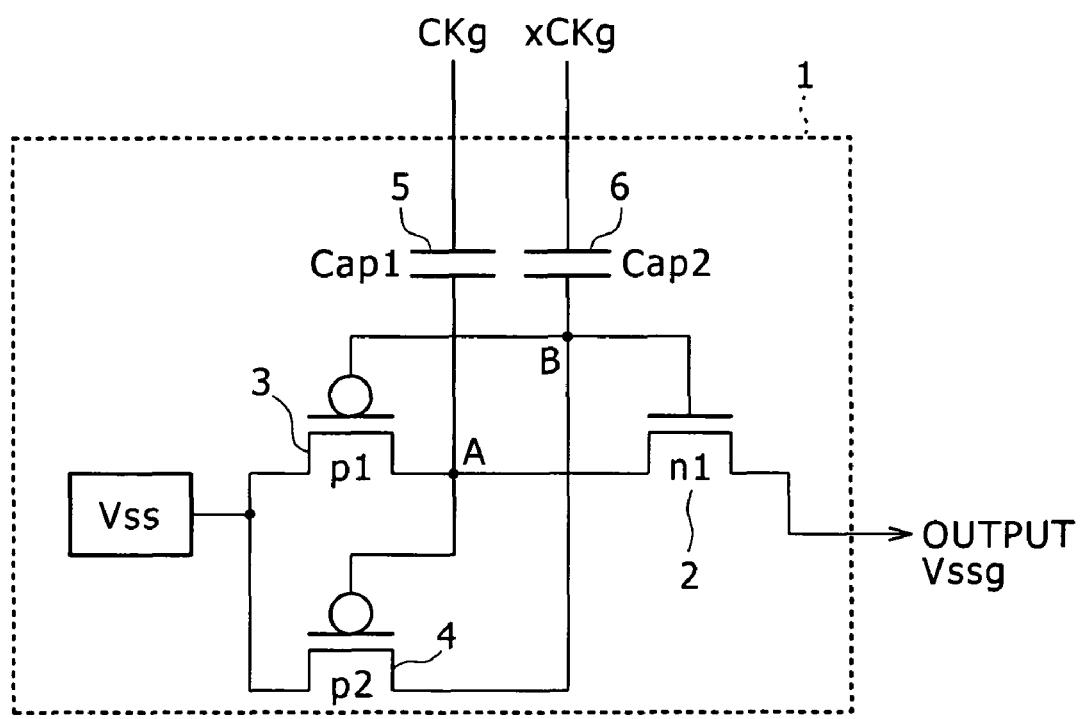
FIG. 1 is a circuit diagram illustrating a DC-DC converter having a CMOS configuration.
Figure 2:
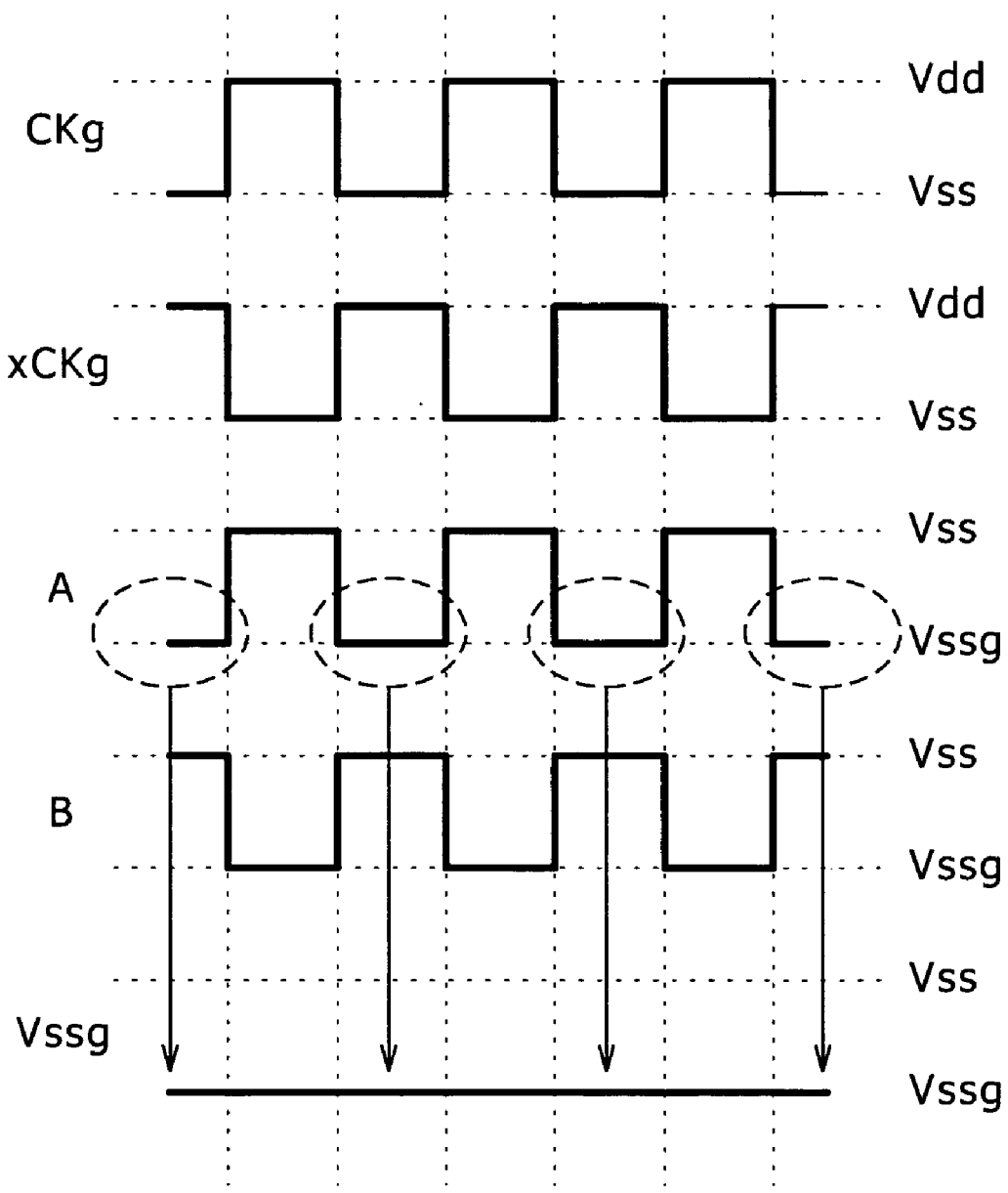
FIG. 2 is a timing diagram of the DC-DC converter illustrated in FIG. 1.
Figure 3:
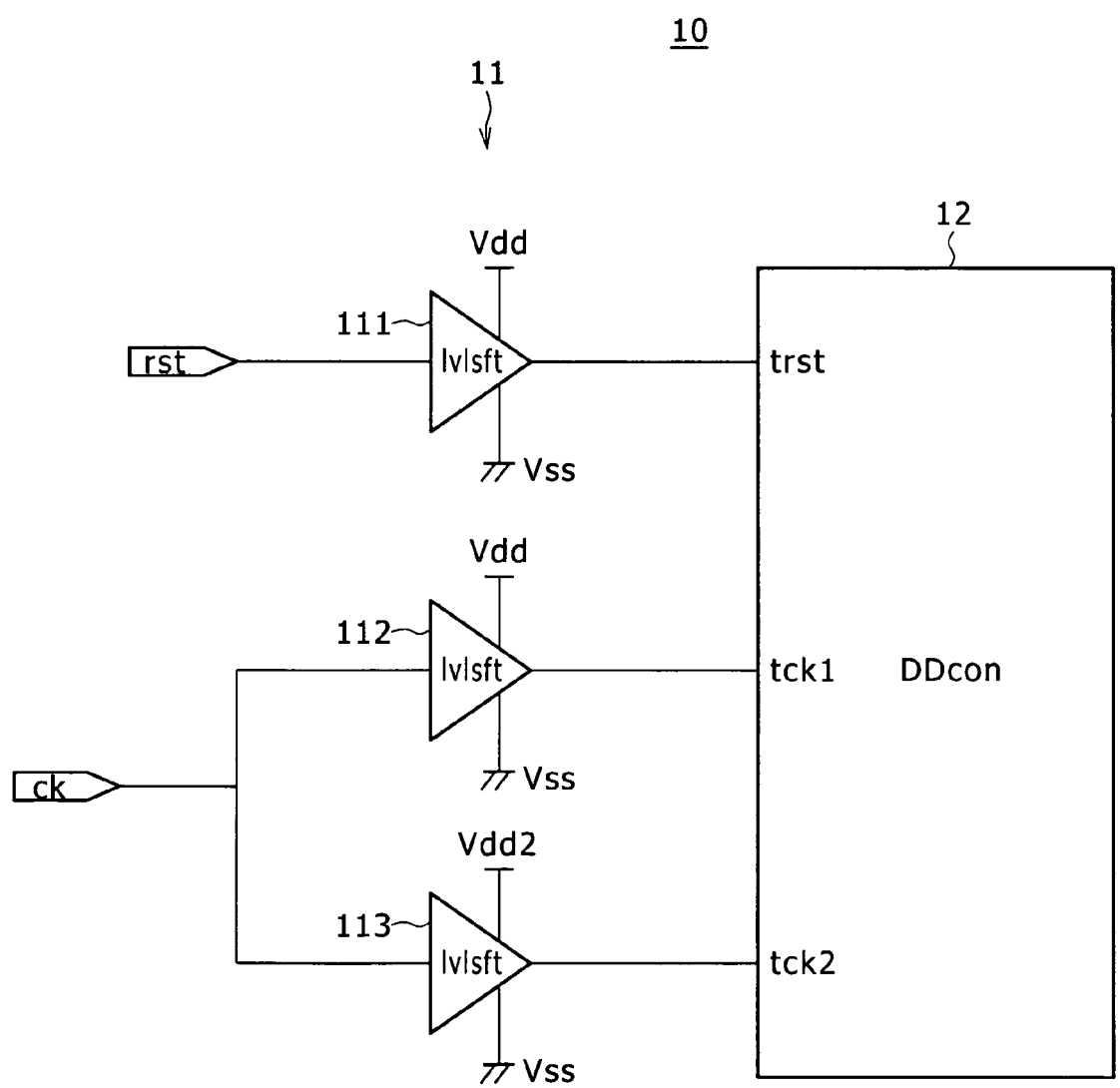
FIG. 3 is a block diagram illustrating a configuration example of a voltage supply circuit according to a first embodiment of the present invention.
Figure 4:
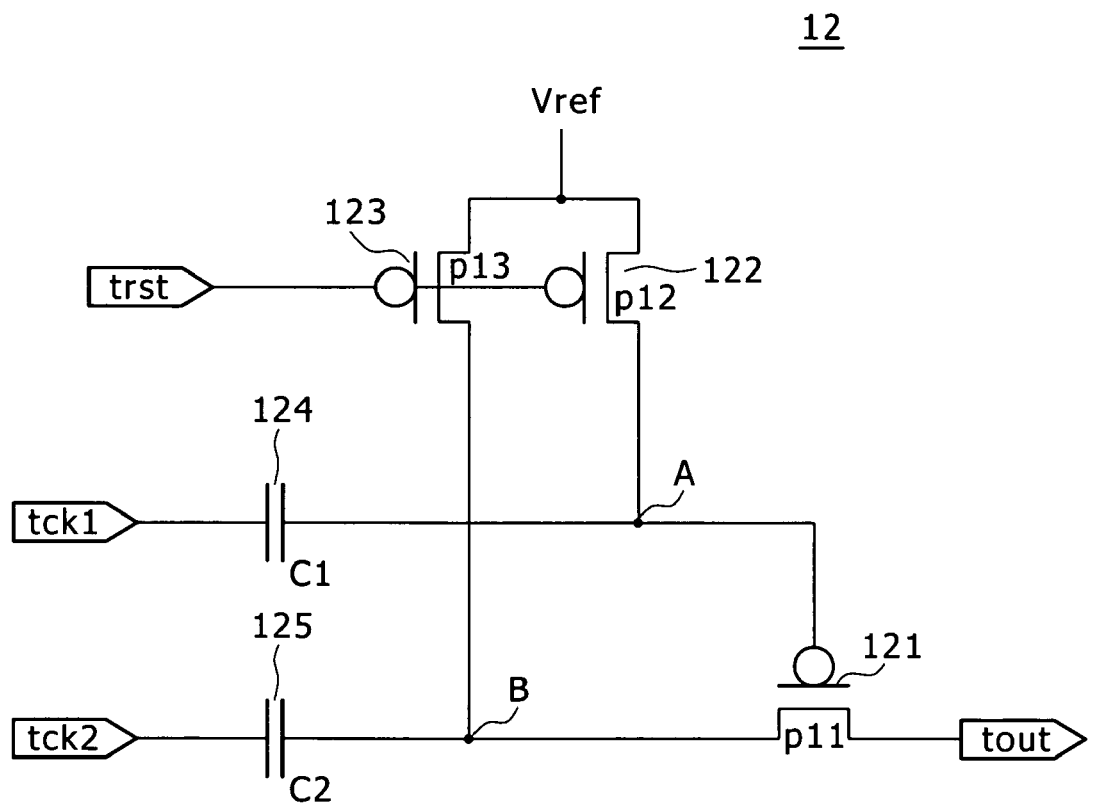
FIG. 4 is a circuit diagram illustrating a configuration example of a DC-DC converter according to the first embodiment.
Figure 5:
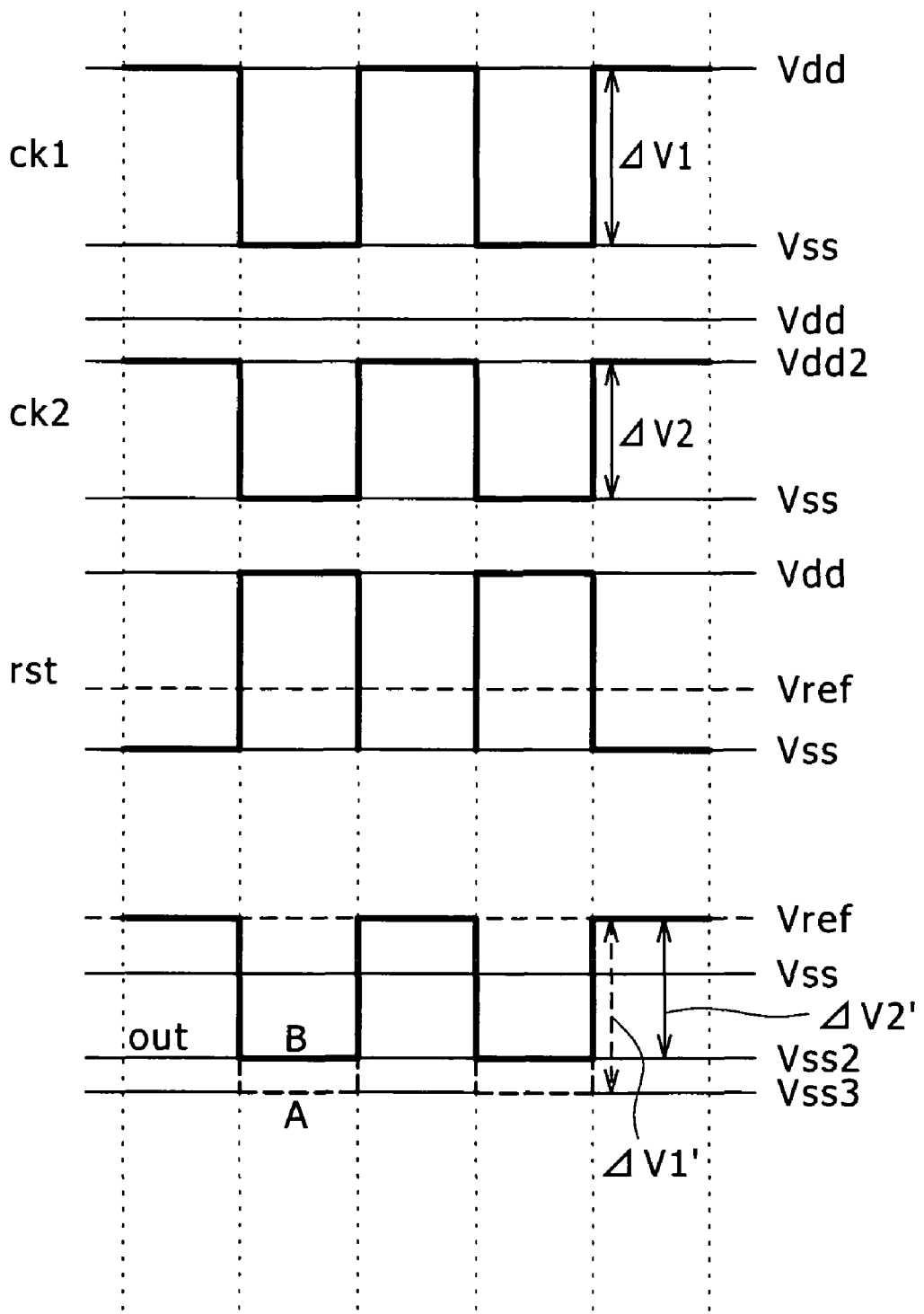
FIG. 5 is a timing diagram of the voltage supply circuit according to the first embodiment.

FIG. 3 is a block diagram illustrating a configuration example of a voltage supply circuit according to a first embodiment of the present invention. FIG. 4 is a circuit diagram illustrating a configuration example of a DC-DC converter according to the first embodiment. FIG. 5 is a timing diagram of the voltage supply circuit according to the first embodiment.

A voltage supply circuit 10 according to the first embodiment includes an adjustment section 11 and a DC-DC converter (DDcon) 12.

A denotes a first node, B a second node, ck1 and ck2 first and second clocks which are in phase with each other, and rst a reset signal which is basically reverse in phase to the clocks ck1 and ck2.

The adjustment section 11 has level shifters (lvlsft) 111, 112 and 113 adapted to adjust the levels of the reset signal rst and the clocks ck1 and ck2.

The level shifter 111 shifts the amplitude of the reset signal rst to produce a signal having an intermediate amplitude between a supply voltage Vdd and a ground potential GND and supplies the signal to the DC-DC converter 12.

The level shifter 112 shifts the amplitude of the clock ck1 to produce a signal having an intermediate amplitude between the supply voltage Vdd and the ground potential GND and supplies the signal to the DC-DC converter 12.

The level shifter 113 shifts the amplitude of the clock ck2 to produce a signal having an intermediate amplitude between a supply voltage Vdd2 and the ground potential GND and supplies the signal to the DC-DC converter 12.

The supply voltages Vdd and Vdd2 satisfy the relationship Vdd>Vdd2.

Therefore, when the first and second clocks ck1 and ck2 supplied to the DC-DC converter 12 are compared, an amplitude $\Delta V1$ of the first clock ck1 is larger than an amplitude $\Delta V2$ of the second clock ck2 ($\Delta V1 > \Delta V2$).

For example, Vdd is set to 10V, and Vdd2 to 8V.

The DC-DC converter 12 includes an output transistor 121 (p11) formed by a PMOS transistor, switching transistors (switching elements) 122 (p12) and 123 (p13) formed similarly by PMOS transistors, and first and second capacitors 124 and 125, as illustrated in FIG. 4.

On the other hand, Vref in the figure denotes a predetermined potential. Further, C1 denotes the capacitance of the first capacitor 124, and C2 the capacitance of the second capacitor 125.

The output transistor 121 has its gate connected to the first node A, its source connected to the second node B, and its drain connected to an output terminal tout.

The switching transistor elements 122 and 123 have their sources connected to the predetermined potential Vref. The switching transistor 122 has its drain connected to the first node A. The switching transistor 123 has its drain connected to the second node B. The switching transistors 122 and 123 have their gates connected to an input terminal trst of the reset signal rst (output of the level shifter 111).

The first capacitor 124 has its first electrode connected to the first node A and its second electrode connected to an input terminal tck1 of the clock ck1 (output of the level shifter 112).

The second capacitor 125 has its first electrode connected to the second node B and its second electrode connected to an input terminal tck2 of the clock ck2 (output of the level shifter 113).

In the DC-DC converter 12 configured as described above, the amplitudes of the clocks are adjusted by the adjustment section 11 so that the potential ΔV1 of the first node A is larger than the potential ΔV2 of the second node B.

More specifically, as described above, when the first and second clocks ck1 and ck2 supplied to the DC-DC converter 12 are compared, the amplitude ΔV1 of the first clock ck1 is larger than the amplitude ΔV2 of the second clock ck2 (ΔV1>ΔV2).

The first and second clocks ck1 and ck2 cause the potentials of the first and second nodes A and B to change via the first and second capacitors 124 and 125.

As illustrated in FIG. 5, the switching transistors 122 and 123 are on while the reset pulse signal rst is at low level. This causes the first and second nodes A and B to be initialized to the predetermined potential Vref.

The first and second nodes A and B vary in potential relative to the predetermined potential Vref respectively at the amplitudes of the clocks ck1 and ck2.

A negative potential Vss2 is output from the output transistor 121 as a result of variations in potential of the first and second nodes A and B.

The negative potential Vss2 is the low (Lo) potential of the second node B. A negative potential Vss3 is the low (Lo) potential of the first node A.

Here, letting a threshold voltage Vth of the output transistor 121 be denoted by Vth(p11), the output condition of the negative potential Vss2 can be expressed as follows:

[Equation 1]

$$Vss3-Vss2<Vth(p11) \tag{1}$$

Letting a parasitic capacitance of the first node A and that of the second node B be denoted respectively by Cpa and Cpb, the amplitudes ΔV1' and ΔV2' of the first and second nodes A and B can be determined by equations (2) and (3) given below.

[Equation 2]

$$\Delta V1'=\Delta V1 \times C1/(C1+Cpa) \tag{2}$$

[Equation 3]

$$\Delta V2'=\Delta V2 \times C2/(C2+Cpb) \tag{3}$$

Hence, the amplitudes of the clocks ck1 and ck2 must be determined in consideration of the relationship between the aforementioned Equations (1), (2) and (3).

Using the amplitudes ΔV1' and ΔV2' of the first and second nodes A and B, the drive condition of the output transistor 121 can be expressed as follows:

[Equation 4]

$$\Delta V2'-\Delta V1'<Vth(p11) \tag{4}$$

Here, if ΔV1 and ΔV2 are correlated with each other by using a factor k as shown below in Equation (5), the relationship as shown in Equation (6) can be obtained.

[Equation 5]

$$k\Delta V2=\Delta V1 \tag{5}$$

[Equation 6]

$$\{C2/(C2+Cpb)-kC1/(C1+Cpa)\}\Delta V2<Vth(p11) \tag{6}$$

According to the first embodiment, the DC-DC converter includes the output transistor 121, the switching transistors 122 and 123, the first and second capacitors 124 and 125 and the adjustment section 11. The output transistor 121 has its gate (control terminal) connected to the first node A, its source connected to the second node B, and its drain connected to the output terminal tout. The switching transistor 122 has its source connected to the predetermined potential Vref, its drain connected to the first node A, and its gate connected to the supply line of the reset signal rst. The switching transistor 123 has its source connected to the predetermined potential Vref, its drain connected to the second node B, and its gate connected to the supply line of the reset signal rst. The first capacitor 124 has its first electrode connected to the first node A and its second electrode connected to the supply line of the first clock ck1. The second capacitor 125 has its first electrode connected to the second node B and its second electrode connected to the supply line of the second clock ck2. The adjustment section 11 adjusts the amplitudes of the first and second clocks ck1 and ck2 so that the amplitude ΔV1 of the first clock is larger than the amplitude ΔV2 of the second clock and that the potentials of the first and second nodes vary in accordance with the adjusted amplitudes. The first and second clocks ck1 and ck2 are in phase with each other. The reset signal is basically reverse in phase to the clocks. As a result, the DC-DC converter according to the first embodiment provides the following effects.

The DC-DC converter can be formed by transistors of identical polarity such as p-channel transistors (e.g., TFTs), thus allowing to output a negative potential in an accurate manner.

This permits the DC-DC converter to be incorporated in a panel formed by transistors of identical polarity, providing improved production volume and ensuring reduced manufacturing processes and cost.

Second Embodiment

Figure 6:
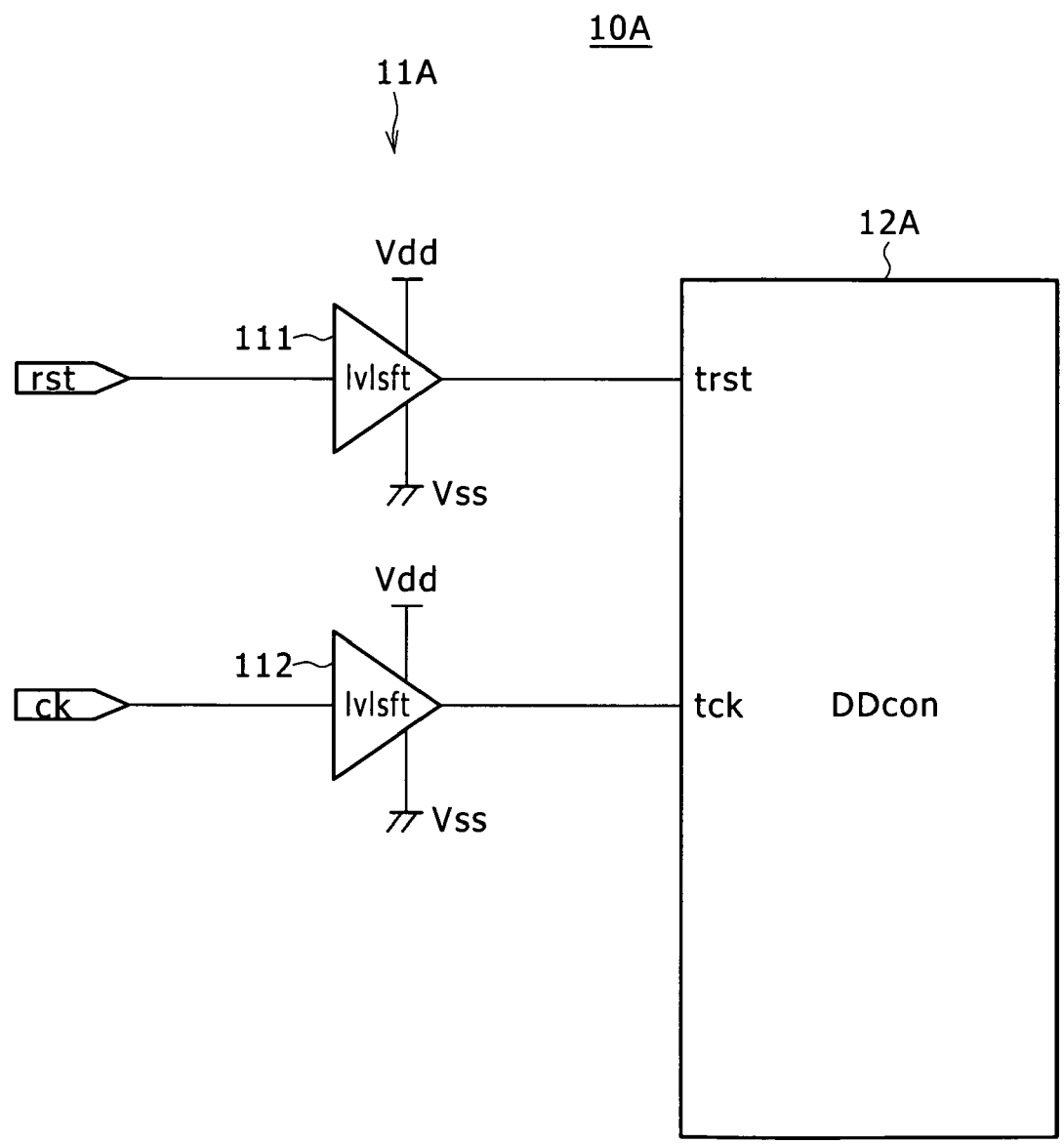
FIG. 6 is a block diagram illustrating a configuration example of the voltage supply circuit according to a second embodiment of the present invention.
Figure 7:
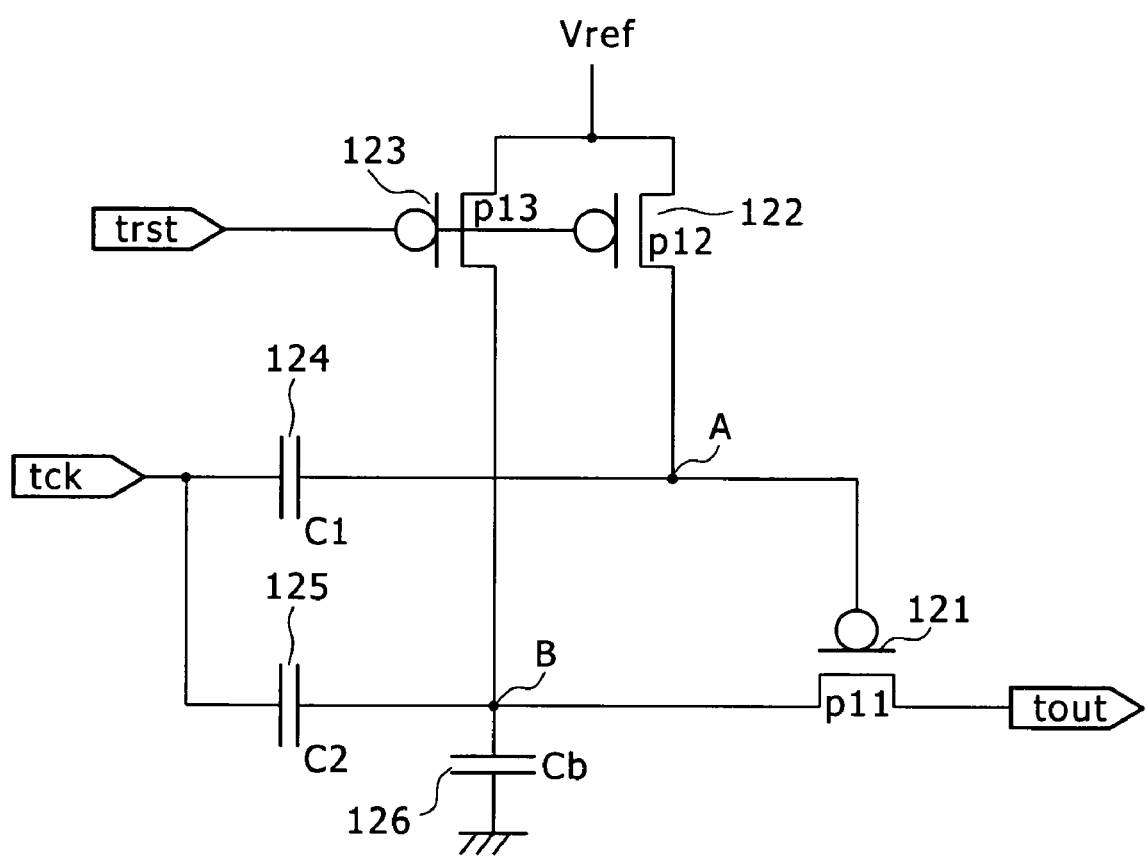
FIG. 7 is a circuit diagram illustrating a configuration example of the DC-DC converter according to the second embodiment.
Figure 8:
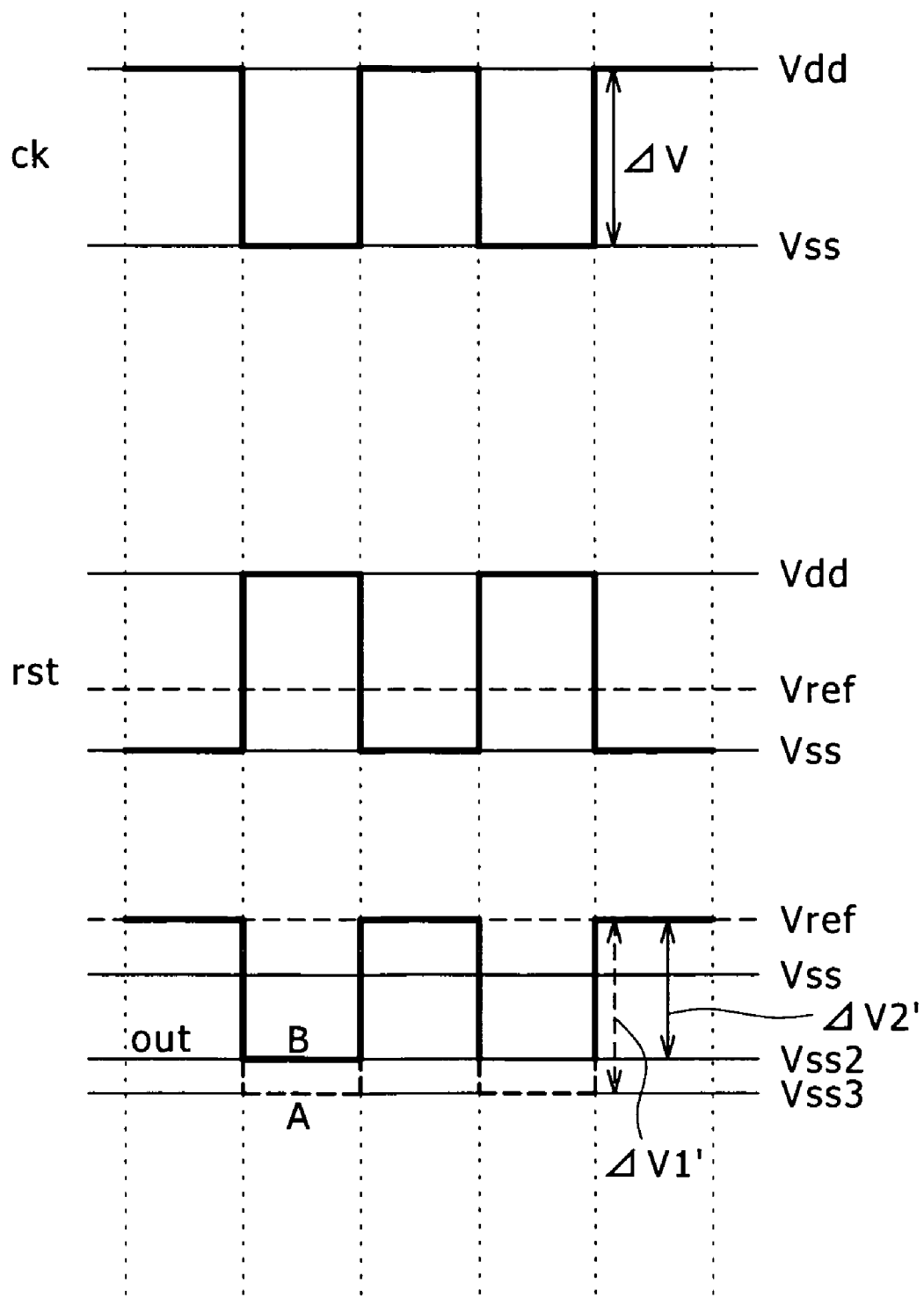
FIG. 8 is a timing diagram of the voltage supply circuit according to the second embodiment.

FIG. 6 is a block diagram illustrating a configuration example of the voltage supply circuit according to a second embodiment of the present invention. FIG. 7 is a circuit diagram illustrating a configuration example of the DC-DC converter according to the second embodiment. FIG. 8 is a timing diagram of the voltage supply circuit according to the second embodiment.

A voltage supply circuit 10A according to the second embodiment differs from the voltage supply circuit 10 according to the first embodiment in that a single clock ck is used rather than two clocks. The same circuit 10A further differs from the circuit 10 in that the level shifter 112 of an adjustment section 11A shifts the amplitude of the clock ck as with that of the reset signal rst to produce a signal having an intermediate amplitude between the supply voltage Vdd and the ground potential GND and supplies the signal to a DC-DC converter 12A. The same circuit 10A still further differs from the circuit 10 in that the DC-DC converter 12A adjusts the clock amplitude so that the signals having different amplitudes are supplied to the first and second nodes A and B.

More specifically, as illustrated in FIG. 7, the capacitors 124 and 125 have their second electrodes connected to a clock input terminal tck. Also, a capacitor Cb is provided between the second node B and the reference potential (e.g., ground potential GND) to serve as a parasitic capacitance (capacitor).

In the DC-DC converter 12A, the potentials of the first and second nodes A and B are initialized by the reset signal rst, as illustrated in FIGS. 7 and 8. Then, the potentials thereof are reduced by the coupling of the input ck using the capacitances C1 and C2 of the capacitors 124 and 125.

At this time, a parasitic capacitance 126 (Cb) is connected to the second node B. Therefore, the coupling gain of the first and second nodes A and B is adjusted. As a result, only the low (Lo) potential of the node B is output.

Letting the parasitic capacitances of the first and second nodes A and B be denoted respectively by Cpa and Cpb, the amplitudes ΔV1' and ΔV2' of the first and second nodes A and B can be determined by Equations (7) and (8) given below.

[Equation 7]

$$\Delta V1' = \Delta V1 \times C1/(C1+Cpa) \quad (7)$$

[Equation 8]

$$\Delta V2' = \Delta V2 \times C2/(C2+Cb+Cpb) \quad (8)$$

where ΔV1=ΔV2.

Hence, the amplitudes of the clocks ck1 and ck2 must be determined in consideration of the relationships expressed by the Equations (1), (7) and (8).

Using the amplitudes ΔV1' and ΔV2' of the first and second nodes A and B, the drive condition of the output transistor 121 can be expressed as follows:

[Equation 9]

$$\Delta V2' - \Delta V1' < Vth(p11) \quad (9)$$

As a result, the relationship expressed by Equation (10) can be obtained as shown below.

[Equation 10]

$$\{C2/(C2+Cb+Cpb)-C1/(C1+Cpa)\}\Delta V2 < -Vth(p11) \quad (10)$$

Hence, it is necessary to determine Cb so that the above condition is satisfied.

The second embodiment provides the same effects as the first embodiment. Further, the voltage supply circuit according to this embodiment can be driven with two pulses (ck, rst) and three power supplies (Vdd, Vss, Vref). Using single-type CMOS transistors (PMOS and NMOS) in panel circuit design ensures reduced manufacturing processes and greater production volume.

Third Embodiment

Figure 9:
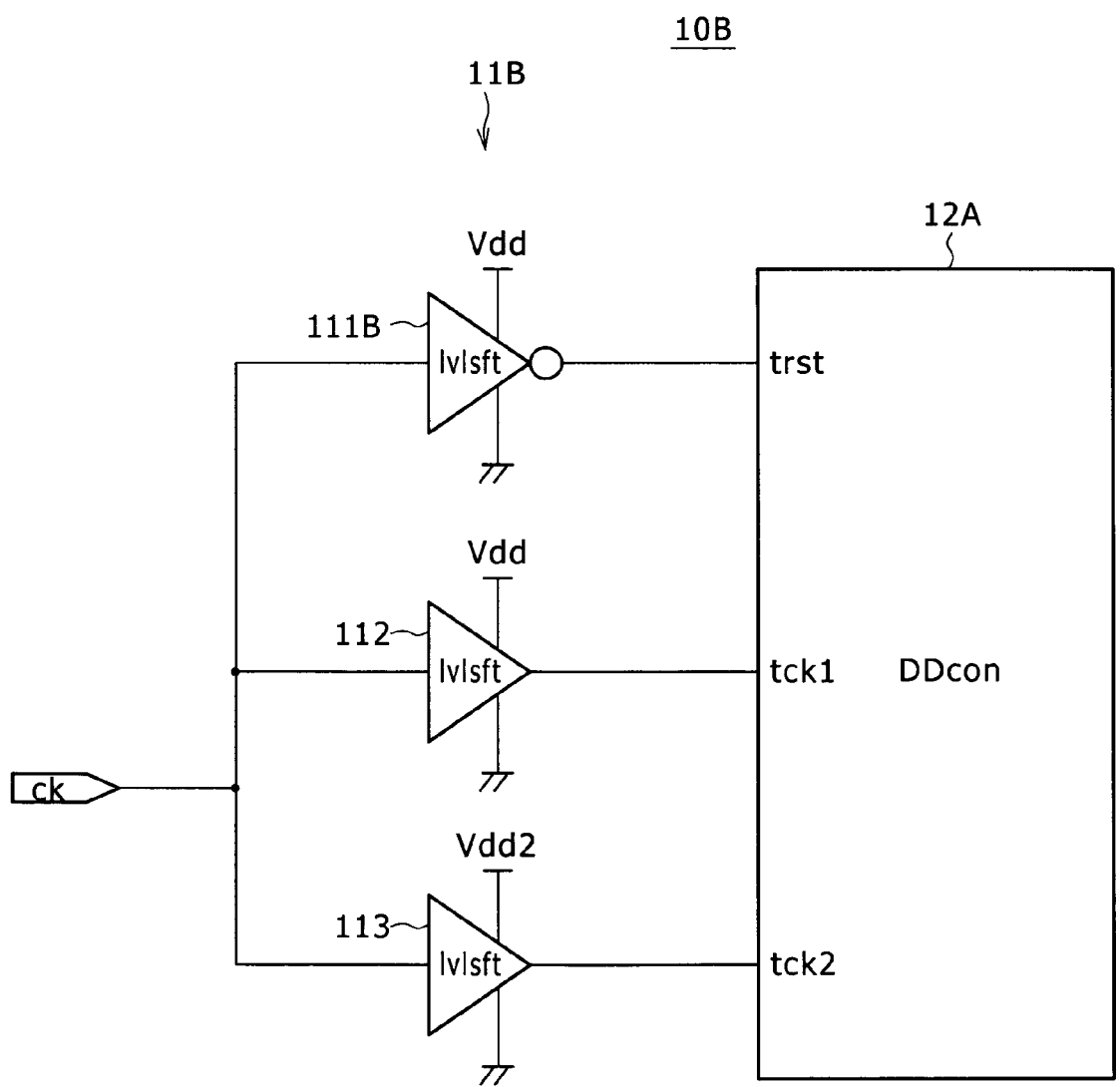
FIG. 9 is a block diagram illustrating a configuration example of the voltage supply circuit according to a third embodiment of the present invention.

FIG. 9 is a block diagram illustrating a configuration example of the voltage supply circuit according to a third embodiment of the present invention.

A voltage supply circuit 10B according to the third embodiment differs from the voltage supply circuit 10 according to the first embodiment in that, because the reset signal rst is reverse in phase to the first and second clocks ck1 and ck2, and because the first and second clocks ck1 and ck2 are in phase with each other, the single clock ck is used to generate the reset signal rst and the first and second clocks ck1 and ck2 following the amplitude shifting.

More specifically, a level shifter 111B for the reset signal rst is a level shifter with the inverting function (inverter). The clock ck is fed to three level shifters 111B, 112 and 113 in parallel.

It should be noted that the inverter 111B can be configured only with transistors of identical polarity, namely, PMOS transistors, as with the DC-DC converter 12.

Figure 10:
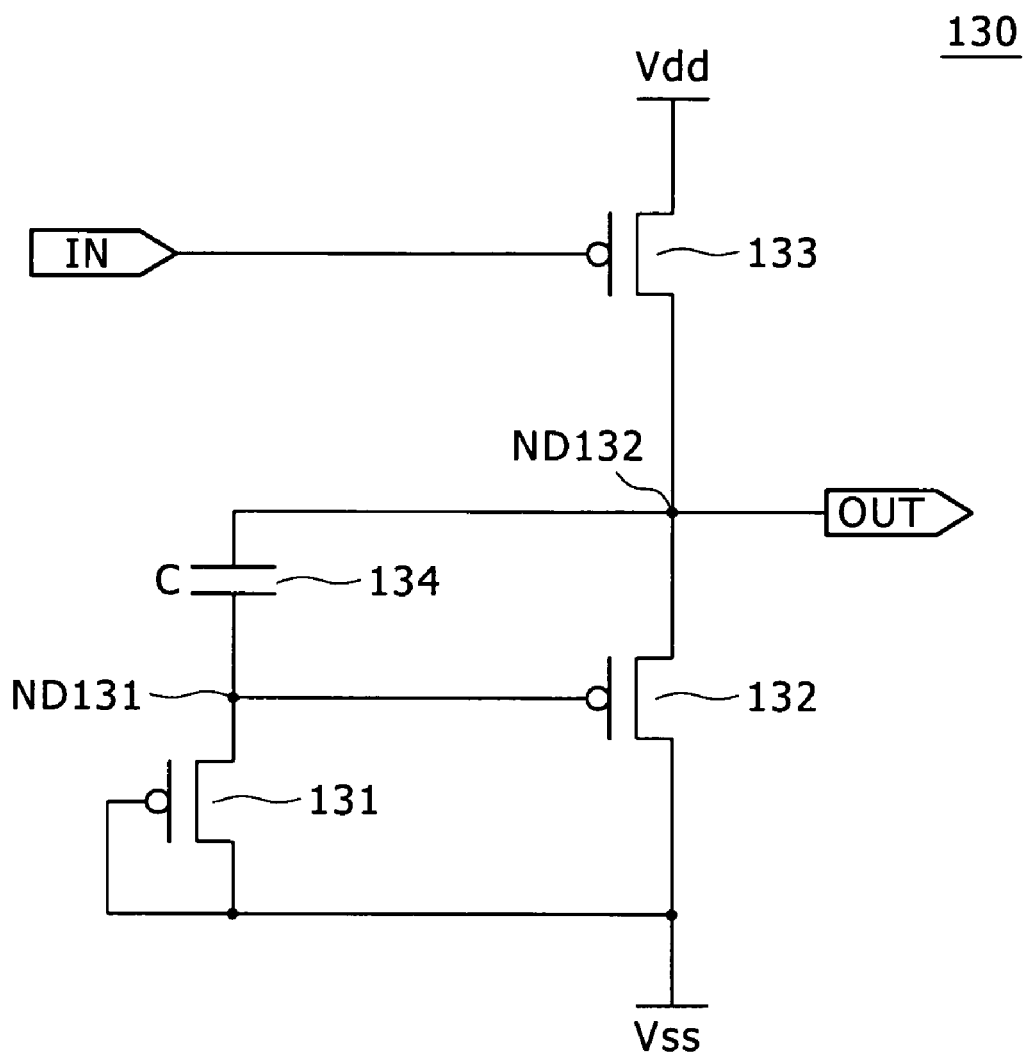
FIG. 10 is a circuit diagram illustrating an example of inverter configured only with transistors of identical polarity, namely, PMOS transistors.

FIG. 10 is a circuit diagram illustrating an example of inverter configured only with transistors of identical polarity, namely, PMOS transistors.

An inverter 130 includes PMOS transistors 131 to 133, a capacitor 134 and nodes ND131 and ND132, as illustrated in FIG. 10.

The transistor 131 has its source connected to the node ND131 and its gate and drain connected to the reference potential Vss. The transistor 132 has its source connected to the node ND132, its drain connected to the reference potential Vss, and its gate connected to the node ND131.

The transistor 133 has its source connected to the supply line of the supply voltage Vdd, its drain connected to the node ND132, and its gate connected to a signal input line IN.

The capacitor 134 has its first electrode connected to the node ND131 and its second electrode connected to the node ND132. The node ND132 is connected to an output OUT.

In the inverter 130 configured as described above, when a low level signal is input, the transistor 133 turns on, raising the potential of the node ND132. This causes the potential of the node ND131 to be raised via the capacitor C134, turning off the transistor 132. As a result, a signal at the Vdd level is output to the output OUT.

When a high level signal is input, the transistor 133 turns off. This causes the potential of the node ND131 to be discharged via the transistor 131, turning on the transistor 132. As a result, a signal at the Vss level is output to the output OUT.

Except for the above, the voltage supply circuit according to this embodiment is configured in the same manner as with that according to the first embodiment.

The third embodiment provides the same effects as the first embodiment.

Fourth Embodiment

Figure 11:
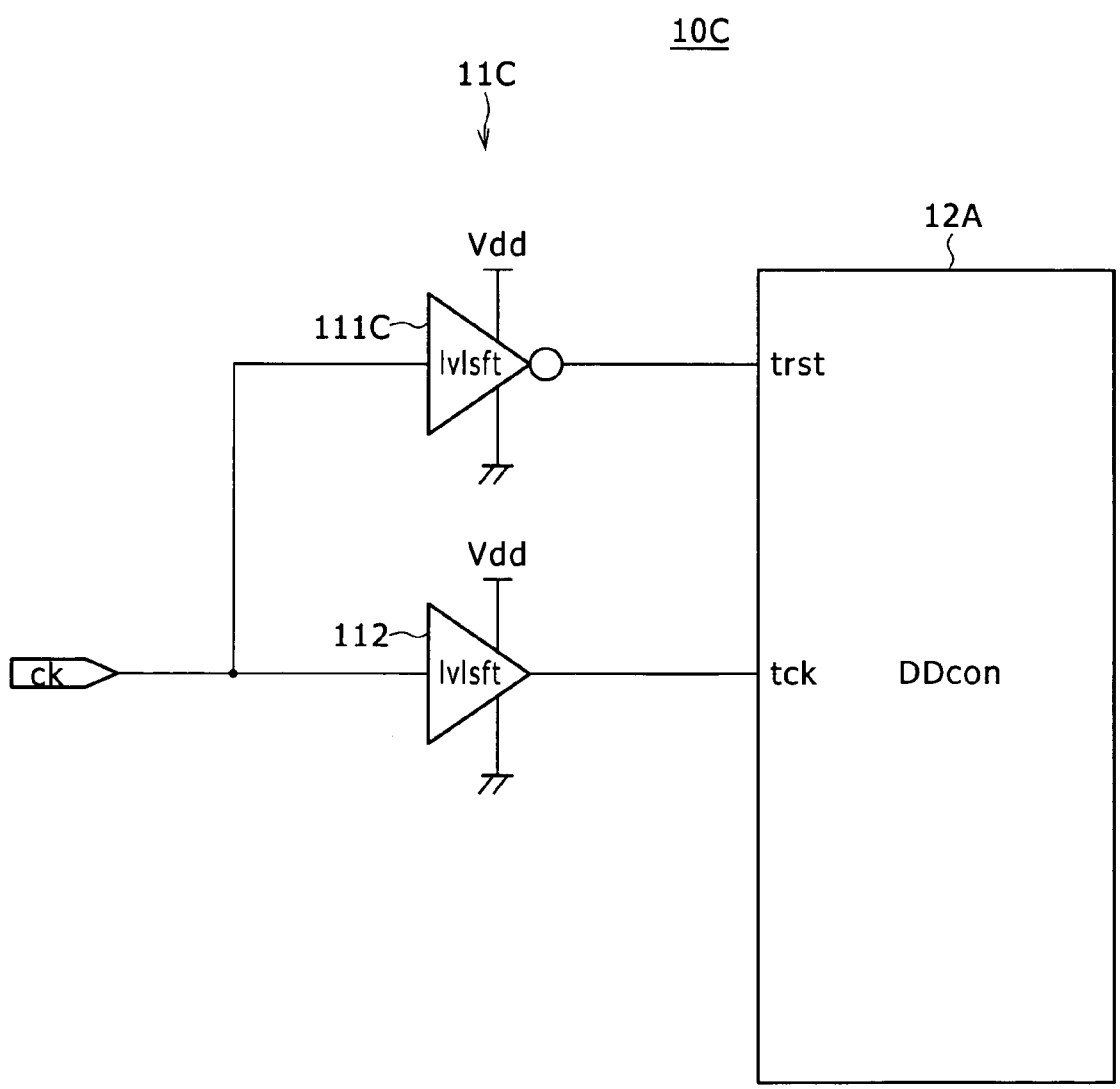
FIG. 11 is a block diagram illustrating a configuration example of the voltage supply circuit according to a fourth embodiment of the present invention.

FIG. 11 is a block diagram illustrating a configuration example of the voltage supply circuit according to a fourth embodiment of the present invention.

A voltage supply circuit 10C according to the fourth embodiment differs from the voltage supply circuit 10A according to the second embodiment in that, because the reset signal rst is reverse in phase to the clock signal ck, the single clock ck is used to generate the reset signal rst following the amplitude shifting.

More specifically, a level shifter 111C for the reset signal rst is a level shifter with the inverting function (inverter). The clock ck is fed to two level shifters 111C and 112 in parallel.

It should be noted that the inverter 111C can be configured only with transistors of identical polarity, namely, PMOS transistors, as with the DC-DC converter 12A as illustrated in FIG. 10.

Except for the above, the voltage supply circuit is configured in the same manner as with that according to the second embodiment.

The fourth embodiment provides the same effects as the second embodiment.

Fifth Embodiment

Figure 12:
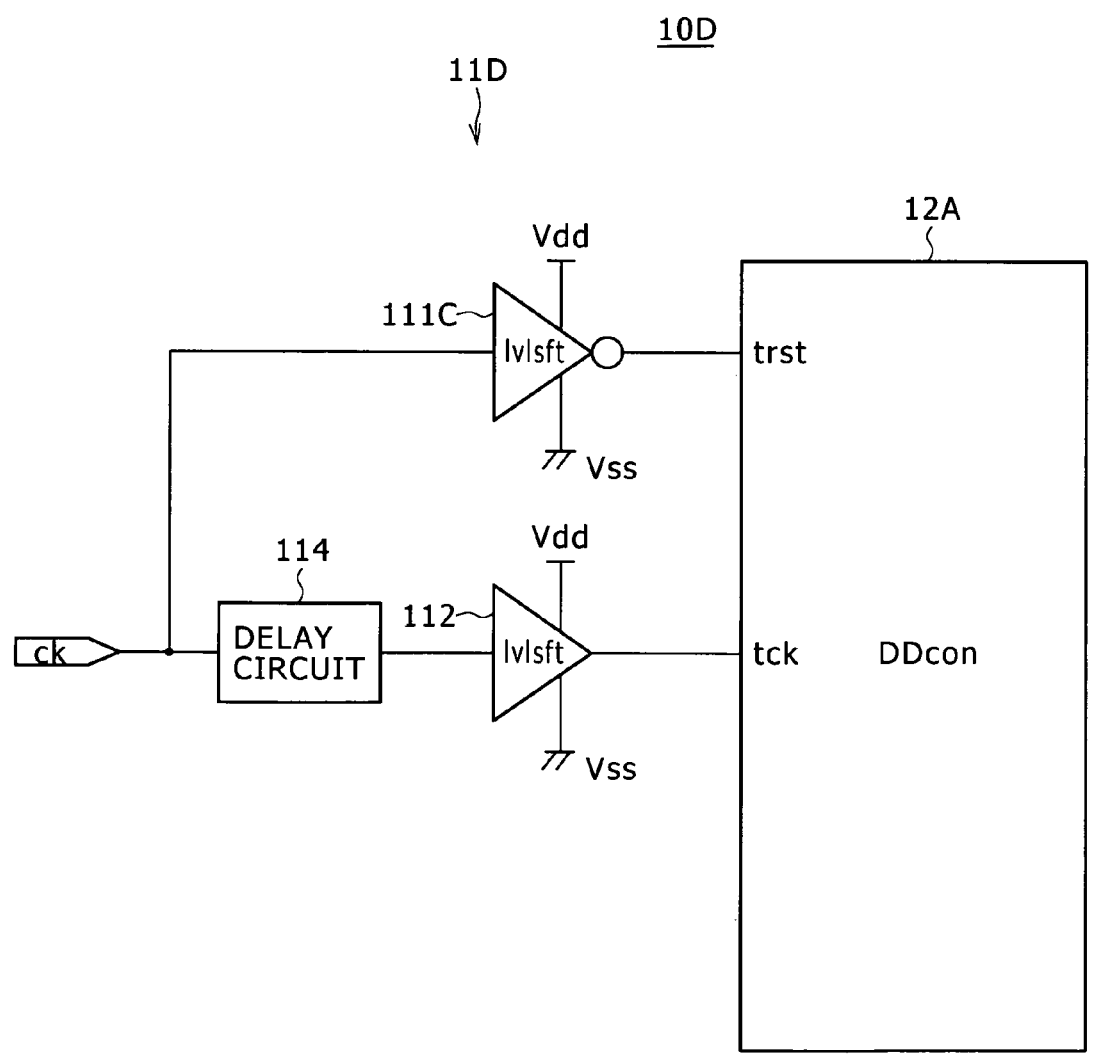
FIG. 12 is a block diagram illustrating a configuration example of the voltage supply circuit according to a fifth embodiment of the present invention.

FIG. 12 is a block diagram illustrating a configuration example of the voltage supply circuit according to a fifth embodiment of the present invention.

A voltage supply circuit 10D according to the fifth embodiment differs from the voltage supply circuit 10C according to the fourth embodiment in that a delay circuit 114 is provided in a stage previous to the level shifter 112 for the clock.

The reason why the delay circuit 114 is provided will be described with reference to FIGS. 13 and 14.

Figure 13:
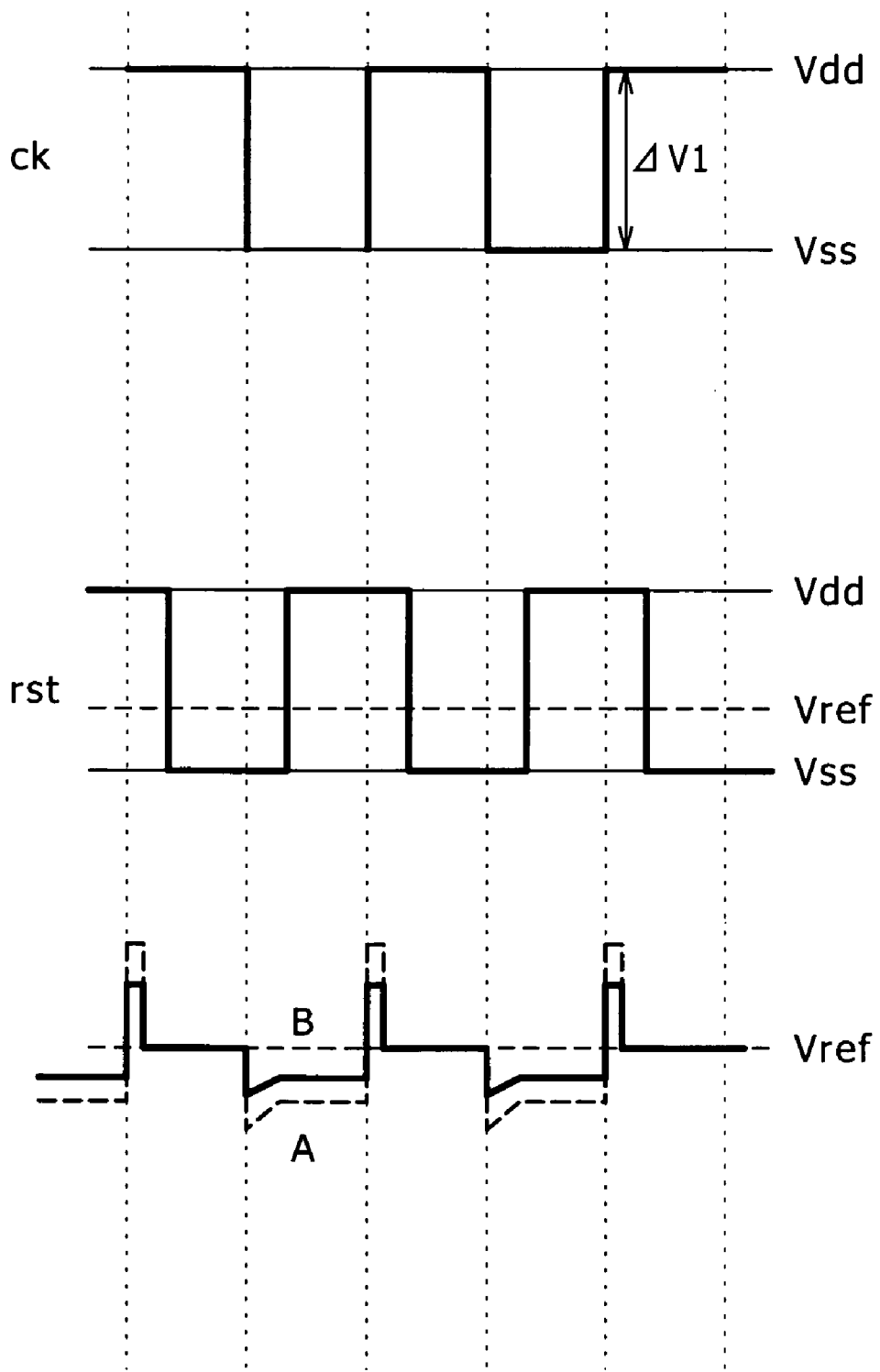
FIG. 13 is a timing diagram illustrating a case where a reset signal rst lags a clock signal ck.

FIG. 13 is a timing diagram illustrating a case where the reset signal rst lags the clock signal ck.

Figure 14:
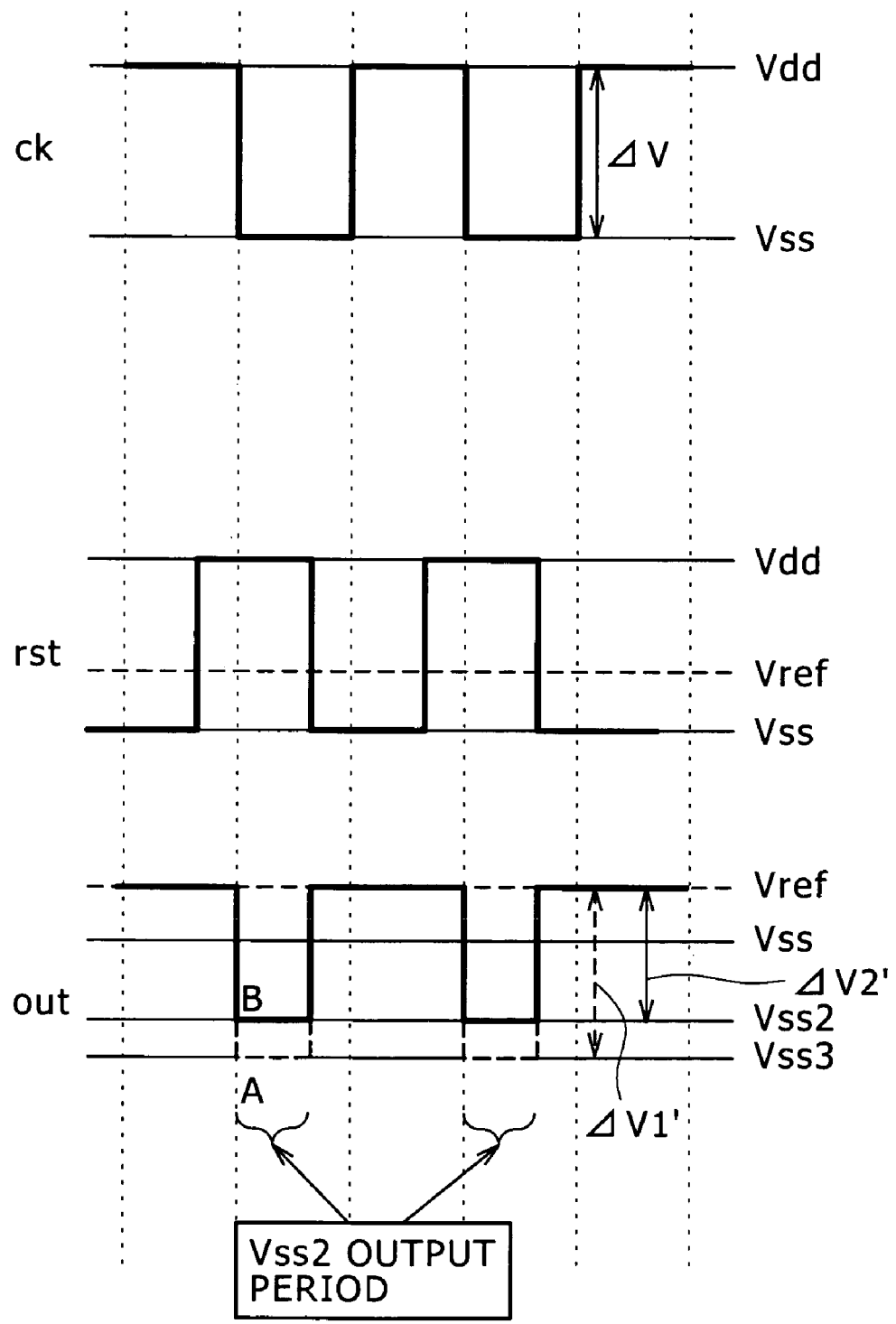
FIG. 14 is a timing diagram illustrating a case where a reset signal rst leads the clock signal ck.

FIG. 14 is a timing diagram illustrating a case where the reset signal rst leads the clock signal ck.

The reset signal rst is reverse in phase to the clock ck. Therefore, the voltage supply circuit 10D according to the fifth embodiment can be configured in the same manner as the voltage supply circuit 10C according to the fourth embodiment.

However, caution must be exercised with the phase relationship.

If the reset signal rst lags the clock signal ck as illustrated in FIG. 13, a sufficient coupling of the clock ck cannot be achieved to reduce the potentials of the first and second nodes A and B because the switching transistors 122 and 123 illustrated in FIG. 7 are both on. This makes it impossible to ensure proper operation.

In contrast, if the reset signal rst leads the clock signal ck, this does not pose any serious problem to the operation. If anything, the Lo period of the first and second nodes A and B (Vss2 output period) is shorter. As a result, the supply capability of the negative supply voltage Vss2 drops. Also, the floating period of the output OUT node (non-supply period of Vss2) is longer.

The Vss2 potential of the output OUT node may change during the non-supply period. Therefore, the non-supply period should be as short as possible.

In FIG. 14, the non-supply period is shorter. Despite the decline in supply capability of the DC-DC converter 12A, sufficient supply of Vss2 can be achieved by controlling the delay of the reset signal rst relative to the clock ck with the delay circuit 114. Therefore, so long as Vss2 is sufficiently supplied, the voltage supply circuit 10D can be used.

Except for the above, the voltage supply circuit according to this embodiment is configured in the same manner as with those according to the second and fourth embodiments.

The fifth embodiment provides the same effects as the second and fourth embodiments.

Sixth Embodiment

Figure 15:
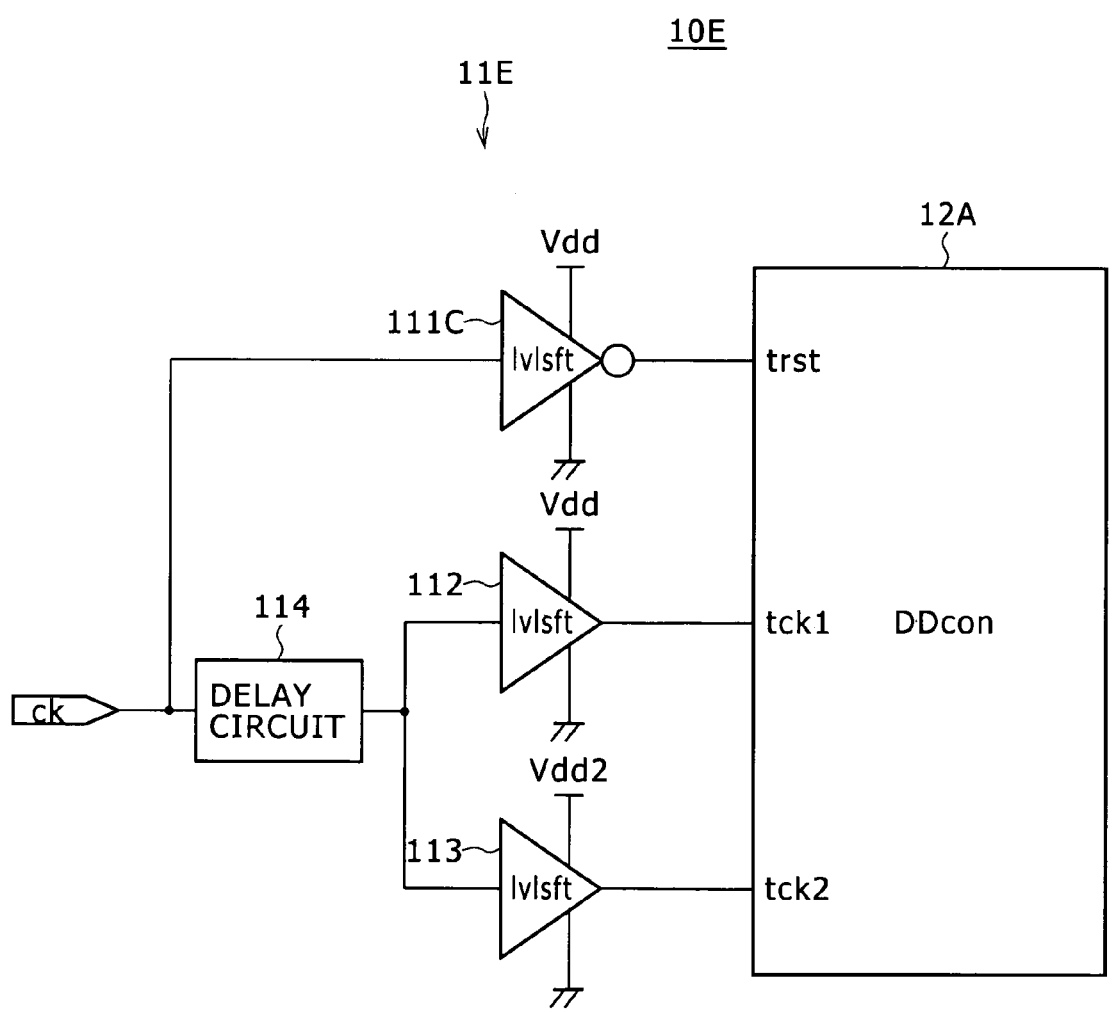
FIG. 15 is a block diagram illustrating a configuration example of the voltage supply circuit according to a sixth embodiment of the present invention.

FIG. 15 is a block diagram illustrating a configuration example of the voltage supply circuit according to a sixth embodiment of the present invention.

A voltage supply circuit 10E according to the sixth embodiment differs from the voltage supply circuit 10B according to the third embodiment in that the delay circuit 114 is provided in a stage previous to the level shifters 112 and 113 for the clocks for the same reason as described in the fifth embodiment.

It should be noted that, in the configuration illustrated in FIG. 15, it is also essential to ensure that the first and second clocks ck1 and ck2 remain in phase with each other.

Except for the above, the voltage supply circuit according to this embodiment is configured in the same manner as with those according to the first and third embodiments.

The sixth embodiment provides the same effects as the first and third embodiments.

Seventh Embodiment

Figure 16:
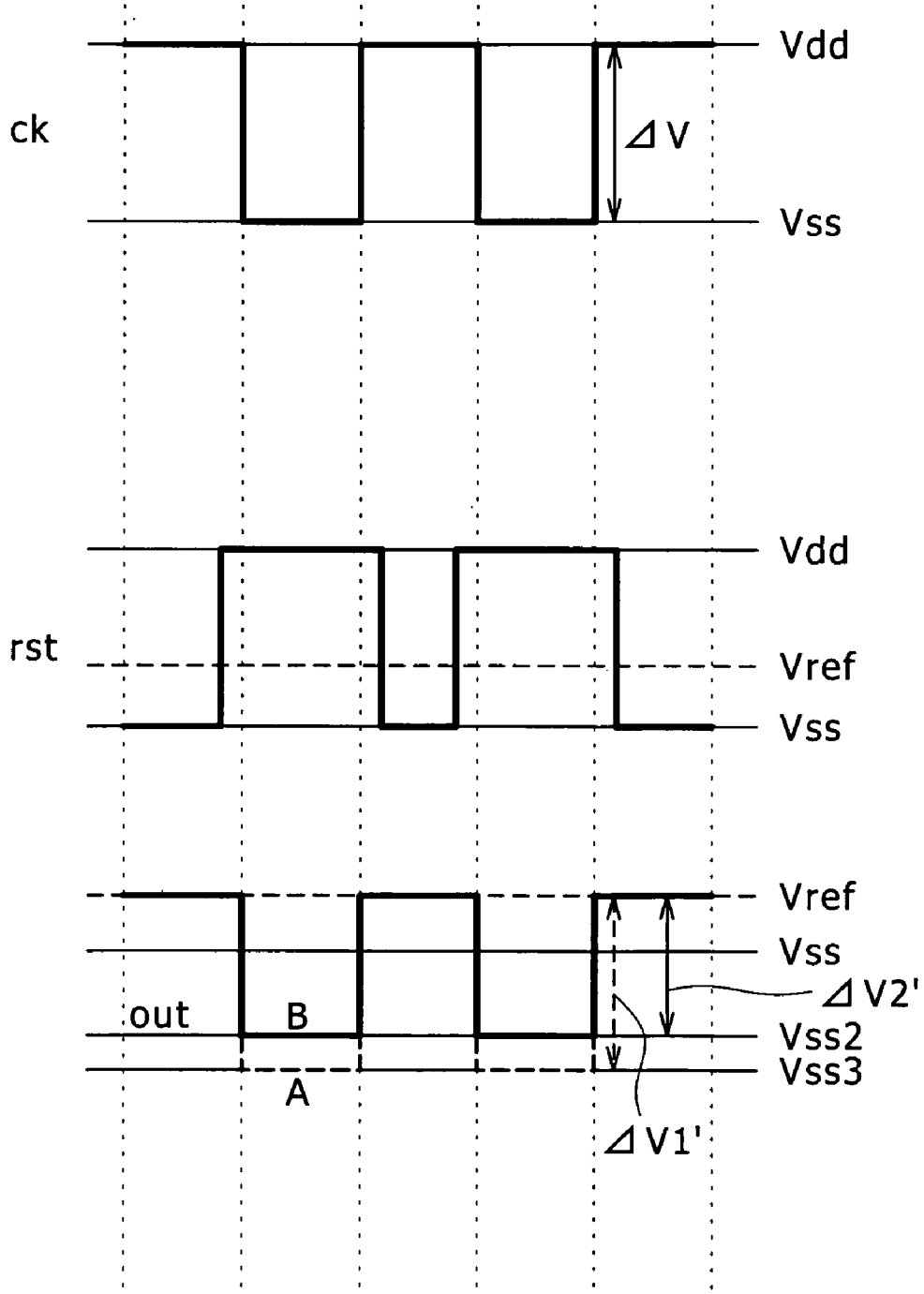
FIG. 16 is a timing diagram for describing the voltage supply circuit according to a seventh embodiment of the present invention.

FIG. 16 is a timing diagram illustrating a configuration example of the voltage supply circuit according to a seventh embodiment of the present invention.

A voltage supply circuit 10F according to the seventh embodiment differs from the voltage supply circuit 10A according to the second embodiment in that the off period (high level period) of the reset signal rst is longer so that the supply period of the negative potential Vss2 is not reduced by the reset signal rst timing.

Except for the above, the voltage supply circuit according to this embodiment is configured in the same manner as with that according to the second embodiment.

The seventh embodiment provides the same effects as the second embodiment.

It should be noted that this configuration is also applicable to the first embodiment.

Eighth Embodiment

Figure 17:
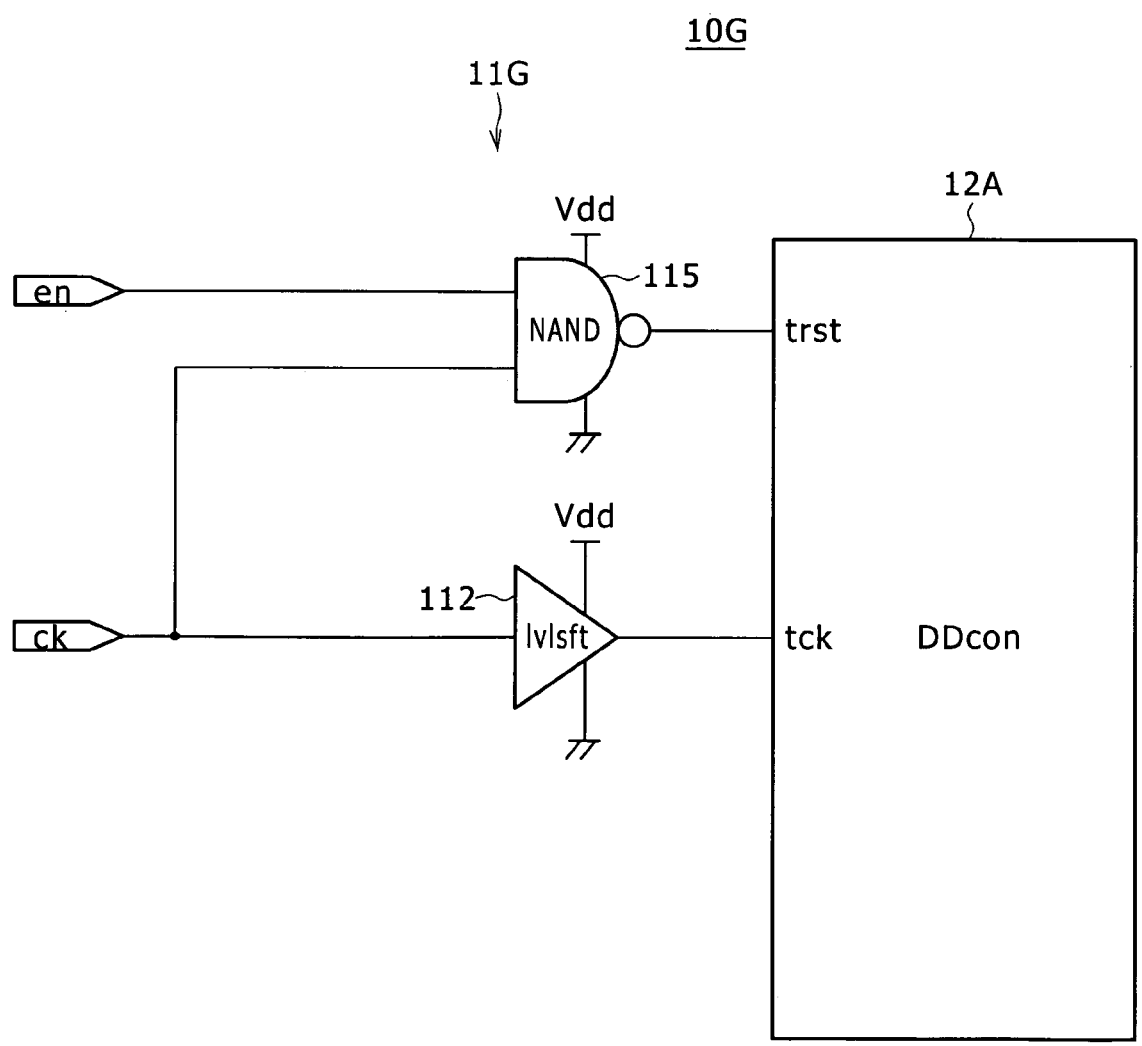
FIG. 17 is a block diagram illustrating a configuration example of the voltage supply circuit according to an eighth embodiment of the present invention.
Figure 18:
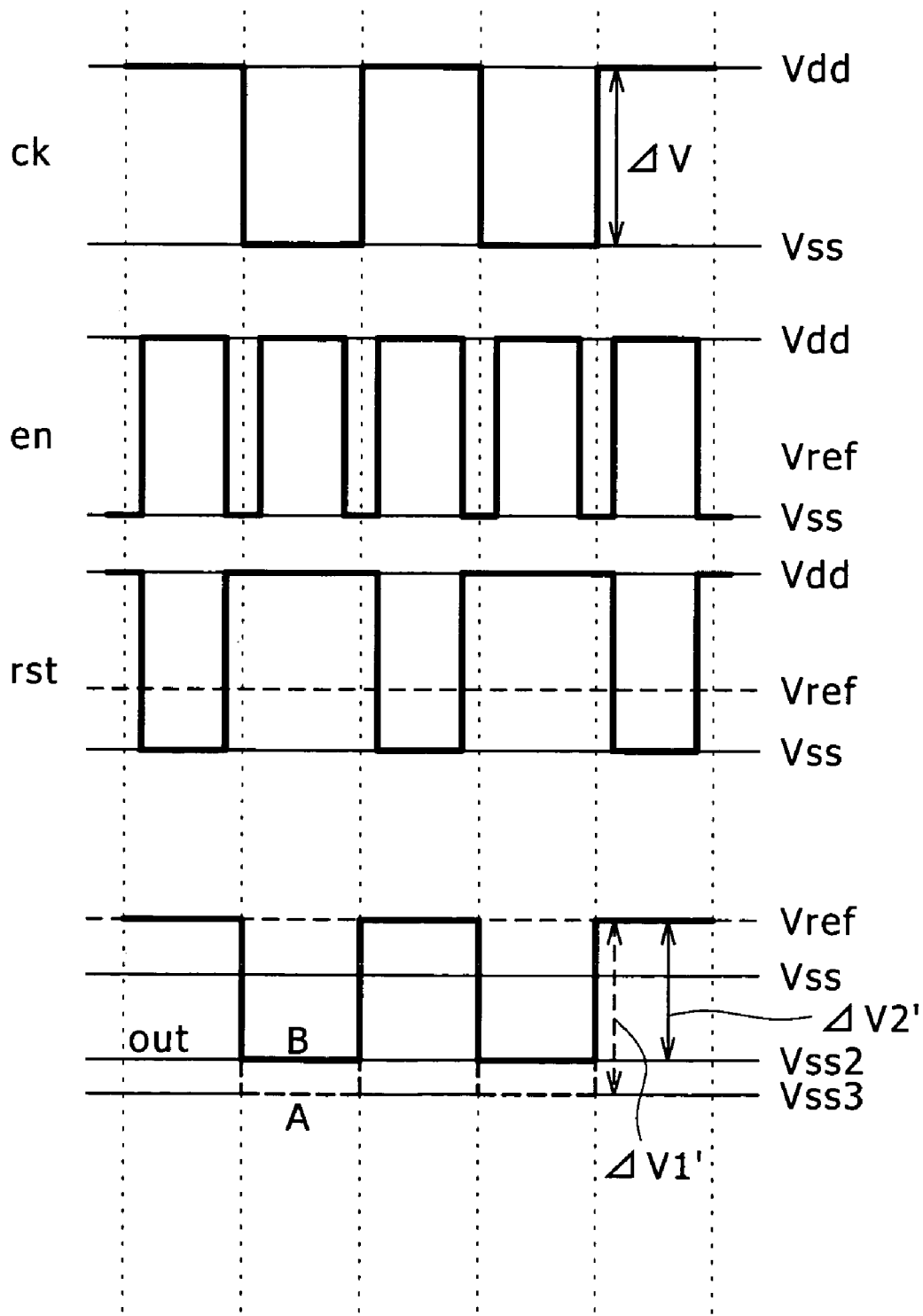
FIG. 18 is a timing diagram of the voltage supply circuit according to the eighth embodiment.

FIG. 17 is a block diagram illustrating a configuration example of the voltage supply circuit according to an eighth embodiment of the present invention. FIG. 18 is a timing diagram of the voltage supply circuit according to the eighth embodiment.

A voltage supply circuit 10G according to the eighth embodiment differs from the voltage supply circuit 10C according to the fourth embodiment in that a NAND circuit function section 115 is provided in place of the inverting function to serve as the level shifter adapted to generate the reset signal rst so that the reset signal rst can be selectively generated from the clock ck and an enable signal en.

In this case, as illustrated in FIG. 18, the off period (high level period) of the reset signal rst is longer as with the seventh embodiment so that the reset signal rst timing can be determined as desired to ensure that the supply period of the negative potential Vss2 is not reduced.

Figure 19:
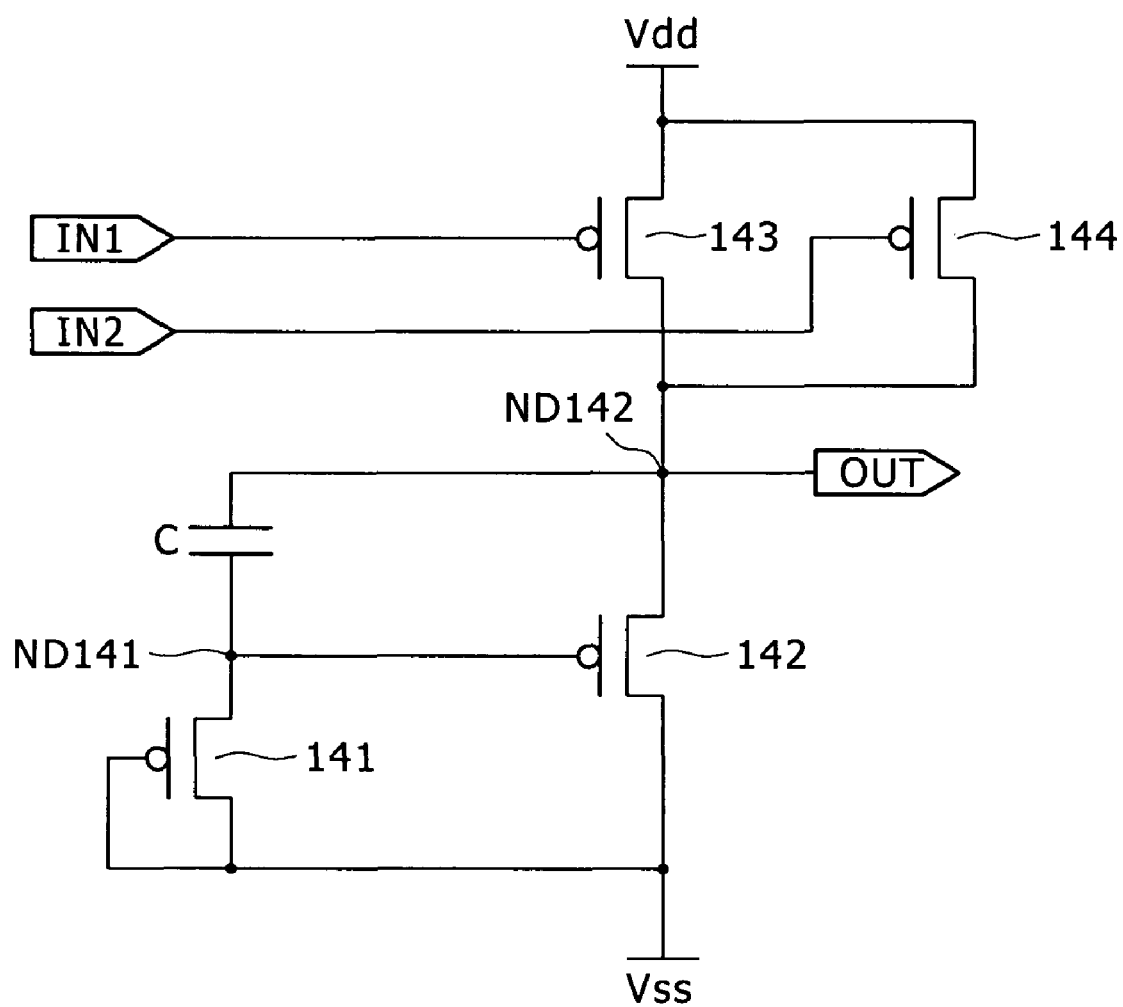
FIG. 19 is a circuit diagram illustrating an example of NAND circuit configured only with transistors of identical polarity, namely, PMOS transistors.

FIG. 19 is a circuit diagram illustrating an example of NAND circuit configured only with transistors of identical polarity, namely, PMOS transistors.

A NAND circuit 140 includes PMOS transistors 141 to 144, a capacitor 145 and nodes ND141 and ND142 as illustrated in FIG. 19.

The transistor 141 has its source connected to the node ND141 and its gate and drain connected to the reference potential Vss. The transistor 142 has its source connected to the node ND142, its drain connected to the reference potential Vss and its gate connected to the node ND141.

The transistor 143 has its source connected to the supply line of the supply voltage Vdd, its drain connected to the node ND142 and its gate connected to a signal input line IN1.

The transistor 144 has its source connected to the supply line of the supply voltage Vdd, its drain connected to the node ND142 and its gate connected to a signal input line IN2.

The capacitor 145 has its first electrode connected to the node ND141 and its second electrode connected to the node ND142. The node ND142 is connected to the output OUT.

In the NAND circuit 140 configured as described above, if the two signals en and ck are both at low level, or if one of the signals is at high level and the other at low level, both or either of the transistors 143 and 144 turns on, raising the potential of the node ND142. This causes the potential of the node ND141 to be raised via the capacitor 145, turning off the transistor 142. As a result, the reset signal rst at the Vdd level is output to the output OUT.

If the NAND circuit 140 receives the two signals en and ck both of which are at high level, both of the transistors 143 and 144 turn off. This causes the potential of the node ND141 to be discharged via the transistor 141, turning on the transistor 142. As a result, the reset signal rst at the Vss level is output to the output OUT.

Except for the above, the voltage supply circuit according to this embodiment is configured in the same manner as with those according to the second and fourth embodiments.

The eighth embodiment provides the same effects as the second and fourth embodiments.

Ninth Embodiment

Figure 20:
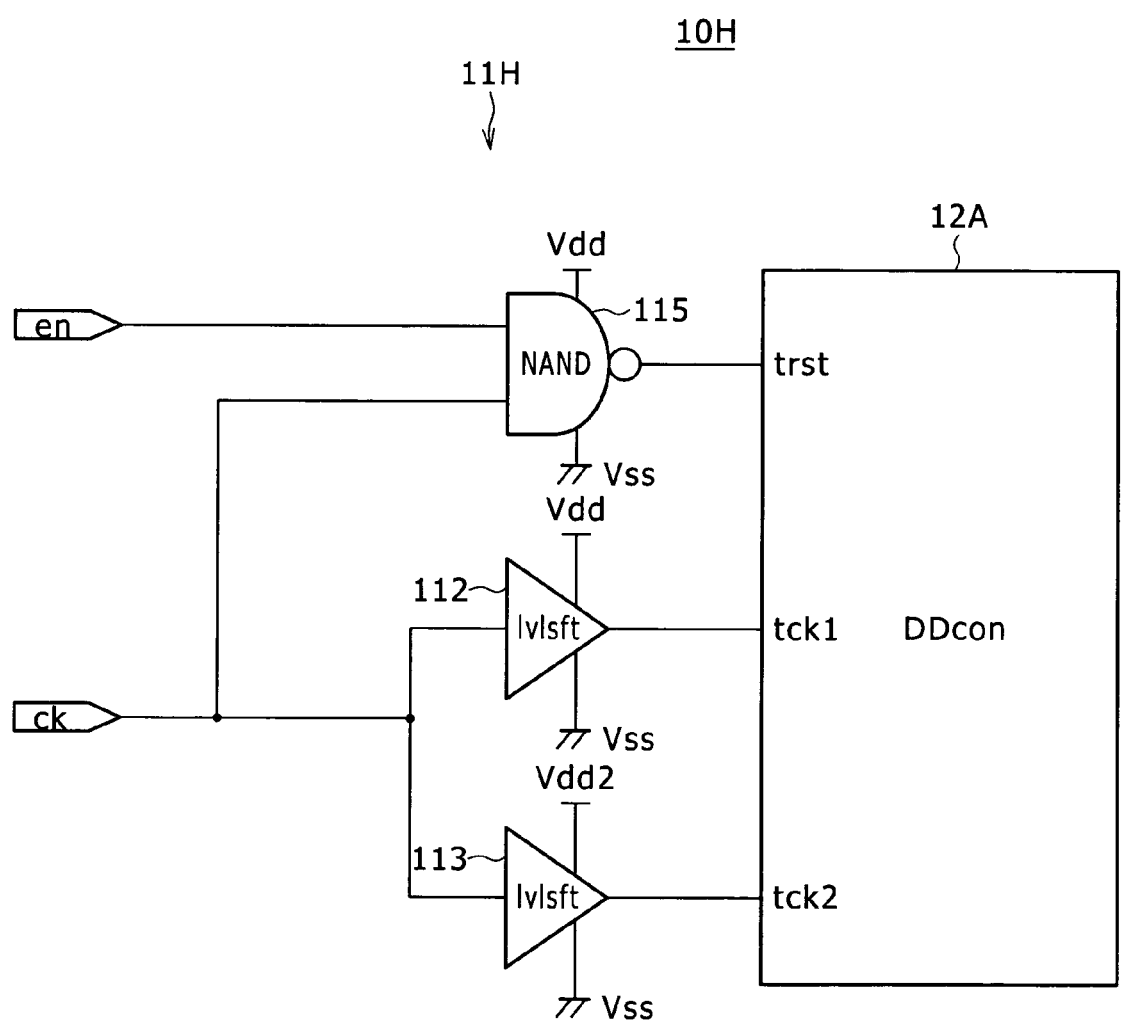
FIG. 20 is a block diagram illustrating a configuration example of the voltage supply circuit according to a ninth embodiment of the present invention.

FIG. 20 is a block diagram illustrating a configuration example of the voltage supply circuit according to a ninth embodiment of the present invention.

A voltage supply circuit 10H according to the ninth embodiment differs from the voltage supply circuit 10B according to the third embodiment in that the NAND circuit function section 115, configured as illustrated in FIG. 19, is provided in place of the inverting function to serve as the level shifter adapted to generate the reset signal rst as in the eighth embodiment so that the reset signal rst can be selectively generated from the clock ck and the enable signal en.

Also in this case, the ninth embodiment offers the same advantage as the seventh embodiment in that the off period (high level period) of the reset signal rst is longer so that the reset signal rst timing can be determined as desired to ensure that the supply period of the negative potential Vss2 is not reduced.

Except for the above, the voltage supply circuit according to this embodiment is configured in the same manner as with those according to the first and third embodiments.

The ninth embodiment provides the same effects as the first and third embodiments.

Tenth Embodiment

Figure 21:
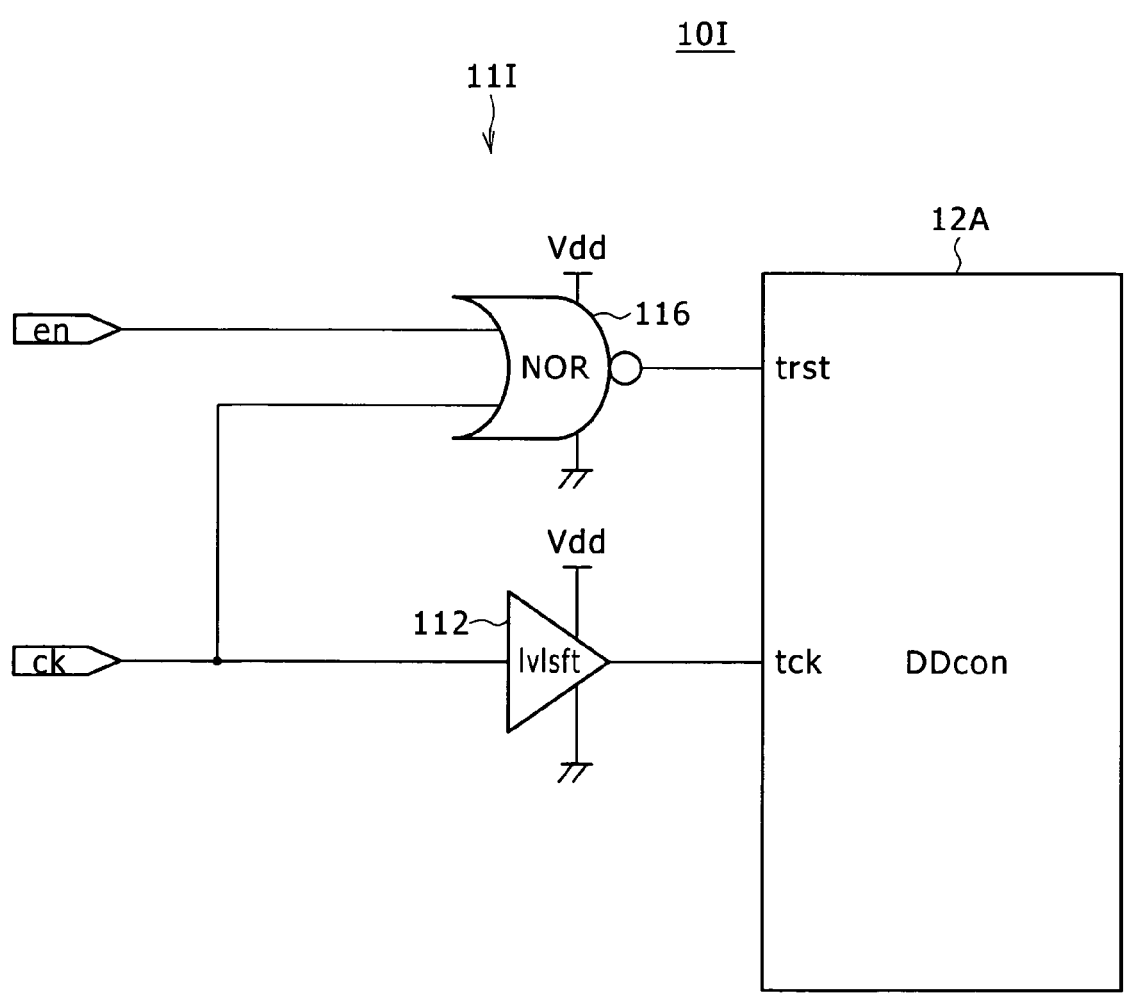
FIG. 21 is a block diagram illustrating a configuration example of the voltage supply circuit according to a tenth embodiment of the present invention.

FIG. 21 is a block diagram illustrating a configuration example of the voltage supply circuit according to a tenth embodiment of the present invention.

A voltage supply circuit 10I according to the tenth embodiment differs from the voltage supply circuit 10G according to the eighth embodiment in that a NOR circuit function section 116 is provided in place of the NAND circuit function section 115 to serve as the level shifter adapted to generate the reset signal rst so that the reset signal rst can be selectively generated from the clock ck and the enable signal en.

Figure 22:
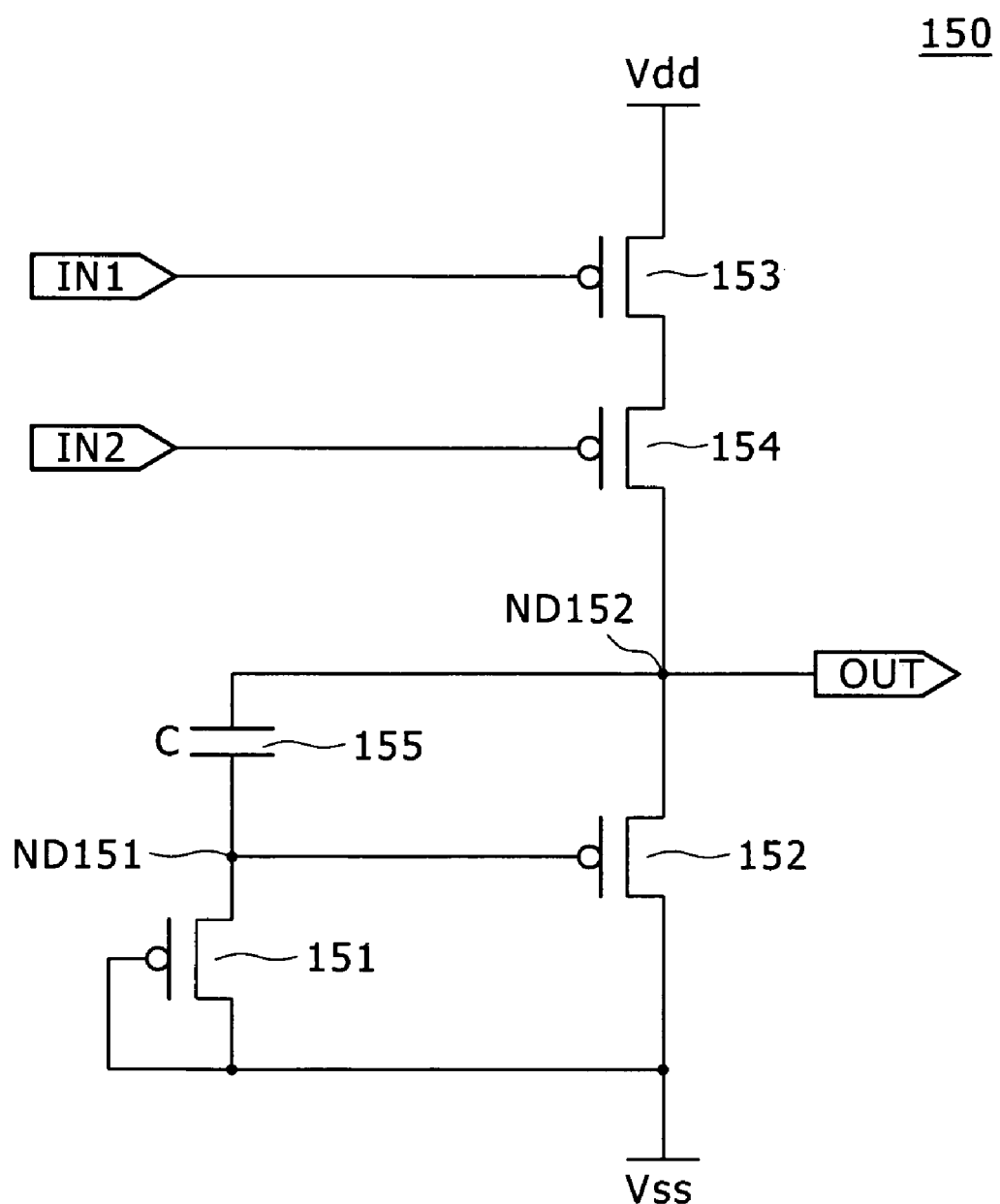
FIG. 22 is a circuit diagram illustrating an example of NOR circuit configured only with transistors of identical polarity, namely, PMOS transistors.

FIG. 22 is a circuit diagram illustrating an example of NOR circuit configured only with transistors of identical polarity, namely, PMOS transistors.

A NOR circuit 150 includes PMOS transistors 151 to 154, a capacitor 155 and nodes ND151 and ND152, as illustrated in FIG. 22.

The transistor 151 has its source connected to the node ND151 and its gate and drain connected to the reference potential Vss. The transistor 152 has its source connected to the node ND152, its drain connected to the reference potential Vss and its gate connected to the node ND151.

The transistor 153 has its source connected to the supply line of the supply voltage Vdd, its drain connected to the source of the transistor 154 and its gate connected to the signal input line IN1.

The transistor 154 has its drain connected to the node ND152 and its gate connected to the signal input line IN2.

The capacitor 155 has its first electrode connected to the node ND151 and its second electrode connected to the node ND152. The node ND152 is connected to the output OUT.

In the NOR circuit 150 configured as described above, if both of the two signals en and ck are at low level, both of the transistors 153 and 154 turn on, raising the potential of the node ND152. This causes the potential of the node ND151 to be raised via the capacitor 155, turning off the transistor 152. As a result, the reset signal rst at the Vdd level is output to the output OUT.

If the NOR circuit 150 receives the two signals en and ck both or either of which is at high level, both or either of the transistors 153 and 154 turns off. This causes the potential of the node ND151 to be discharged via the transistor 151, turning on the transistor 152. As a result, the reset signal rst at the Vss level is output to the output OUT.

Except for the above, the voltage supply circuit according to this embodiment is configured in the same manner as with those according to the second, fourth and eighth embodiments.

The tenth embodiment provides the same effects as the second, fourth and eighth embodiments.

Although not illustrated, a NOR circuit is applicable to the ninth embodiment in place of the NAND circuit.

Although, in the above embodiments, the cases have been described where PMOS transistors are used as transistors of identical polarity, these embodiments can be configured in the same manner with NMOS transistors. When NMOS transistors are used, a positive potential is output rather than a negative potential. Except for this, the aforementioned voltage supply circuits can be basically configured in the same manner with NMOS transistors.

Using NMOS transistors to configure a voltage supply circuit facilitates, for example, the formation of TFTs using amorphous silicon. As a result, the voltage supply circuit can be readily incorporated in a panel of an organic EL display device using the pixel circuit which will be described later.

A description will be made below about the preferred embodiments of the voltage supply circuit formed by NMOS transistors.

It should be noted that the circuit functions are basically the same. Therefore, the description will be given with emphasis on the differences from the circuits using PMOS transistors.

Eleventh Embodiment

Figure 23:
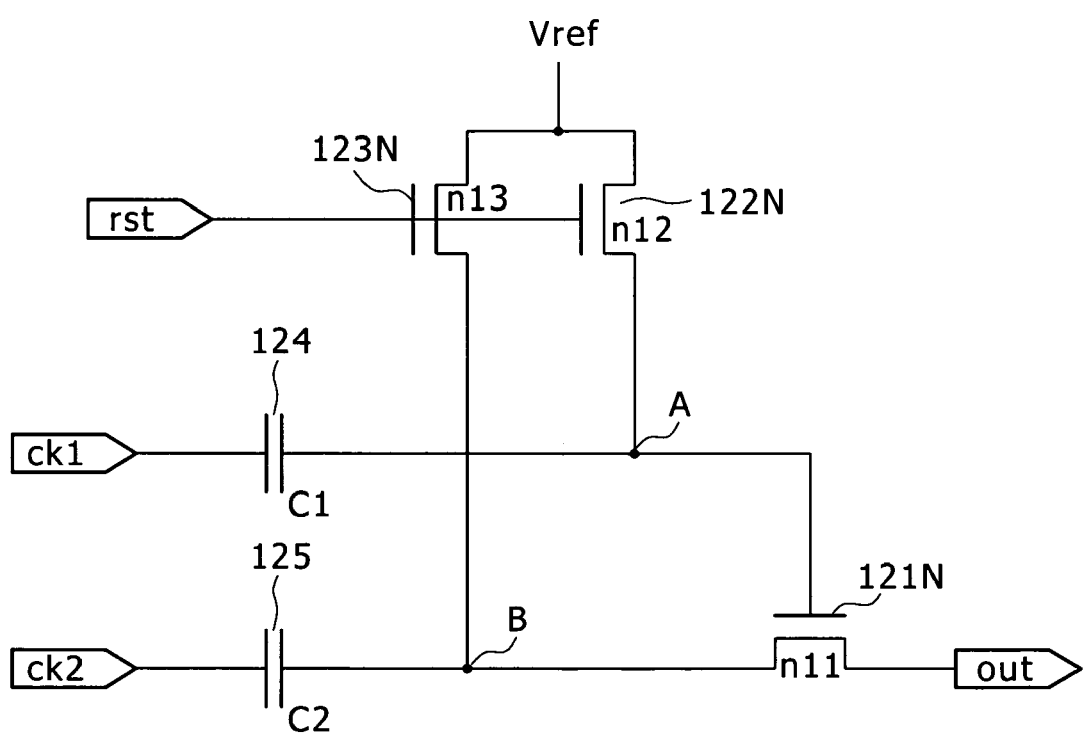
FIG. 23 is a circuit diagram illustrating a configuration example of the DC-DC converter according to an eleventh embodiment.
Figure 24:
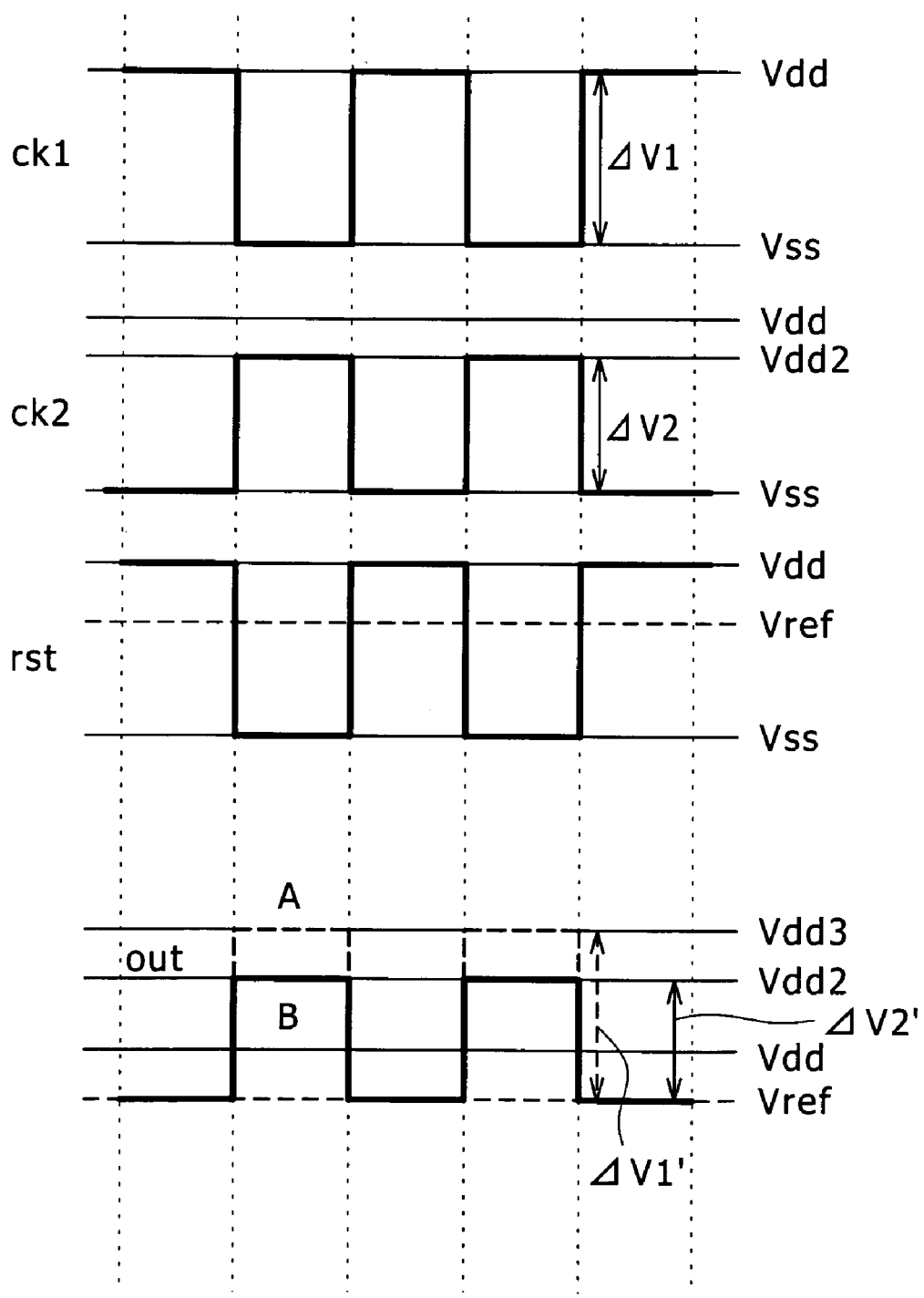
FIG. 24 is a timing diagram of the voltage supply circuit according to the eleventh embodiment.

FIG. 23 is a circuit diagram illustrating a configuration example of the DC-DC converter according to an eleventh embodiment. FIG. 24 is a timing diagram of the voltage supply circuit according to the eleventh embodiment.

A voltage supply circuit 10J according to the eleventh embodiment differs from the voltage supply circuit 10 according to the first embodiment in that the PMOS transistors 121, 122 and 123 have been replaced with NMOS transistors 121N, 122N and 123N (n11 to n13).

In this case, the negative potential Vss2 is replaced with the positive potential Vdd2. The negative potential Vss3 is replaced with a positive potential Vdd3 (Vdd3>Vdd2>Vdd>Vref).

In a DC-DC converter 12J configured as described above, the adjustment section 11 adjusts the clock amplitude so that the potential ΔV1 of the first node A is larger than the potential ΔV2 of the second node B.

More specifically, as described above, when the first and second clocks ck1 and ck2 supplied to the DC-DC converter 12J are compared, the amplitude ΔV1 of the first clock ck1 is larger than the amplitude ΔV2 of the second clock ck2 (ΔV1>ΔV2).

The first and second clocks ck1 and ck2 cause the potentials of the first and second nodes A and B to change via the first and second capacitors 124 and 125.

As illustrated in FIG. 24, the switching transistors 122N and 123N are on while the reset pulse signal rst is at low level.

This causes the first and second nodes A and B to be initialized to the predetermined potential Vref.

The first and second nodes A and B vary in potential relative to the predetermined potential Vref respectively at the amplitudes of the clocks ck1 and ck2.

The positive potential Vdd2 is output from the output transistor 121N as a result of variations in potential of the first and second nodes A and B.

The positive potential Vdd2 is the high (Hi) potential of the second node B. The positive potential Vdd3 is the high (Hi) potential of the first node A.

Here, letting the threshold voltage Vth of the output transistor 121N be denoted by Vth(n11), the output condition of the negative potential Vss2 can be expressed as follows:

[Equation 11]

$$Vdd3-Vdd2>Vth(n11) \tag{11}$$

Letting the parasitic capacitance of the first node A and that of the second node B be denoted respectively by Cpa and Cpb, the amplitudes $\Delta V1'$ and $\Delta V2'$ of the first and second nodes A and B can be determined by equations (12) and (13) given below.

[Equation 12]

$$\Delta V1'=\Delta V1\times C1/(C1+Cpa) \tag{12}$$

[Equation 13]

$$\Delta V2'=\Delta V2\times C2/(C2+Cpb) \tag{13}$$

Hence, the amplitudes of the clocks ck1 and ck2 must be determined in consideration of the relationship between the aforementioned Equations (11), (12) and (13).

Using the amplitudes $\Delta V1'$ and $\Delta V2'$ of the first and second nodes A and B, the drive condition of the output transistor 121N can be expressed as follows:

[Equation 14]

$$\Delta V1'-\Delta V2'>Vth(n11) \tag{14}$$

Here, if $\Delta V1$ and $\Delta V2$ are correlated with each other by using the factor k as shown below in Equation (15), the relationship as shown in Equation (16) can be obtained.

[Equation 15]

$$k\Delta V2=\Delta V1 \tag{15}$$

[Equation 16]

$$\{kC1/(C1+Cpa)-C2/(C2+Cpb)\}\Delta V2>Vth(n11) \tag{16}$$

The eleventh embodiment provides the same effects as the first embodiment. Further, the present embodiment is readily applicable to panels made of amorphous silicon, thus allowing to implement a voltage supply circuit tailored to practical use.

Twelfth Embodiment

Figure 25:
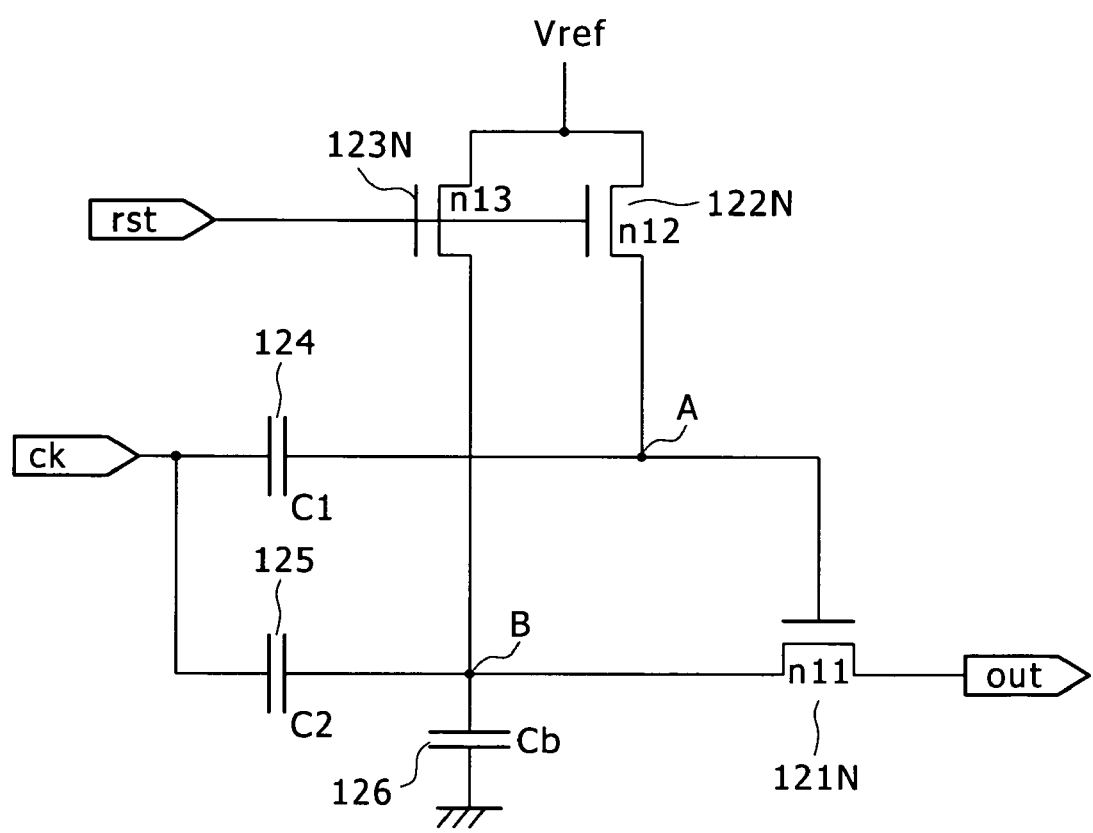
FIG. 25 is a circuit diagram illustrating a configuration example of the DC-DC converter according to a twelfth embodiment.
Figure 26:
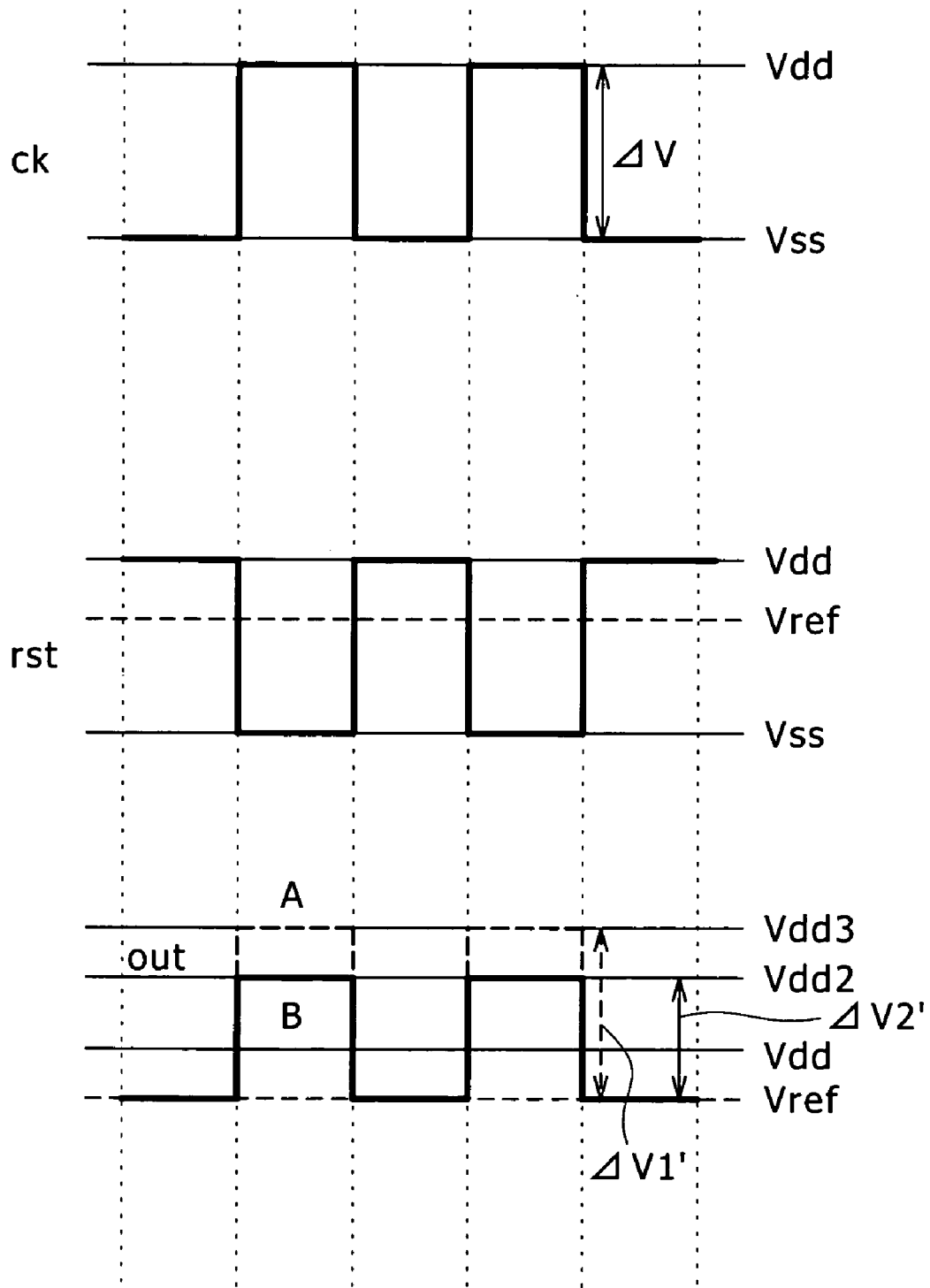
FIG. 26 is a timing diagram of the voltage supply circuit according to the twelfth embodiment.

FIG. 25 is a circuit diagram illustrating a configuration example of the DC-DC converter according to a twelfth embodiment. FIG. 26 is a timing diagram of the voltage supply circuit according to the twelfth embodiment.

A voltage supply circuit 10K according to the twelfth embodiment differs from the voltage supply circuit 10A according to the second embodiment in that the PMOS transistors 121, 122 and 123 have been replaced with the NMOS transistors 121N, 122N and 123N.

In a DC-DC converter 12K configured as described above, the potentials of the first and second nodes A and B are initialized by the reset signal rst, as illustrated in FIGS. 25 and 26. Then, the potentials thereof are raised by the coupling of the input ck using the capacitances C1 and C2 of the capacitors 124 and 125.

At this time, the parasitic capacitance 126 (Cb) is connected to the second node B. Therefore, the coupling gain of the first and second nodes A and B is adjusted. As a result, only the high (Hi) potential of the node B is output.

Letting the parasitic capacitances of the first and second nodes A and B be denoted respectively by Cpa and Cpb, the amplitudes $\Delta V1'$ and $\Delta V2'$ of the first and second nodes A and B can be determined by Equations (17) and (18) given below.

[Equation 17]

$$\Delta V1'=\Delta V1\times C1/(C1+Cpa) \tag{17}$$

[Equation 18]

$$\Delta V2'=\Delta V2\times C2/(C2+Cb+Cpb) \tag{18}$$

Hence, the amplitudes of the clocks ck1 and ck2 must be determined in consideration of the relationship between the aforementioned Equations (11), (17) and (18).

Using the amplitudes $\Delta V1'$ and $\Delta V2'$ of the first and second nodes A and B, the drive condition of the output transistor 121N can be expressed as follows:

[Equation 19]

$$\Delta V1'-\Delta V2'>Vth(n11) \tag{19}$$

where $\Delta V1=\Delta V2$.

As a result, the relationship as given below by Equation (20) can be obtained.

[Equation 20]

$$\{C1/(C1+Cpa)-C2/(C2+Cb+Cpb)\}\Delta V2>Vth(n11) \tag{20}$$

Hence, it is necessary to determine Cb so that the above condition is satisfied.

The twelfth embodiment provides the same effects as the first embodiment. Further, the voltage supply circuit according to this embodiment can be driven with two pulses (ck, rst) and three power supplies (Vdd, Vss, Vref). Using single-type CMOS transistors (PMOS and NMOS) in panel circuit design ensures reduced manufacturing processes and greater production volume.

Thirteenth Embodiment

Figure 27:
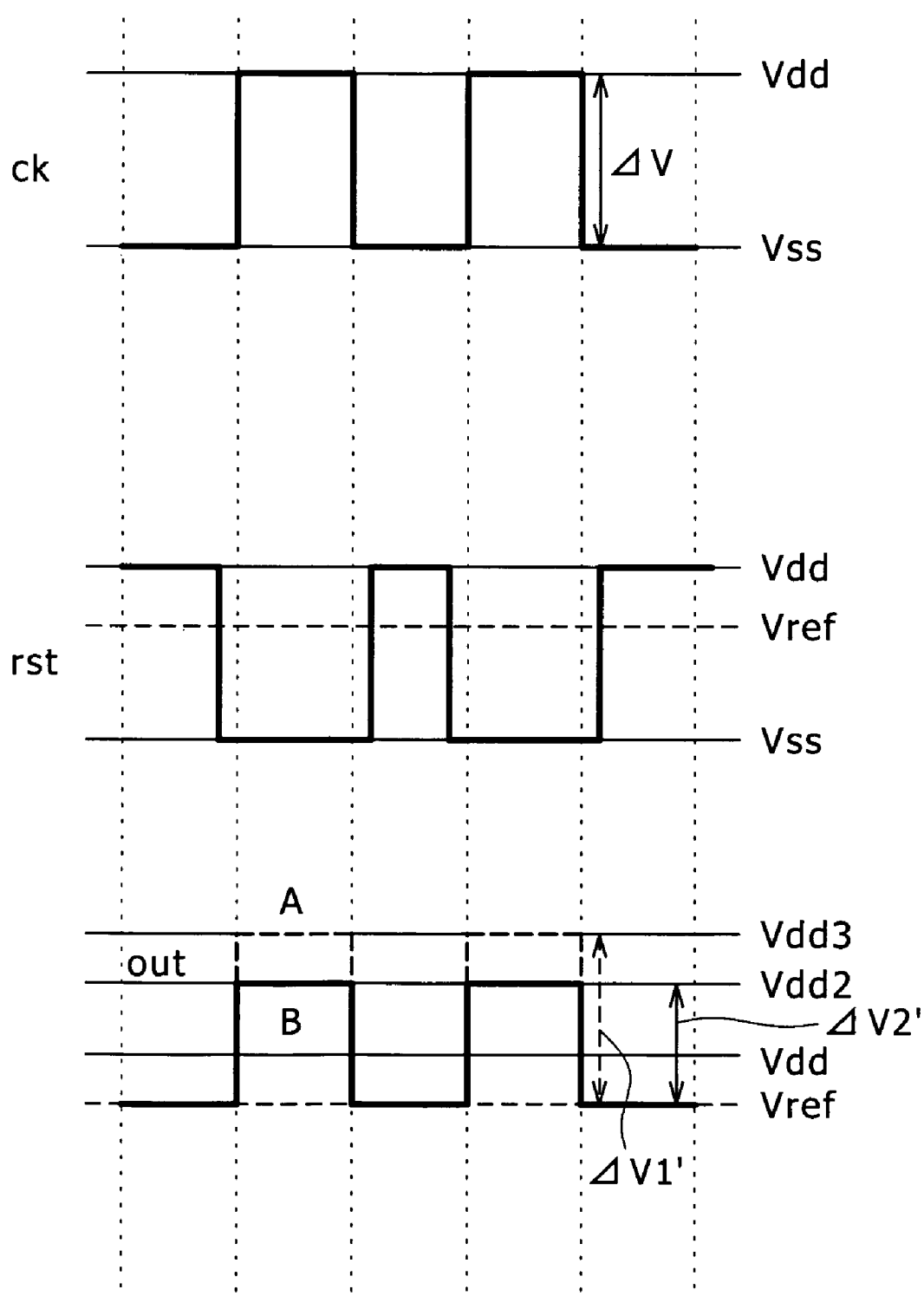
FIG. 27 is a timing diagram for describing the voltage supply circuit according to a thirteenth embodiment of the present invention.

FIG. 27 is a timing diagram for describing the voltage supply circuit according to a thirteenth embodiment of the present invention.

A voltage supply circuit 10L according to the thirteenth embodiment differs from the voltage supply circuit 10K according to the twelfth embodiment in that the off period (high level period) of the reset signal rst is longer so that the supply period of the negative potential Vss2 is not reduced by the reset signal rst timing.

Except for the above, the voltage supply circuit according to this embodiment is configured in the same manner as with that according to the twelfth embodiment.

The thirteenth embodiment provides the same effects as the twelfth embodiment.

Although not illustrated, this configuration is applicable to the eleventh embodiment.

Fourteenth Embodiment

Figure 28:
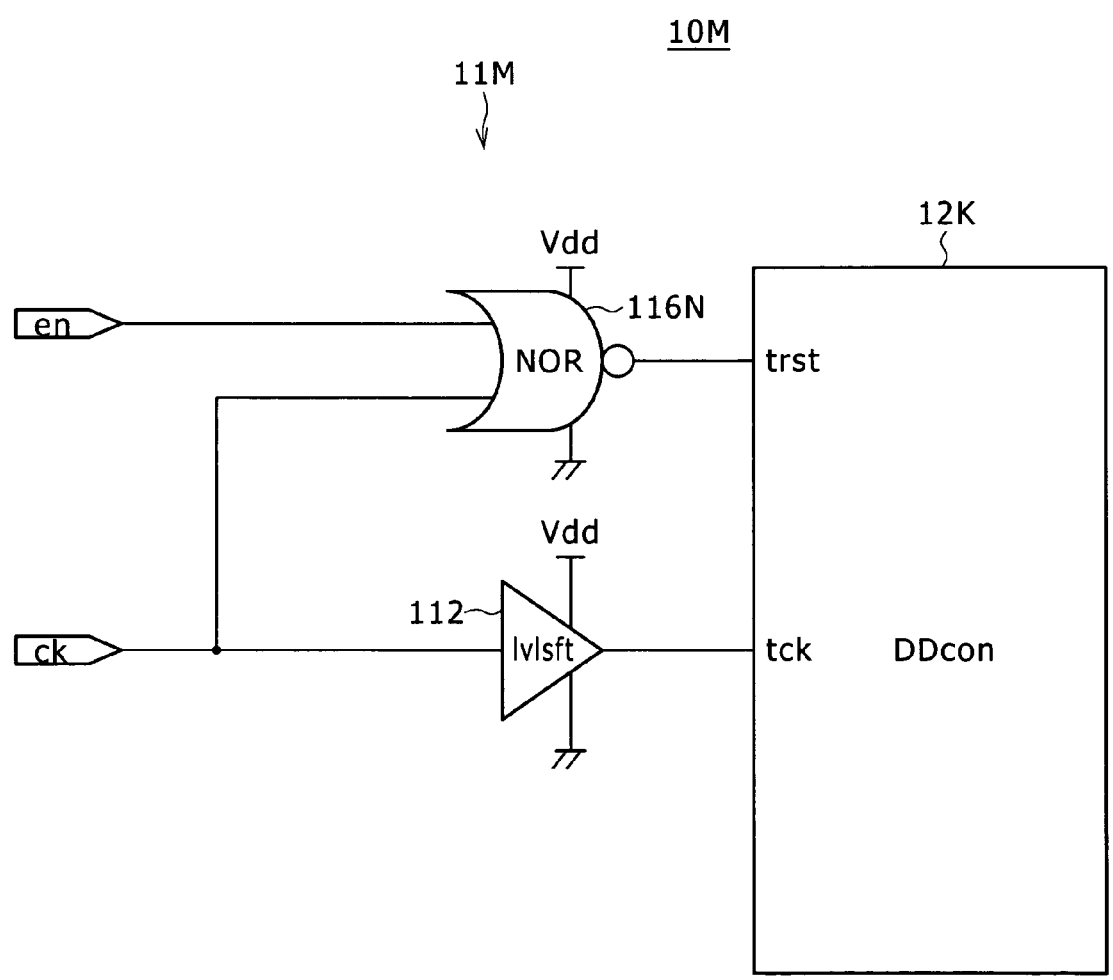
FIG. 28 is a block diagram illustrating a configuration example of the voltage supply circuit according to a fourteenth embodiment of the present invention.
Figure 29:
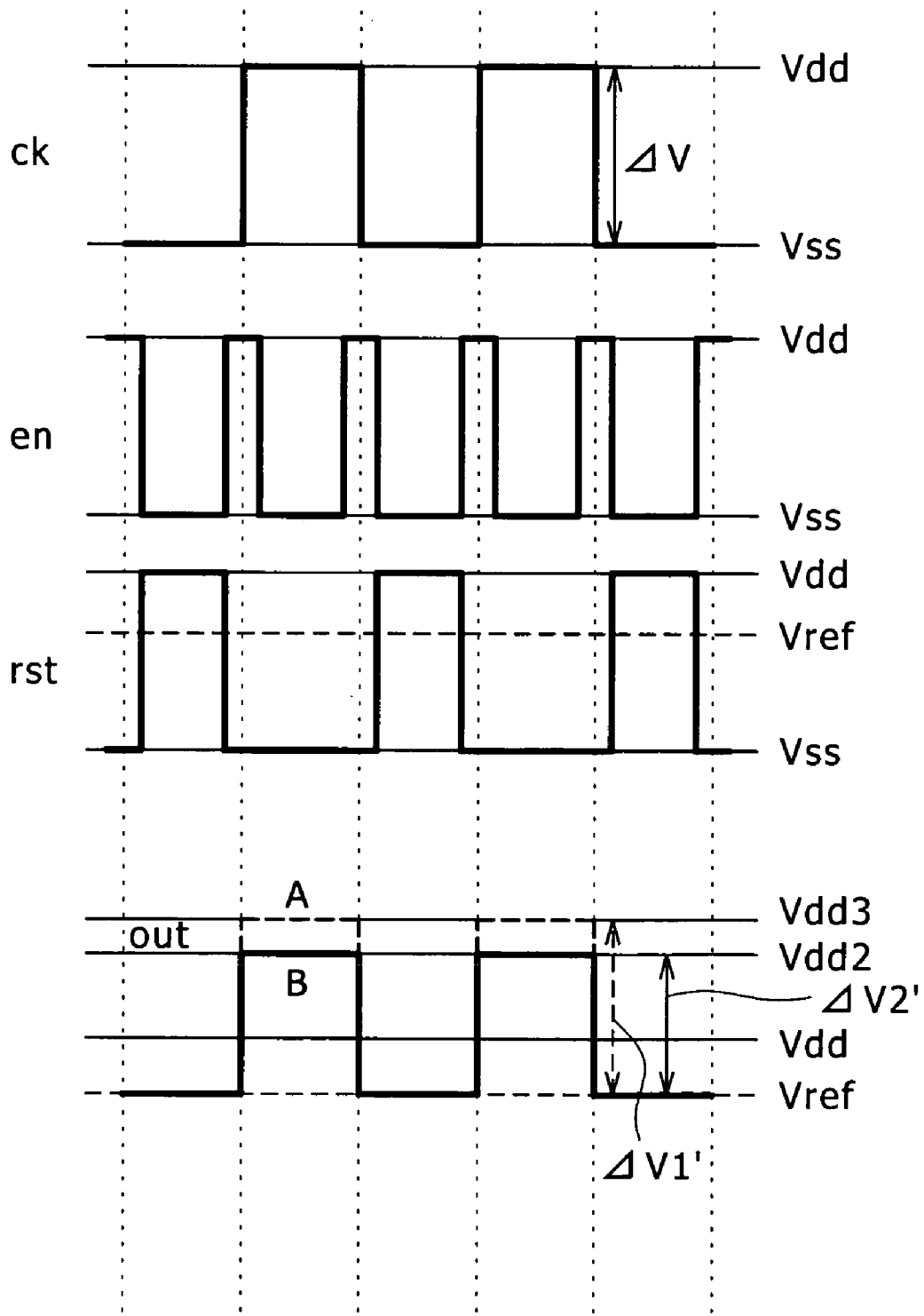
FIG. 29 is a timing diagram of the voltage supply circuit according to the fourteenth embodiment.

FIG. 28 is a block diagram illustrating a configuration example of the voltage supply circuit according to a fourteenth embodiment of the present invention. FIG. 29 is a timing diagram of the voltage supply circuit according to the fourteenth embodiment.

A voltage supply circuit 10M according to the fourteenth embodiment differs from the voltage supply circuit 10K according to the twelfth embodiment in that a NOR circuit function section 116N is provided in place of the inverting function to serve as the level shifter adapted to generate the reset signal rst so that the reset signal rst can be selectively generated from the clock ck and the enable signal en.

Also in this case, the fourteenth embodiment offers the same advantage as the seventh embodiment in that the off period (high level period) of the reset signal rst is longer so that the reset signal rst timing can be determined as desired to ensure that the supply period of the negative potential Vss2 is not reduced.

Figure 30:
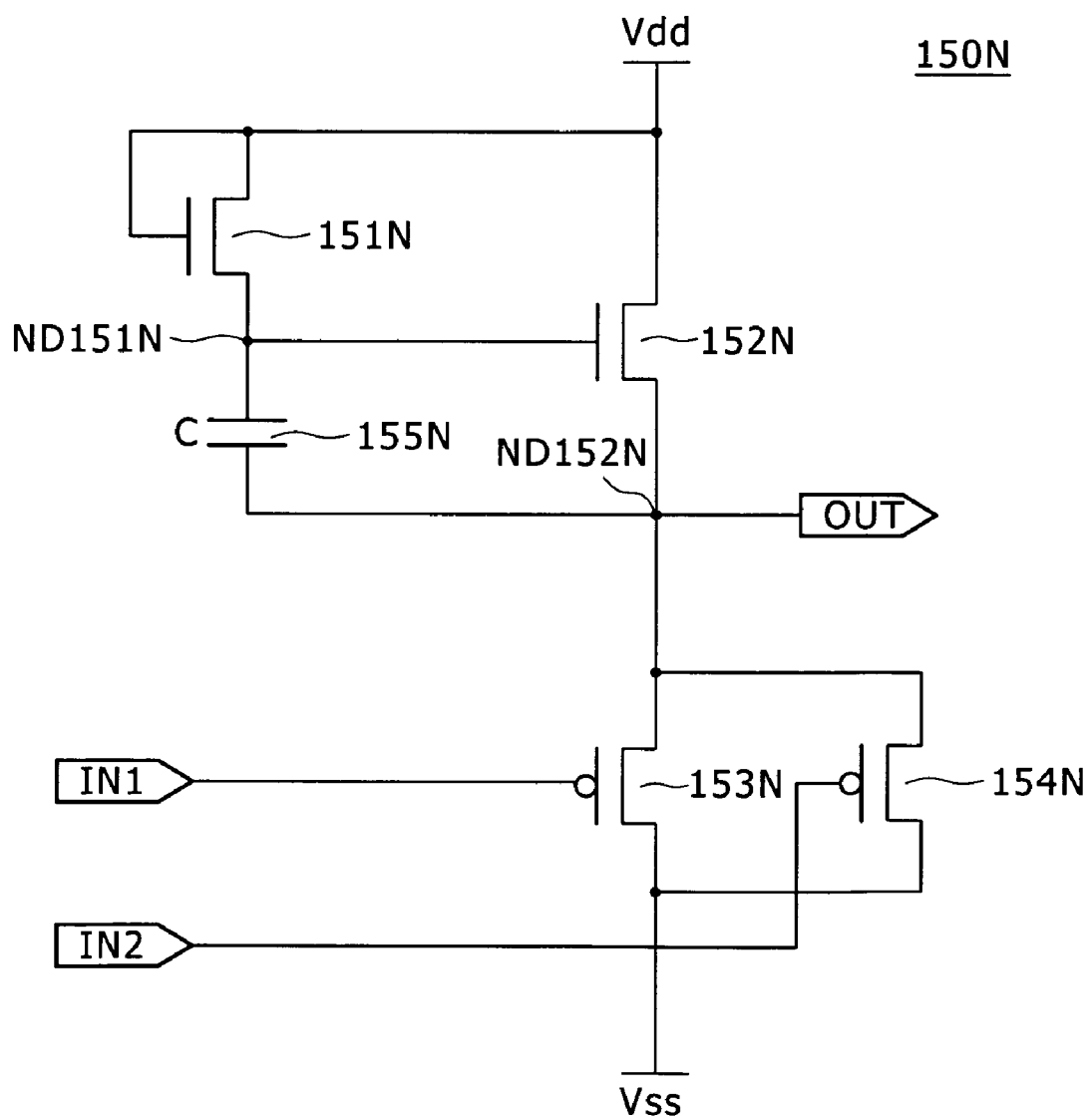
FIG. 30 is a circuit diagram illustrating an example of NOR circuit configured only with transistors of identical polarity, namely, PMOS transistors.

FIG. 30 is a circuit diagram illustrating an example of NOR circuit configured only with transistors of identical polarity, namely, NMOS transistors.

A NOR circuit 150N includes NMOS transistors 151N to 154N, a capacitor 155N and nodes ND151N and ND152N, as illustrated in FIG. 30.

The transistor 151N has its source connected to the node ND151N and its gate and drain connected to the supply potential Vdd. The transistor 152N has its source connected to the node ND152N, its drain connected to the supply potential Vdd and its gate connected to the node ND151N.

The transistor 153N has its source connected to the supply line of the reference voltage Vss, its drain connected to the source of the transistor 154N and its gate connected to the signal input line IN1. The transistor 154N has its drain connected to the node ND152N and its gate connected to the signal input line IN2.

The capacitor 155N has its first electrode connected to the node ND151N and its second electrode connected to the node ND152N. The node ND152N is connected to the output OUT.

In the NOR circuit 150N configured as described above, if both or either of the two signals en and ck is at high level, both or either of the transistors 153N and 154N turns on, lowering the potential of the node ND152N. This causes the potential of the node ND151N to be lowered via the capacitor 155N, turning off the transistor 152N. As a result, the reset signal rst at the Vss level is output to the output OUT.

If the NOR circuit 150N receives the two signals en and ck both of which are at low level, both of the transistors 153N and 154N turn off. This causes the potential of the node ND151N to be discharged via the transistor 151N, turning on the transistor 152N. As a result, the reset signal rst at the Vdd level is output to the output OUT.

Except for the above, the voltage supply circuit according to this embodiment is configured in the same manner as with that according to the twelfth embodiment.

The fourteenth embodiment provides the same effects as the twelfth embodiment.

Fifteenth Embodiment

Figure 31:
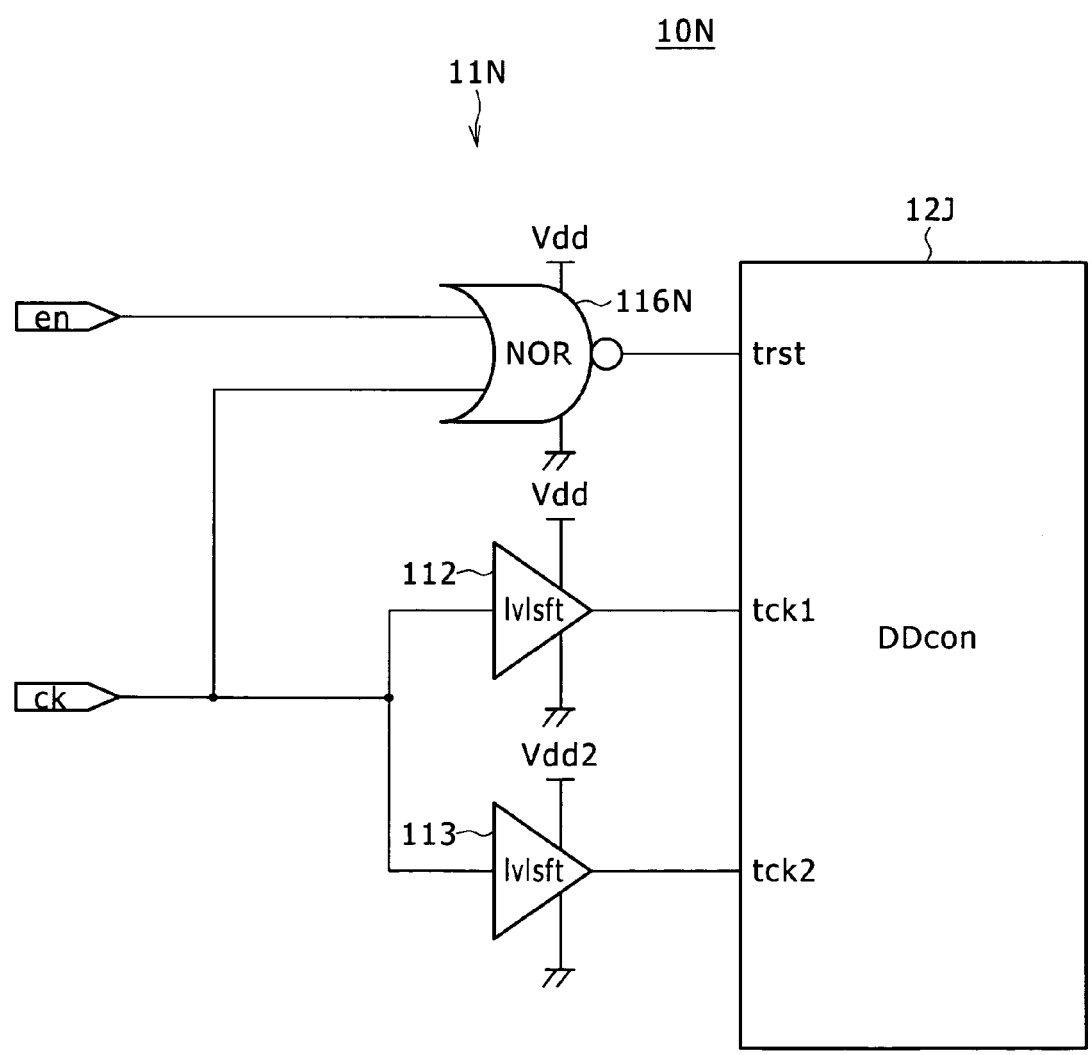
FIG. 31 is a block diagram illustrating a configuration example of the voltage supply circuit according to a fifteenth embodiment of the present invention.

FIG. 31 is a block diagram illustrating a configuration example of the voltage supply circuit according to a fifteenth embodiment of the present invention.

A voltage supply circuit 10N according to the fifteenth embodiment differs from the voltage supply circuit 10J according to the eleventh embodiment in that the NOR circuit function section 116N is provided to serve as the level shifter adapted to generate the reset signal rst, as in the fourteenth embodiment, so that the reset signal rst can be selectively generated from the clock ck and the enable signal en.

Also in this case, the fifteenth embodiment offers the same advantage as the seventh embodiment in that the off period (high level period) of the reset signal rst is longer so that the reset signal rst timing can be determined as desired to ensure that the supply period of the negative potential Vss2 is not reduced.

Except for the above, the voltage supply circuit according to this embodiment is configured in the same manner as with that according to the eleventh embodiment.

The fifteenth embodiment provides the same effects as the eleventh embodiment.

It should be noted that an inverter 130N or a NAND circuit 140N, each of which includes only NMOS transistors, is applicable to the fourteenth and fifteenth embodiments in place of the NOR circuit.

Figure 32:
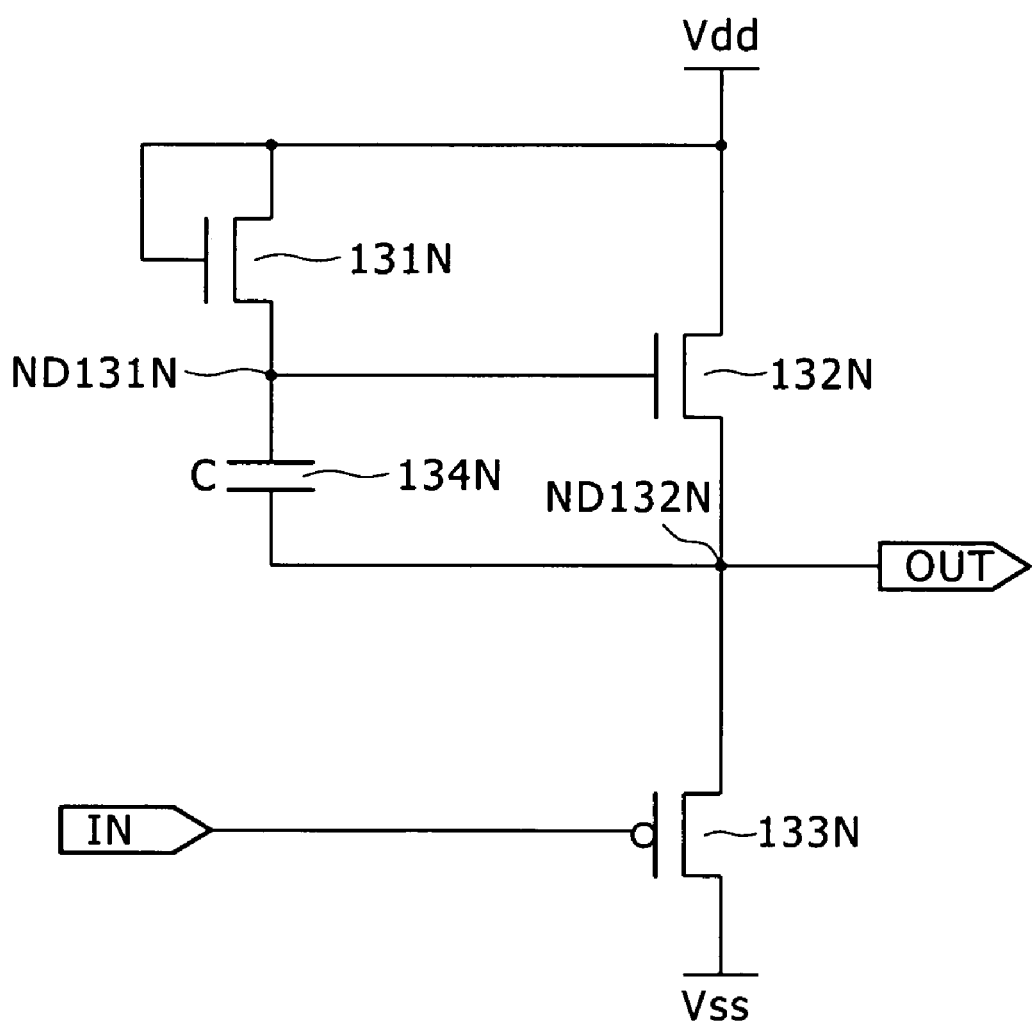
FIG. 32 is a circuit diagram illustrating an example of inverter configured only with transistors of identical polarity, namely, NMOS transistors.

FIG. 32 is a circuit diagram illustrating an example of inverter configured only with transistors of identical polarity, namely, NMOS transistors.

The inverter 130N includes NMOS transistors 131N to 133N, a capacitor 134N and nodes ND131N and ND132N, as illustrated in FIG. 32.

The transistor 131N has its source connected to the node ND131N and its gate and drain connected to the supply potential Vdd. The transistor 132N has its source connected to the node ND132N, its drain connected to the supply potential Vdd, and its gate connected to the node ND131N.

The transistor 133N has its source connected to the reference potential Vss, its drain connected to the node ND132N, and its gate connected to the signal input line IN.

The capacitor 134N has its first electrode connected to the node ND131N and its second electrode connected to the node ND132N. The node ND132N is connected to the output OUT.

In the inverter 130N configured as described above, when a high level signal is input, the transistor 133N turns on, lowering the potential of the node ND132N. This causes the potential of the node ND131N to be lowered via the capacitor C134N, turning off the transistor 132N. As a result, a signal at the Vss level is output to the output OUT.

When a low level signal is input, the transistor 133N turns off. This causes the potential of the node ND131N to be charged via the transistor 131N, turning on the transistor 132N. As a result, a signal at the Vdd level is output to the output OUT.

Figure 33:
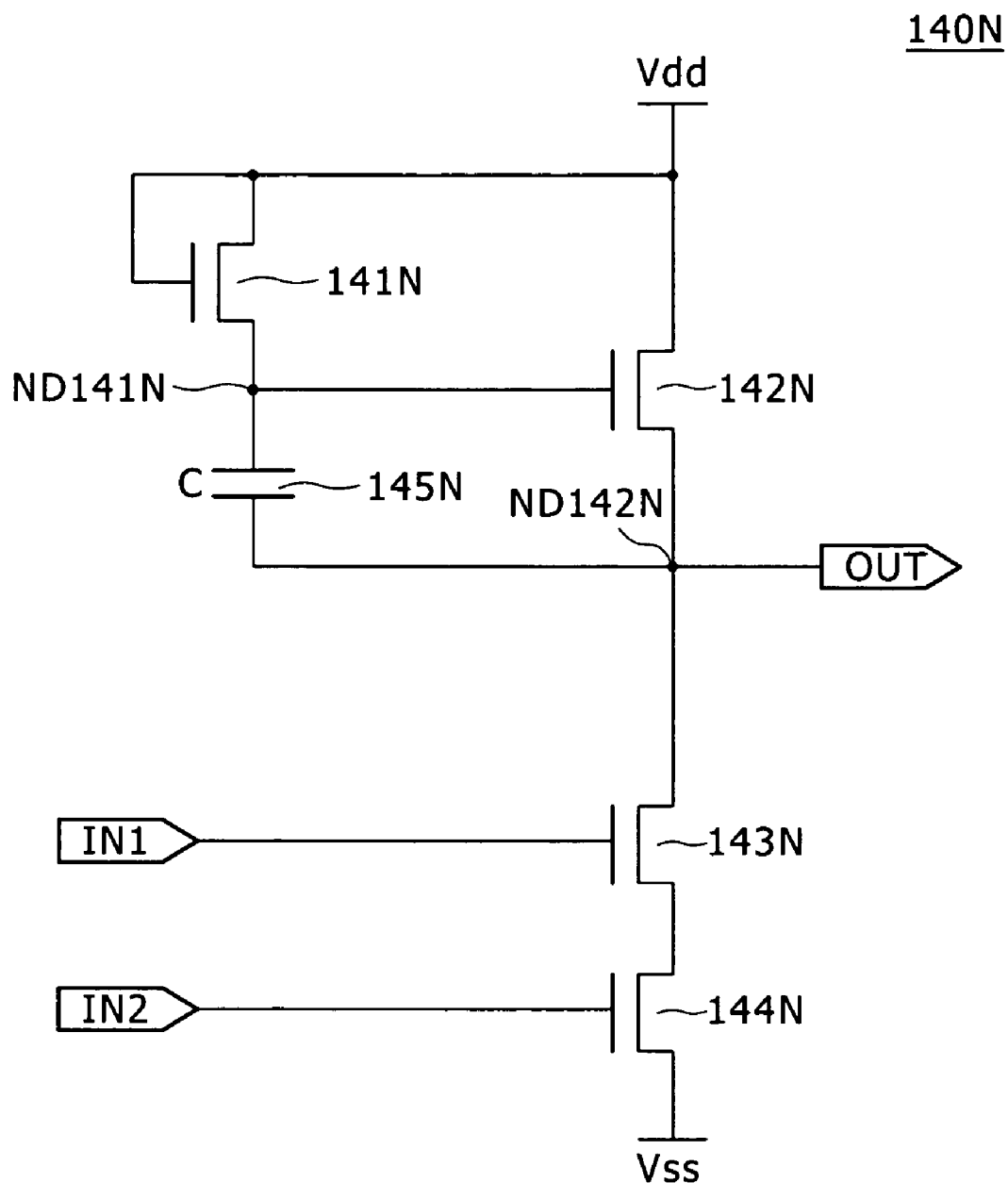
FIG. 33 is a circuit diagram illustrating an example of NAND circuit configured only with transistors of identical polarity, namely, NMOS transistors.

FIG. 33 is a circuit diagram illustrating an example of NAND circuit configured only with transistors of identical polarity, namely, NMOS transistors.

A NAND circuit 140N includes NMOS transistors 141N to 144N, a capacitor 145N and nodes ND141N and ND142N as illustrated in FIG. 33.

The transistor 141N has its source connected to the node ND141N and its gate and drain connected to the supply potential Vdd. The transistor 142N has its source connected to the node ND142N, its drain connected to the supply potential Vdd and its gate connected to the node ND141N.

The transistor 143N has its source connected to the reference potential Vss, its drain connected to the node ND142N and its gate connected to the signal input line IN1.

The transistor 144N has its source connected to the supply line of the supply voltage Vdd, its drain connected to the node ND142N and its gate connected to the signal input line IN2.

The capacitor 145N has its first electrode connected to the node ND141N and its second electrode connected to the node ND142N. The node ND142N is connected to the output OUT.

In the NAND circuit 140N configured as described above, if the two signals en and ck are both at high level, both of the transistors 143N and 144N turn on, lowering the potential of the node ND142N. This causes the potential of the node ND141N to be lowered via the capacitor 145N, turning off the transistor 142N. As a result, the reset signal rst at the Vss level is output to the output OUT.

If the NAND circuit 140N receives the two signals en and ck both or either of which is at low level, both or either of the transistors 143N and 144N turns off. This causes the potential of the node ND141N to be discharged via the transistor 141N, turning on the transistor 142N. As a result, the reset signal rst at the Vdd level is output to the output OUT.

Thus, the voltage supply circuits made up of NMOS transistors have been described up to this point. It should be noted that there are some configurations which have not been described. Needless to say, however, the configurations of the voltage supply circuits according to the first to tenth embodiments made up of PMOS transistors are applicable.

As mentioned earlier, using NMOS transistors to configure a voltage supply circuit facilitates, for example, the formation of TFTs using amorphous silicon. As a result, the voltage supply circuit can be readily incorporated in a panel of an organic EL display device using the pixel circuit which will be described later.

A description will be made below about configuration examples in which the voltage supply circuits 10 and 10A to 10N according to the preferred embodiments are used and incorporated in an organic EL display device.

Sixteenth Embodiment

Figure 34:
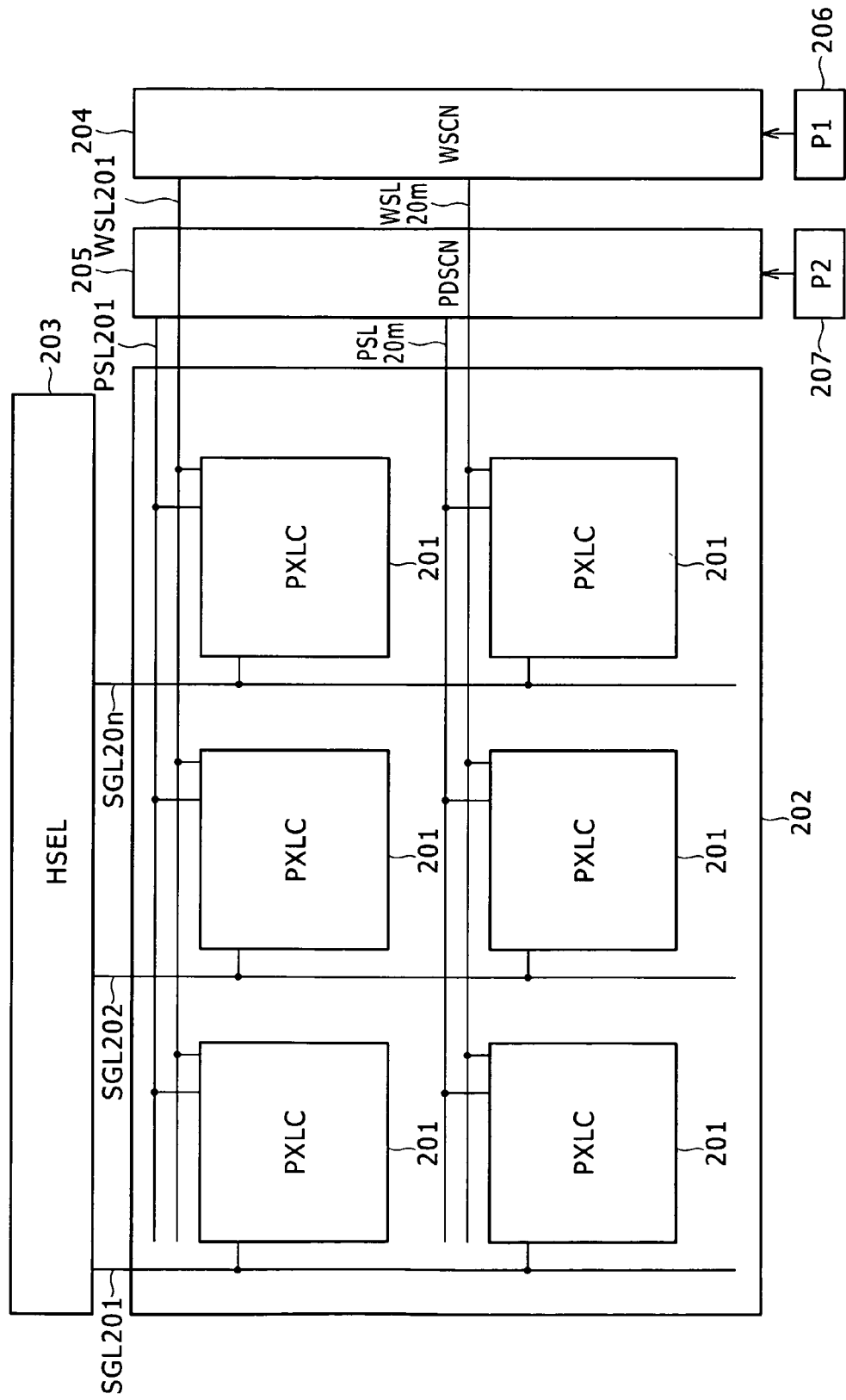
FIG. 34 is a block diagram illustrating the configuration of an organic EL display device using a pixel circuit according to a sixteenth embodiment of the present invention.

FIG. 34 is a block diagram illustrating the configuration of an organic EL display device using a pixel circuit according to a sixteenth embodiment of the present invention.

Figure 35:
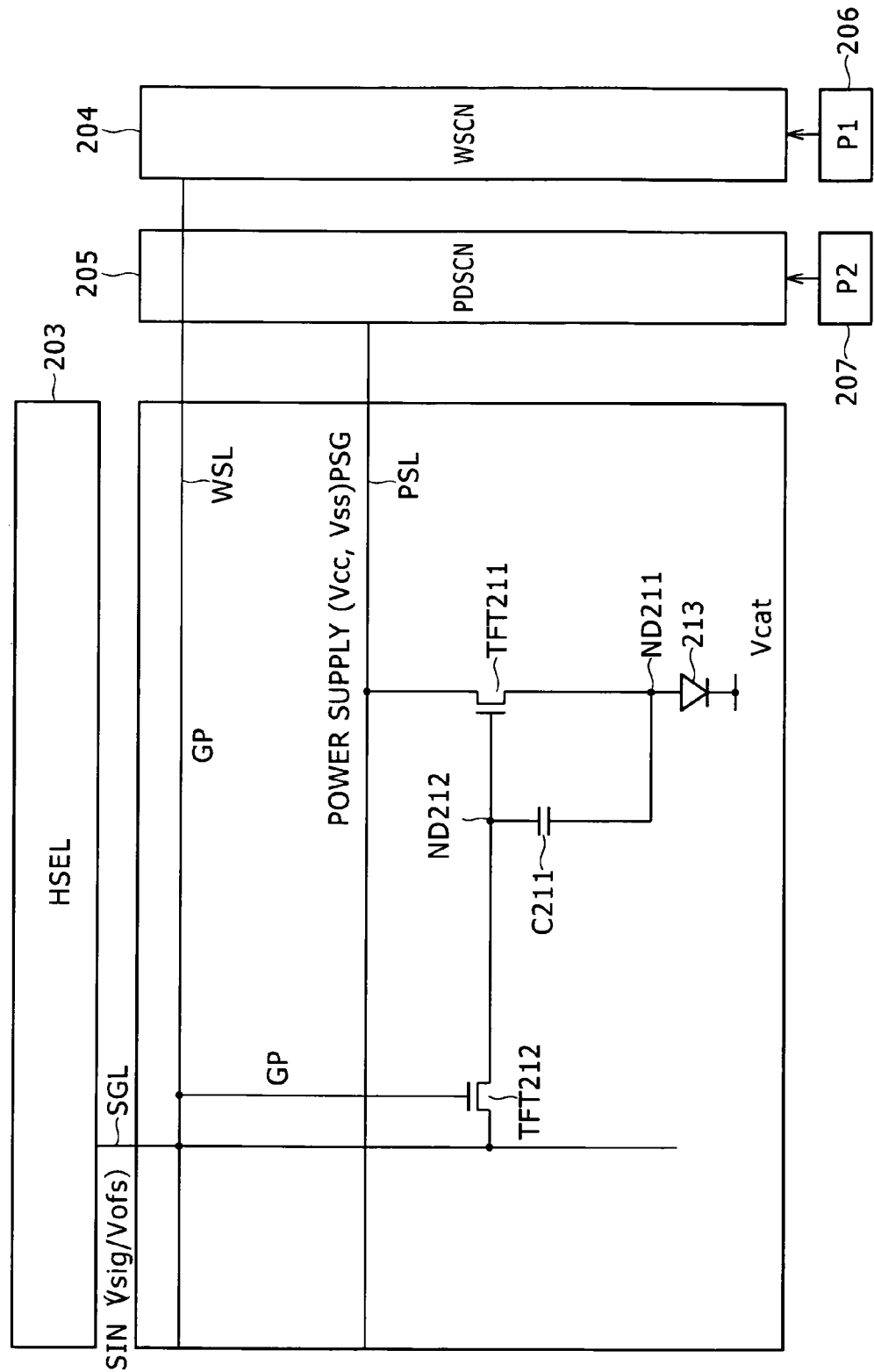
FIG. 35 is a circuit diagram illustrating a specific configuration of the pixel circuit according to the sixteenth embodiment.

FIG. 35 is a circuit diagram illustrating a specific configuration of the pixel circuit according to the sixteenth embodiment.

As illustrated in FIGS. 34 and 35, a display device 200 includes a pixel array section 202 having pixel circuits 201 arranged in an m by n matrix. The display device 200 further includes a horizontal selector (HSEL) 203, a write scanner (WSCN) 204, a power drive scanner (PDSCN) 205 and a voltage supply circuit (P1) 206 adapted to supply a drive voltage to the write scanner 204. The display device 200 still further includes a voltage supply circuit (P2) 207 adapted to supply a drive voltage to the power drive scanner 205 and signal lines SGL201 to SGL20$n$ selected by the horizontal selector 203 and supplied with an input signal SIN of a data signal Vsig or an offset signal Vofs according to brightness information. The display device 200 still further includes scan lines WSL201 to WSL20$m$ adapted to serve as drive wirings to be driven by a gate pulse (scan pulse) GP from the write scanner 204. The display device 200 still further includes power drive lines PSL201 to PSL20$m$. The power drive lines PSL201 to PSL20$m$ serve as drive wirings and are driven as a power signal PSG is applied thereto. The power signal PSG is selectively set to VCC (e.g., supply voltage) or VSS (e.g., negative voltage) by the power drive scanner 205.

It should be noted that these components are formed, for example, on the same panel.

Although, in the pixel array section 202, the pixel circuits 201 are arranged in an m by n matrix, FIG. 34 illustrates an example in which the same circuits 201 are arranged in a 2 (=m) by 3 (=n) matrix for simplification of the drawing.

FIG. 35 also illustrates a specific configuration of the single pixel circuit for simplification of the drawing.

As illustrated in FIG. 35, the pixel circuit 201 according to the present embodiment includes an n-channel TFT211 serving as a drive transistor, an n-channel TFT212 serving as a switching transistor and a capacitor C211. The same circuit 201 further includes a light emitting element 213 which includes an organic EL light emitting device (OLED) and first and second nodes ND211 and ND212.

In the pixel circuit 201, the TFT211 serving as a drive transistor, the node ND211 and the light emitting element (OLD) 213 are connected in series between the power drive line (power supply line) PSL (20$l$ to 20$m$) and a predetermined reference potential Vcat (e.g., ground potential).

More specifically, the light emitting element 213 has its cathode connected to the reference potential Vcat and its anode connected to the first node ND211. The TFT211 has its source connected to the first node ND211 and its drain connected to the power drive line PSL.

The TFT211 has its gate connected to the second node ND212.

The capacitor C211 has its first electrode connected to the first node ND211 and its second electrode connected to the second node ND212.

The TFT212 has its source and drain connected between the signal line SGL and the second node ND212. The TFT212 has its gate connected to the scan line WSL.

As described above, in the pixel circuit 201 according to the sixteenth embodiment, the TFT211 serving as a drive transistor has the capacitor C211 connected between its gate and source. The capacitor C211 serves as a pixel capacitance.

Next, a more specific operation of the above configuration will be described below with emphasis on the pixel circuit operation with reference to FIGS. 36A to 36E and FIGS. 37 to 44.

Figure 36:
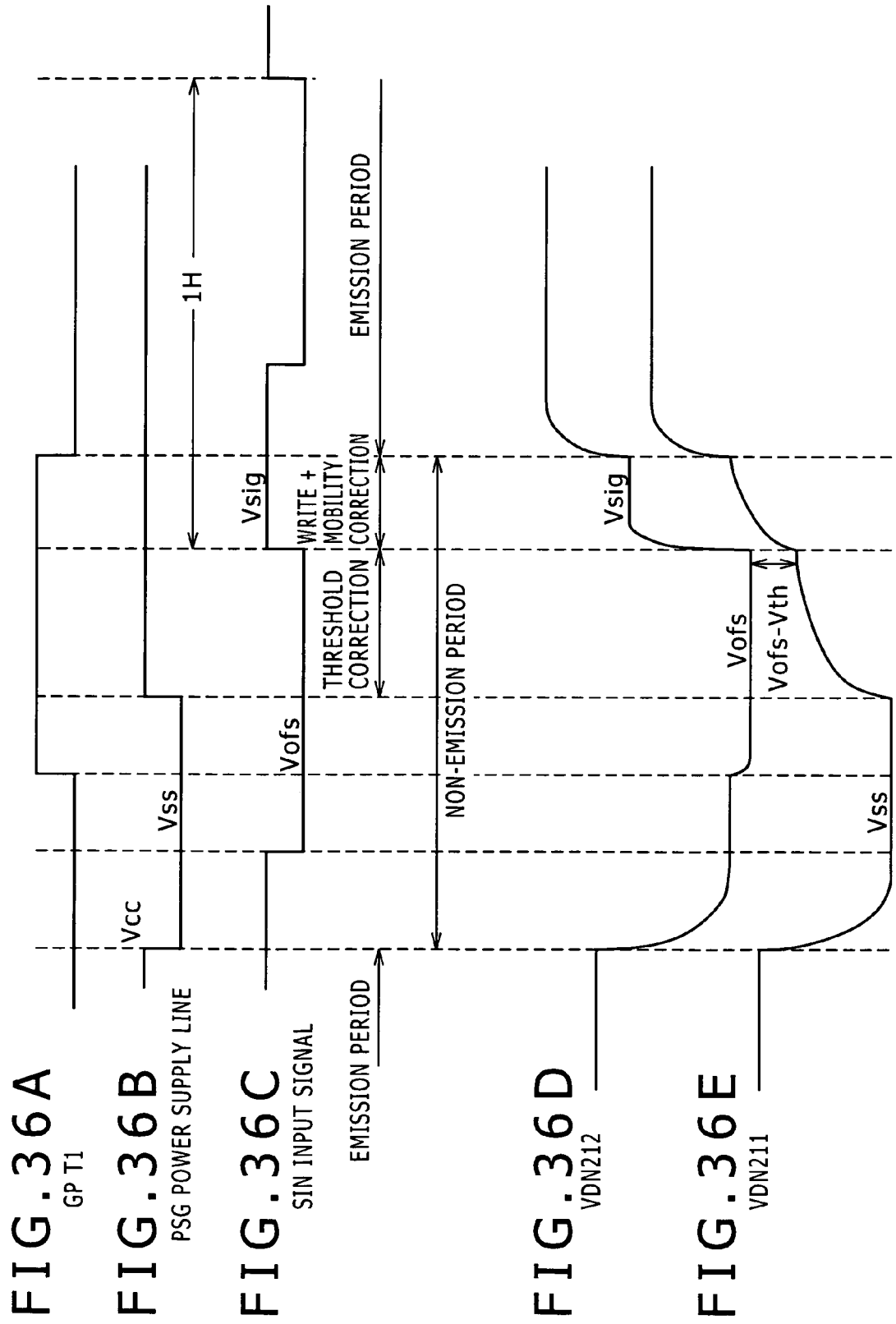
FIGS. 36A to 36E are timing diagrams illustrating the specific operation of the pixel circuit illustrated in FIG. 35.

FIG. 36A illustrates the gate pulse (scan pulse) GP applied to the scan line WSL. FIG. 36B illustrates the power signal PSG applied to the power drive line PSL. FIG. 36C illustrates the input signal SIN applied to the signal line SGL. FIG. 36D illustrates a potential VND212 of the second node ND212. FIG. 36E illustrates a potential VND211 of the first node ND211.

Figure 37:
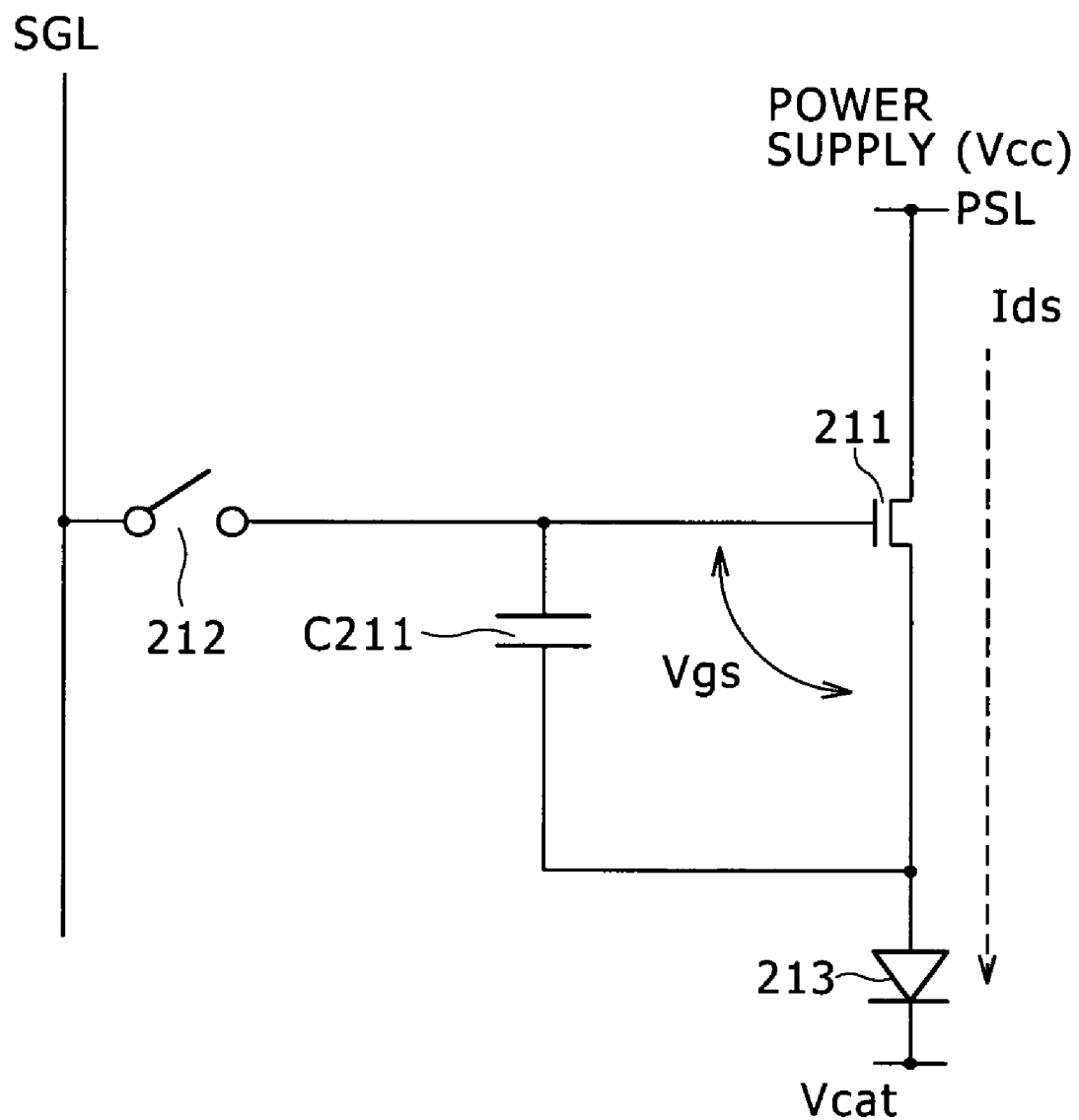
FIG. 37 is a view for describing the operation of the pixel circuit shown in FIG. 35 and illustrates the condition thereof during an emission period.

First, when the EL light emitting element 213 emits light, the potential of the power drive line PSL is at the supply voltage VCC and the TFT212 is off, as illustrated in FIGS. 36B and 37.

At this time, the TFT211 serving as a drive transistor is designed to operate in the saturated region. Therefore, a current Ids flowing through the EL light emitting element 213 takes on a predetermined value according to a gate-to-source voltage Vgs of the TFT211.

Figure 38:
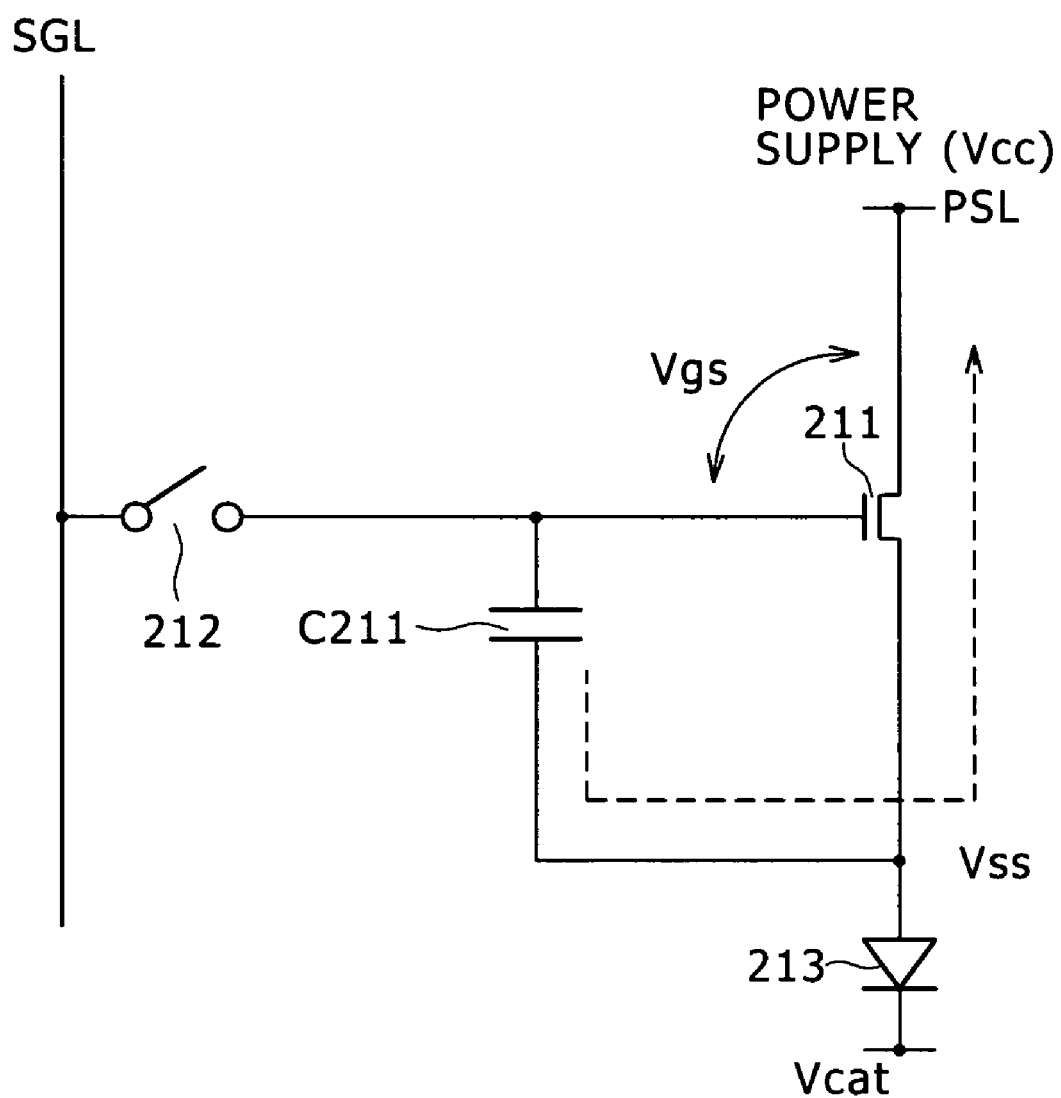
FIG. 38 is a view for describing the operation of the pixel circuit shown in FIG. 35 and illustrates the condition thereof when the voltage is Vss during a non-emission period.
Figure 39:
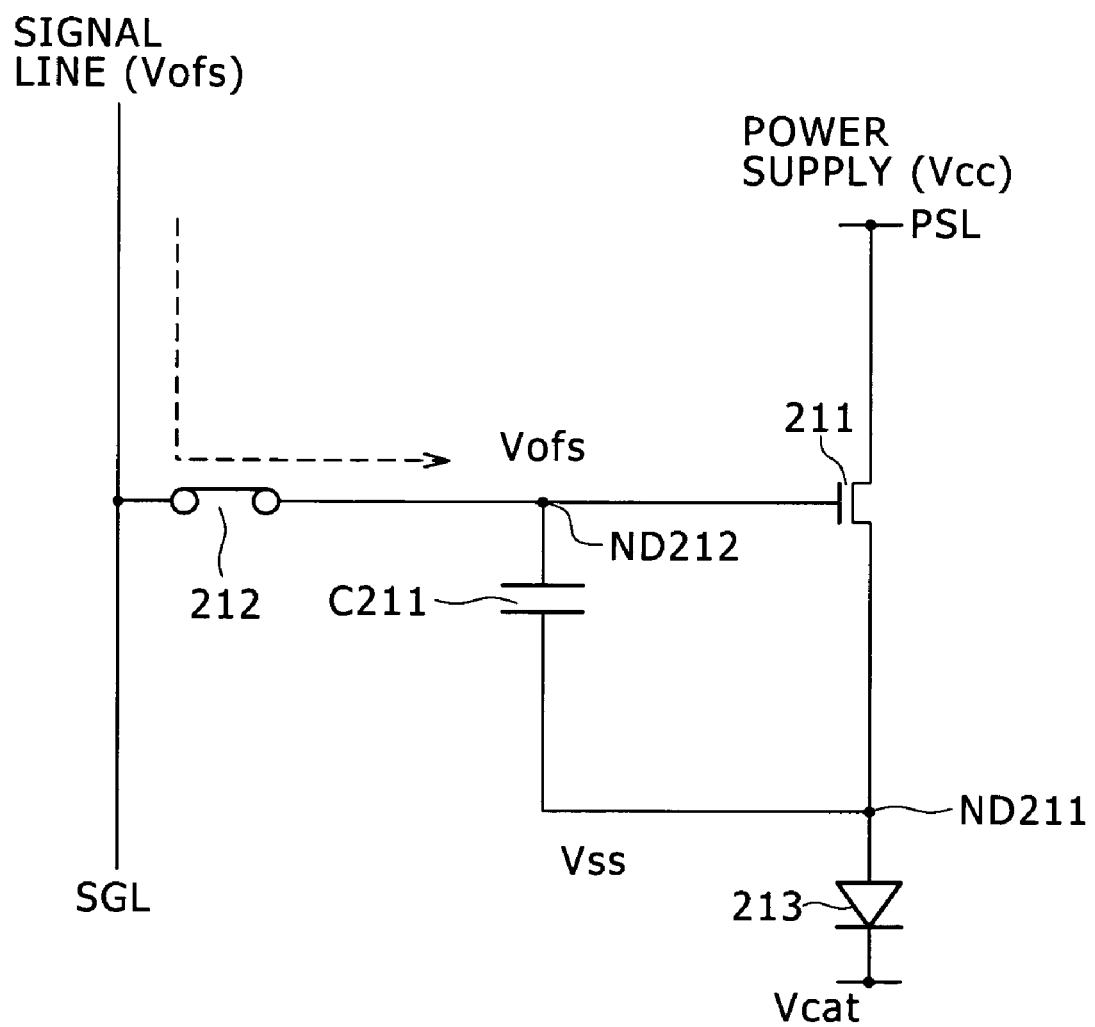
FIG. 39 is a view for describing the operation of the pixel circuit shown in FIG. 35 and illustrates the condition thereof when an offset signal is input.

Next, during a non-emission period, the potential of the power drive line PSL, which is the power supply line, is lowered to Vss, as illustrated in FIGS. 36B and 38. At this time, if the voltage Vss is smaller than the sum of the threshold Vthel of the EL light emitting element 213 and the cathode voltage Vcat, that is, if Vss<Vthel+Vcat, then the EL light emitting element 213 stops emitting light. This causes the power drive line PSL, which is the power supply line, to become the source of the NT 211 serving as a drive transistor. At this time, the anode of the EL light emitting element 213 (node ND211) is charged to Vss, as illustrated in FIG. 36E.

Further, as illustrated in FIGS. 36A, 36C, 36D, 36E and 39, when the potential of the signal line SGL reaches the offset voltage Vofs, the gate pulse is set to high level, turning on the TFT212 and bringing the potential of the TFT211 to Vofs.

At this time, the gate-to-source voltage of the TFT211 takes on the value (Vofs-Vss). If this gate-to-source voltage (Vofs-Vss) of the TFT211 is not greater (smaller) than its threshold voltage Vth, the threshold correction cannot be performed. Therefore, the gate-to-source voltage (Vofs-Vss) of the TFT211 must be greater than its threshold voltage Vth. That is, the relationship Vofs-Vss>Vth must hold.

Then, during the threshold correction, the power signal PSG applied to the power drive line PSL is set back to the supply voltage Vcc again.

Figure 40:
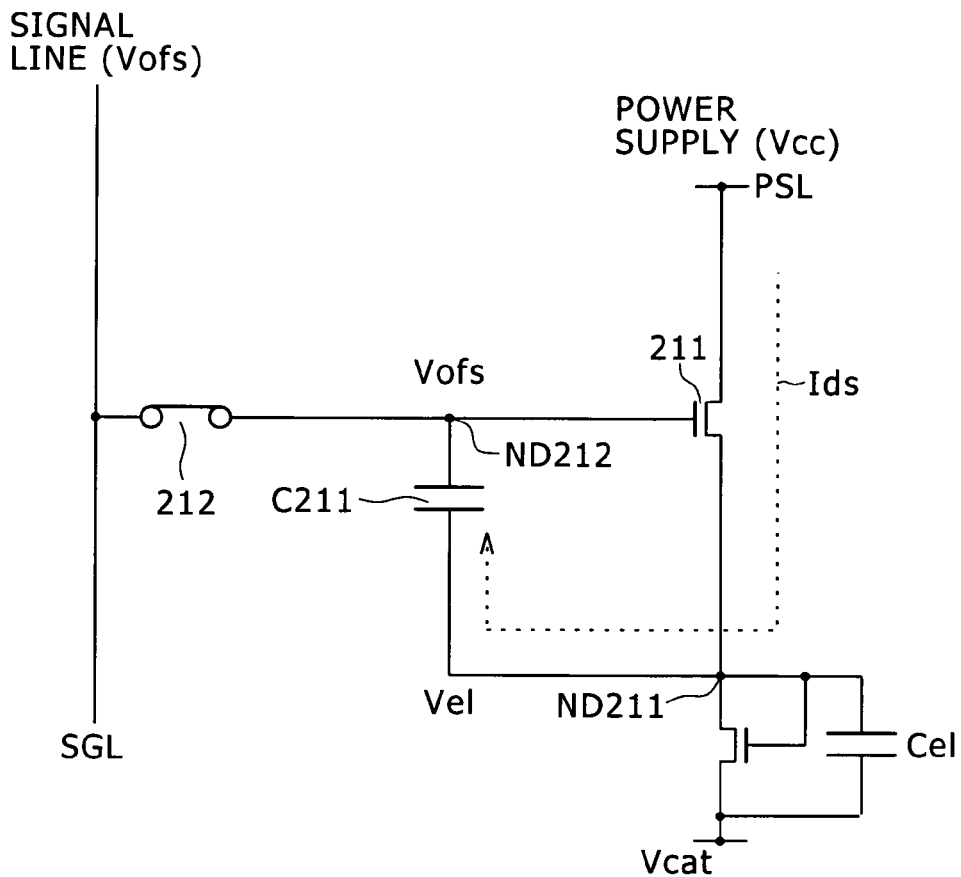
FIG. 40 is a view for describing the operation of the pixel circuit shown in FIG. 35 and illustrates the condition thereof when the voltage is Vcc.

As the power drive line PSL is set to the supply voltage Vcc, the anode of the EL light emitting element 213 (node ND211) functions as the source of the TFT211, causing a current to flow in the direction as illustrated in FIG. 40.

The equivalent circuit of the EL light emitting element 213 is represented by a diode and a capacitor as illustrated in FIG. 40. Therefore, so long as the relationship Vel≦Vcat+Vthel is satisfied (so long as the leak current of the EL light emitting element 213 is considerably smaller than the current flowing through the TFT211), the current flowing through the TFT211 is used to charge the capacitors C211 and Cel.

Figure 41:
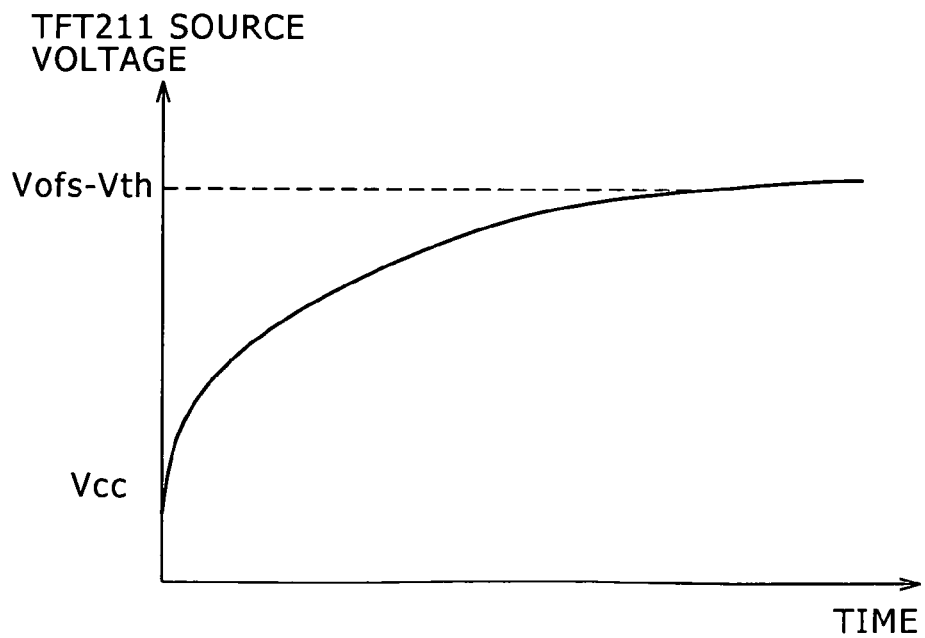
FIG. 41 is a view for describing the operation of the pixel circuit shown in FIG. 35 and illustrates the change in source voltage of a drive transistor when the voltage is Vcc.

At this time, the voltage Vel across the capacitor Cel rises with time as illustrated in FIG. 41. After elapse of a predetermined period of time, the gate-to-source voltage of the TFT211 takes on the value Vth. At this time, the relationship Vel=Vofs−Vth≦Vcat+Vthel holds.

Figure 42:
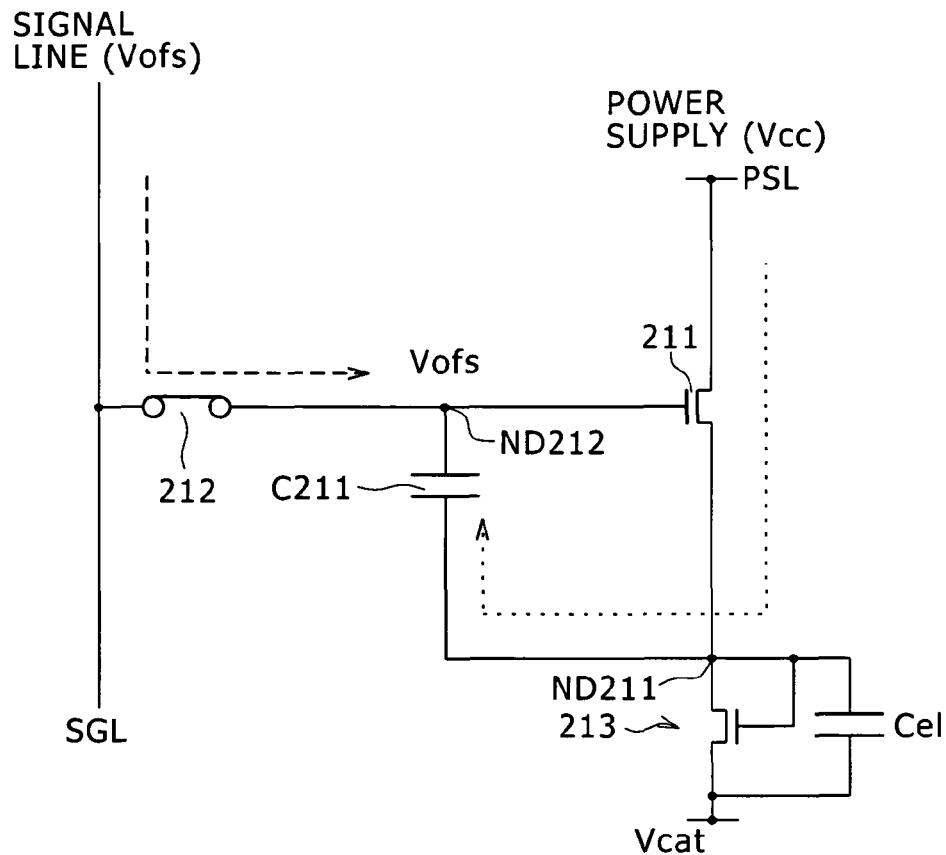
FIG. 42 is a view for describing the operation of the pixel circuit shown in FIG. 35 and illustrates the condition thereof when a data signal Vsig is written.

After the threshold cancellation, the potential of the signal line SGL is raised to Vsig with the TFT212 left on as illustrated in FIGS. 36A, 36C and 42. The data signal Vsig is at the voltage level commensurate with the gray level. At this time, the gate potential of the TFT211 is equal to Vsig as illustrated in FIG. 36D because the TFT212 is on. However, the source potential rises with time because the current Ids flows from the power drive line PSL.

At this time, so long as the source voltage of the TFT211 does not exceed the sum of the threshold voltage Vtel of the EL light emitting element 213 and the cathode voltage Vcat (so long as the leak current of the EL light emitting element 213 is considerably smaller than the current flowing through the TFT211), the current flowing through the TFT211 is used to charge the capacitors C211 and Cel.

At this time, the threshold correction of the TFT211 is already complete. Therefore, the current flowing through the TFT211 reflects a mobility μ.

Figure 43:
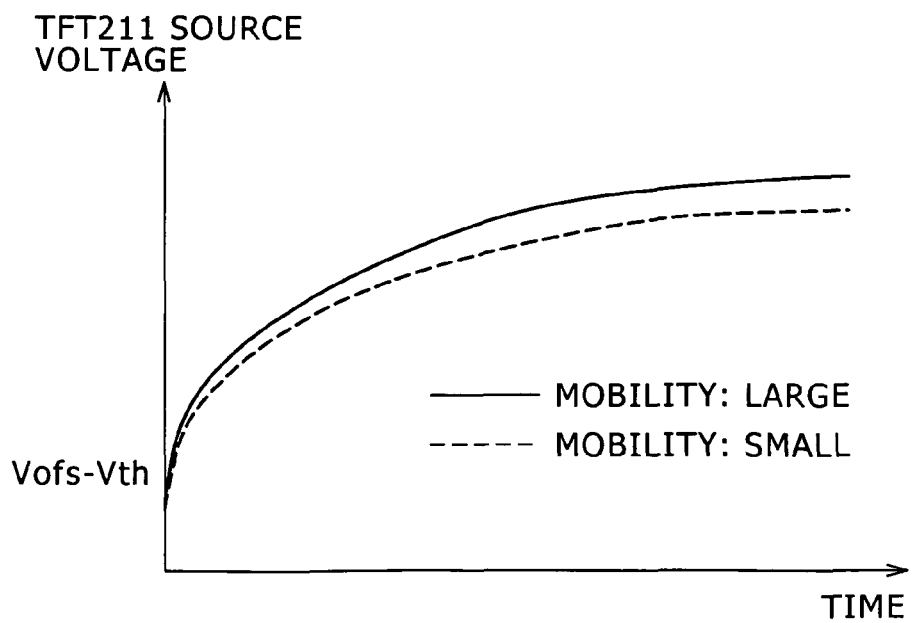
FIG. 43 is a view for describing the operation of the pixel circuit shown in FIG. 35 and illustrates the change in source voltage of the drive transistor according to the magnitude of mobility.
Figure 44:
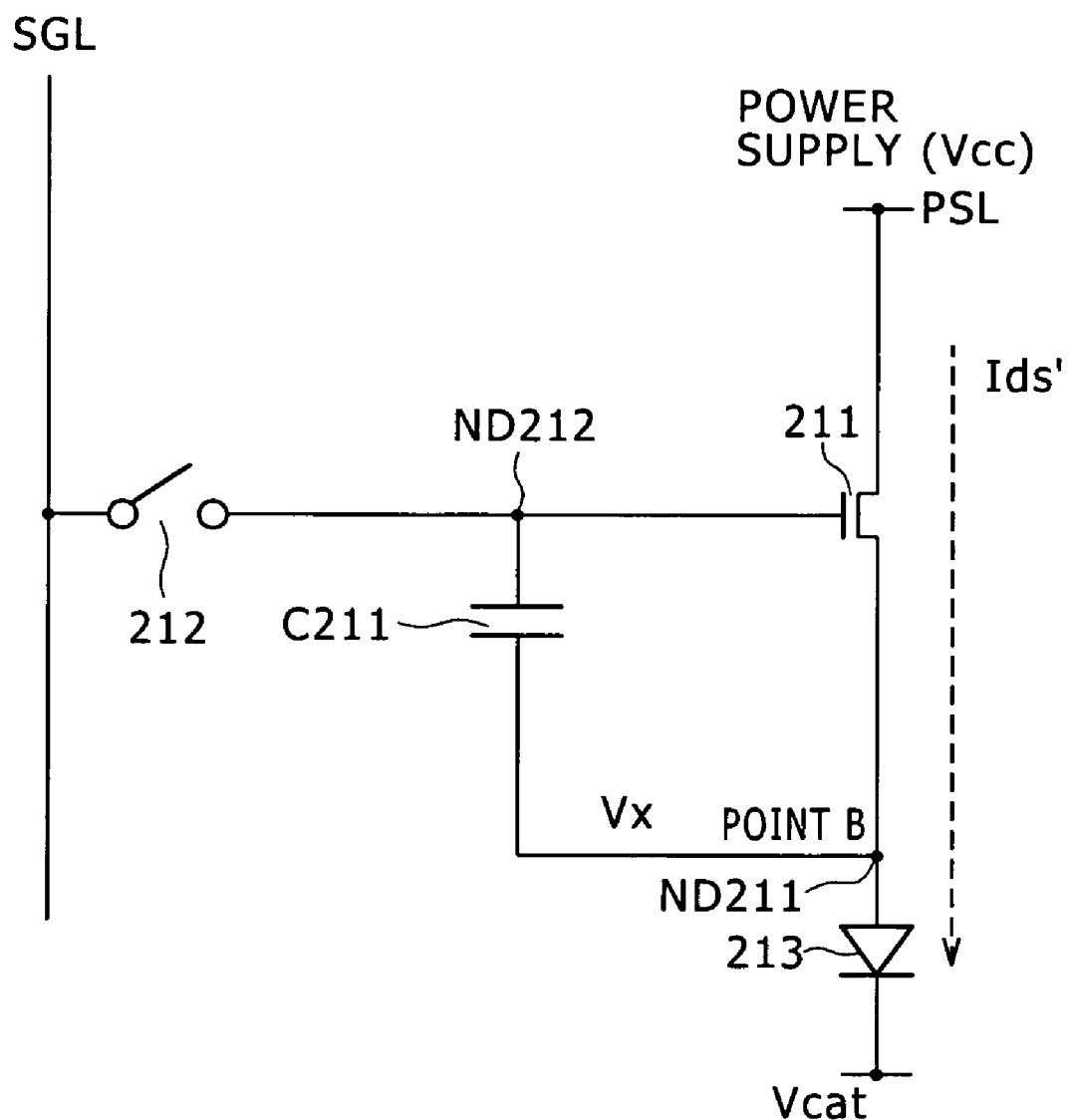
FIG. 44 is a view for describing the operation of the pixel circuit shown in FIG. 35 and illustrates the pixel circuit when light is emitted.

More specifically, as illustrated in FIG. 43, the larger the mobility μ, the larger the current flow and the faster the source voltage rises. Conversely, the smaller the mobility μ, the smaller the current flow and the slower the source voltage rises. As a result, the gate-to-source voltage of the TFT211 diminishes as it reflects the mobility μ. The gate-to-source voltage will eventually be equal to Vgs in a predetermined period of time for complete correction of the mobility.

Finally, as illustrated in FIGS. 36A to 36C and 44, the gate pulse GP is switched to low level, turning off the TFT212 to terminate the write operation, and causing the EL light emitting element 213 to emit light.

The gate-to-source voltage of the TFT211 is constant. Therefore, a constant current Ids' flows from the TFT211 into the EL light emitting element 213. Vel rises to a voltage Vx where the current Ids' flows through the same element 213. As a result, the same element 213 emits light.

Also in the present pixel circuit 201, the I-V characteristic thereof changes if the emission time of the EL light emitting element 213 is long. As a result, the potential of a point B (node ND211) shown in FIG. 44 also changes. However, the gate-to-source voltage of the TFT211 is maintained constant. Therefore, the current flowing through the EL light emitting element 213 remains unchanged. Hence, even if the I-V characteristic of the same element 213 deteriorates, the constant current Ids' continues to flow. As a result, the brightness of the same element 213 remains unchanged.

Thus, in the sixteenth embodiment, a description has been made about the display device 200 having the circuit shown in FIG. 38, namely, a 2 Tr+1 C pixel circuit which includes two transistors and one capacitor.

It should be noted, however, that the present embodiment is applicable to other display devices in addition to the display device 200 having the 2 Tr+1 C pixel circuit. That is, the present embodiment is also applicable to display devices having TFTs or other components separately for cancellation of the mobility or threshold, in addition to drive and switching transistors connected in series with the OLED.

A description will be made below about a configuration example of a display device having a 5 Tr+1 C pixel circuit which includes five transistors and one capacitor among the above-described display devices.

Seventeenth Embodiment

Figure 45:
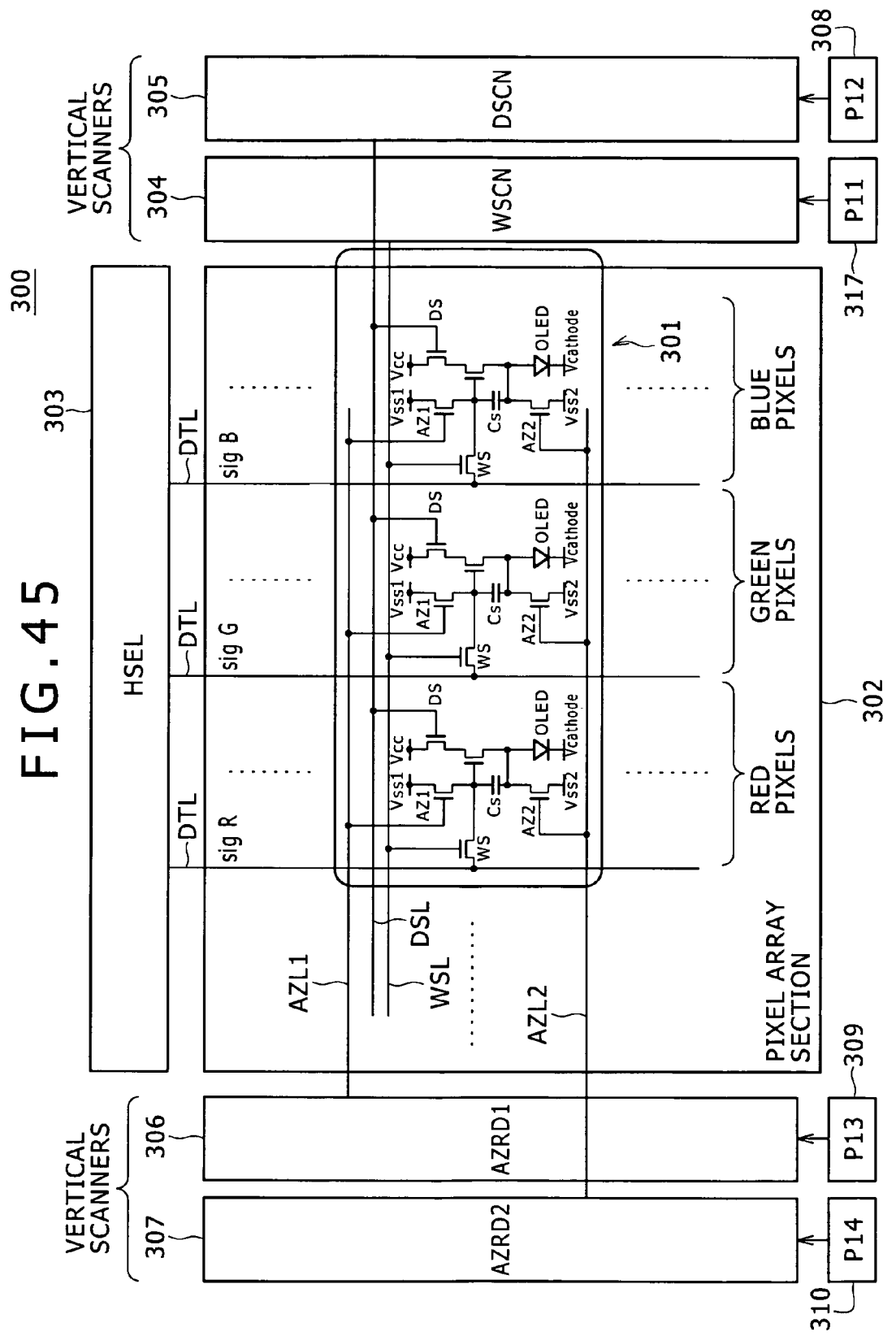
FIG. 45 is a block diagram illustrating the configuration of an organic EL display device using the pixel circuit according to a seventeenth embodiment of the present invention.
Figure 46:
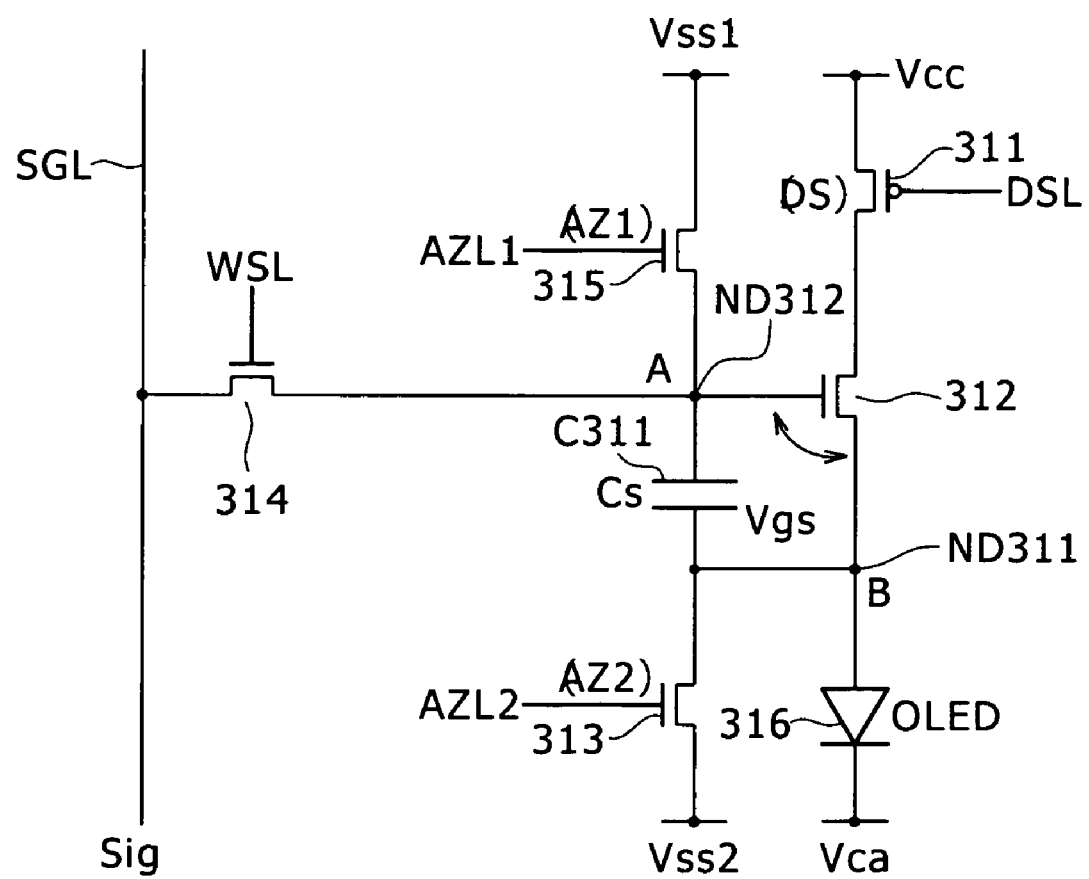
FIG. 46 is a circuit diagram illustrating a specific configuration of the pixel circuit according to the seventeenth embodiment.
Figure 48A:
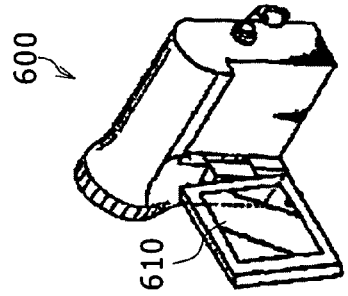
FIGS. 48A to 48G are views illustrating electronic equipments to which the display device according to the present embodiment is applied.
Figure 48B:
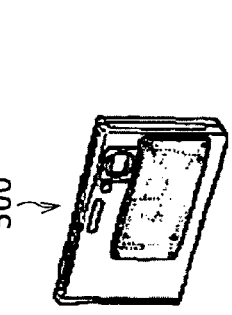
Figure 48C:
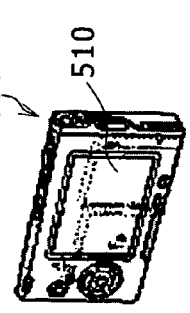
Figure 48D:
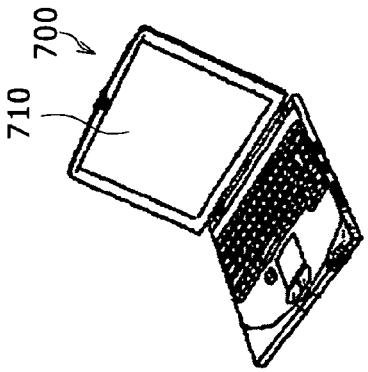
Figure 48E:
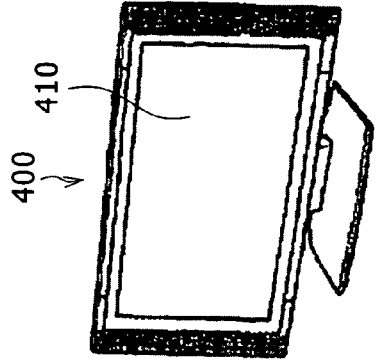
Figure 48F:
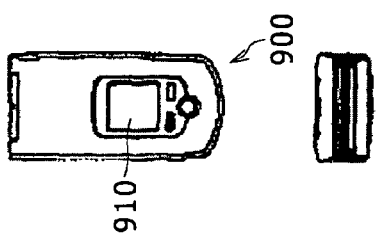
Figure 48G:
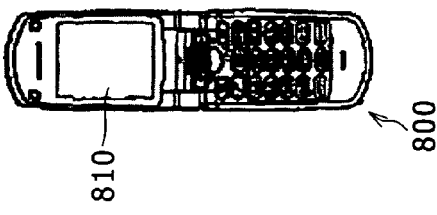

FIG. 45 is a block diagram illustrating the configuration of an organic EL display device using the pixel circuit according to a seventeenth embodiment of the present invention. FIG. 46 is a circuit diagram illustrating a specific configuration of the pixel circuit according to the seventeenth embodiment.

As illustrated in FIGS. 45 and 46, a display device 300 includes a pixel array section 302 having pixel circuits 301 arranged in an m by n matrix. The display device 300 further includes a horizontal selector (HSEL) 303, a write scanner (WSCN) 304, a drive scanner (DSCN) 305, first and second auto-zero circuits (AZRD1) 306 and (AZRD2) 307 and a voltage supply circuit (P11) 317 adapted to supply a drive voltage to the write scanner 304. The display device 300 still further includes a voltage supply circuit (P12) 308 adapted to supply a drive voltage to the drive scanner 305, a voltage supply circuit (P13) 309 adapted to supply a drive voltage to the first auto-zero circuit (AZRD1) 306 and a voltage supply circuit (P14) 310 adapted to supply a drive voltage to the second auto-zero circuit (AZRD2) 307. The display device 300 still further includes the signal line SGL selected by the horizontal selector 303 and supplied with an input signal SIN of a data signal according to brightness information. The display device 300 still further includes the scan line WSL adapted to serve as a second drive wiring to be selected and driven by the write scanner 304 and a drive line DSL adapted to serve as a first drive wiring to be selected and driven by the drive scanner 305. The display device 300 still further includes a first auto-zero line AZL1 adapted to serve as a fourth drive wiring to be selected and driven by the first auto-zero circuit 306 and a second auto-zero line AZL2 adapted to serve as a third drive wiring to be selected and driven by the second auto-zero circuit 307.

It should be noted that these components are formed, for example, on the same panel.

As illustrated in FIGS. 45 and 46, the pixel circuit 301 according to the seventeenth embodiment includes a p-channel TFT 311, n-channel TFTs 312 to 315 and a capacitor C311. The same circuit 301 further includes a light emitting element 316 which includes an organic light emitting diode (OLED), and first and second nodes ND311 and ND312.

A first switching transistor is formed by the TFT 311, a second switching transistor by the TFT 313, a third switching transistor by the TFT 315, and a fourth switching transistor by the TFT 314.

It should be noted that the supply line of the supply voltage Vcc (supply potential) corresponds to a first reference potential, and the ground potential GND to a second reference potential. Further, VSS1 corresponds to a fourth reference potential, and VSS2 to a third reference potential.

In the pixel circuit 301, the TFT 311, the TFT 312 serving as a drive transistor, the first node ND311 and the light emitting element (OLED) 316 are connected in series between the first reference potential (supply potential Vcc in the present embodiment) and the second reference potential (ground potential GND in the present embodiment). More specifically, the light emitting element 316 has its cathode connected to the ground potential GND and its anode connected to the first node ND311. The TFT 312 has its source connected to the first node ND311. The TFT 311 has its drain connected to the drain of the TFT 312 and its source connected to the supply voltage Vcc.

The TFT 312 has its gate connected to the second node ND 312. The TFT 311 has its gate connected to the drive line DSL.

The TFT 313 has its drain connected to the first node 311 and the first electrode of the capacitor C311. The TFT 313 has its source connected to a fixed potential VSS2 and its gate connected to the second auto-zero line AZL2. The capacitor C311 has its second electrode connected to the second node ND312.

The TFT 314 has its source and drain connected between the signal line SGL and the second node ND312. The TFT 314 has its gate connected to the scan line WSL.

Further, the TFT 315 has its source and drain connected between the second node ND312 and the predetermined potential Vss1. The TFT 315 has its gate connected to the first auto-zero line AZL1.

As described above, in the pixel circuit 301 according to the seventeenth embodiment, the capacitor C311 is connected as a pixel capacitance between the gate and source of the TFT 312 serving as a drive transistor. In the same circuit 301, the source potential of the TFT 312 is connected to the fixed potential via the TFT 313 serving as a switching transistor during a non-emission period. Also in the same circuit 301, the gate and drain of the TFT 312 are connected together for correction of the threshold Vth during the same period.

Next, the operation of the above configuration will be described below with emphasis on the pixel circuit operation with reference to FIGS. 47A to 47F.

FIG. 47A illustrates a drive signal DS applied to the drive line DSL. FIG. 47B illustrates a drive signal WS (corresponds to the gate pulse GP in the sixteenth embodiment) applied to the scan line WSL. FIG. 47C illustrates a drive signal AZ1 applied to the first auto-zero line AZL1. FIG. 47D illustrates a drive signal AZ2 applied to the second auto-zero line AZL2. FIG. 47E illustrates the potential of the second node ND312. FIG. 47F illustrates the potential of the first node ND311.

The drive signal DS applied to the drive line DSL by the drive scanner 305 is maintained at high level. The drive signal WS applied to the scan line WSL by the write scanner 304 is maintained at low level. The drive signal AZ1 applied to the auto-zero line AZL1 by the auto-zero circuit 306 is maintained at low level. The drive signal AZ2 applied to the auto-zero line AZL2 by the auto-zero circuit 307 is maintained at high level.

As a result, the TFT 313 turns on. At this time, a current flows via the TFT 313, lowering the source potential of the TFT 312 (potential of the node ND311) to VSS2. As a result, the voltage applied to the light emitting element 316 drops to 0 V, causing the same element 316 to stop emitting light.

In this case, even if the TFT 314 turns on, the voltage held by the capacitor C311, namely, the gate voltage of the TFT 312, remains unchanged.

Next, during a non-emission period of the light emitting element 316, the drive signal AZ1 applied to the auto-zero line AZL1 is set to high level, with the drive signal AZ2 applied to the auto-zero line AZL2 maintained at high level as shown in FIGS. 47C and 47D. This causes the potential of the second node ND312 to drop to VSS1.

Then, after the drive signal AZ2 applied to the auto-zero line AZL2 is switched back to low level, the drive signal DS applied to the drive line DSL by the drive scanner 305 is switched to low level only for a predetermined period of time.

This causes the TFT 313 to turn off and the TFTs 315 and 312 to turn on. As a result, a current flows through the TFTs 312 and 311, raising the potential of the first node.

Then, the drive signal DS applied to the drive line DSL by the drive scanner 305 is switched back to high level, and the drive signal AZ1 back to low level.

As a result, the threshold Vth of the drive transistor TFT 312 is corrected, bringing the potential difference between the second and first nodes ND312 and ND311 equal to Vth.

After a predetermined period of time elapses in this condition, the drive signal WS applied to the scan line WSL by the write scanner 304 is maintained at high level for a predetermined period of time. This causes data to be written to the node ND312 from the data line. While the drive signal WS is at high level, the drive signal DS applied to the drive line DSL by the drive scanner 305 is switched to high level. Then, the drive signal WS is switched to low level.

At this time, the TFT 312 turns on, and the TFT 314 turns off, allowing the mobility to be corrected.

In this case, the TFT 314 is off. The gate-to-source voltage of the TFT 312 is constant. Therefore, the constant current Ids flows from the TFT 312 into the EL light emitting element 316. As a result, the potential of the first node ND311 rises to the voltage Vx where the current Ids flows through the same element 316, causing the same element 316 to emit light.

Also in the present pixel circuit, the current-to-voltage (I-V) characteristic thereof changes if the emission time of the EL light emitting element is long. As a result, the potential of the first node ND311 also changes. However, the gate-to-source voltage of the TFT 312 is maintained constant. Therefore, the current flowing through the EL light emitting element 316 remains unchanged. Hence, even if the I-V characteristic of the same element 316 deteriorates, the constant current Ids continues to flow. As a result, the brightness of the same element 316 remains unchanged.

A display device having the pixel circuit driven as described above can be formed with transistors of identical polarity, namely, n-channel or p-channel transistors (e.g., TFTs), thus allowing to output a positive or negative potential in an accurate manner.

The display device according to the present embodiment can be incorporated in a panel formed by transistors of identical polarity, providing improved production volume and ensuring reduced manufacturing processes and cost.

The display device according to the present embodiment is applicable to a variety of electronic equipment as illustrated in FIG. 48. Among such electronic equipment are a display section 410 of a television set 400 as illustrated in FIG. 48A, display devices 510 and 610 of digital cameras 500 and camcorder 600 as illustrated in FIGS. 48B to 48D, a display device 710 of a laptop PC 700 as illustrated in FIG. 48G and display sections 810 and 910 of mobile terminal devices 800 and 900 as illustrated in FIGS. 48E and 48F.

It should be understood by those skilled in the art that various modifications, combinations, sub-combinations and alterations may occur depending on design requirements and other factor in so far as they are within the scope of the appended claims or the equivalents thereof.

What is claimed is:
1. A voltage supply circuit comprising:
   first and second nodes;

a predetermined potential;

an output transistor having its control terminal connected to the first node, its first terminal connected to the second node and its second terminal connected to an output terminal;

a switching element which turns on in response to an active reset signal to connect the potential and the first and second nodes together;

a first capacitor connected to the first node and supplied with a clock;

a second capacitor connected to the second node and supplied with another clock; and an adjustment section adapted to adjust the clock amplitudes so that the potentials of the first and second nodes vary with a predetermined difference maintained therebetween, wherein the reset signal is basically reverse in phase to the clocks.

2. The voltage supply circuit of claim 1, wherein the adjustment section has the capability to generate first and second clocks different in amplitude from each other and feed the first clock to the first capacitor and the second clock to the second capacitor; and wherein the adjustment section sets the first clock to an amplitude larger than that of the second clock.

3. The voltage supply circuit of claim 1, wherein the adjustment section has an additional capacitance connected to the second node; and wherein the adjustment section has the capability to feed a single clock in parallel to the first and second capacitors.

4. The voltage supply circuit of claim 2, wherein the adjustment section has the capability to generate the reset signal and the first and second clocks from a single clock and feed them to the switching element and the first and second capacitors.

5. The voltage supply circuit of claim 3, wherein the adjustment section has the capability to generate the reset signal and the clock from a single clock and feed them to the switching element and the first and second capacitors.

6. The voltage supply circuit of claim 2, wherein the reset signal leads the first and second clocks.

7. The voltage supply circuit of claim 6, wherein the adjustment section has a delay circuit adapted to delay the clocks with the reset signal.

8. The voltage supply circuit of claim 3, wherein the reset signal leads the first and second clocks.

9. The voltage supply circuit of claim 8, wherein the adjustment section has a delay circuit adapted to delay the clocks with the reset signal.

10. The voltage supply circuit of claim 2, wherein the reset signal is inactive for a longer period than a potential is output from the output transistor.

11. The voltage supply circuit of claim 3, wherein the reset signal is inactive for a longer period than a potential is output from the output transistor.

12. The voltage supply circuit of claim 4, wherein the adjustment section has the capability to generate the reset signal from a clock and an enable signal.

13. The voltage supply circuit of claim 5, wherein the adjustment section has the capability to generate the reset signal from a clock and an enable signal.

14. A voltage supply method for supplying voltage using first and second capacitors and an output transistor, the first capacitor connected to a first node and supplied with a clock, the second capacitor connected to a second node and supplied with another clock, the output transistor having its control terminal connected to the first node, its first terminal connected to the second node, and its second terminal connected to an output terminal, the voltage supply method comprising the steps of:

firstly connecting a predetermined potential and the first and second nodes while a reset signal which is basically reverse in phase to the clocks is active;

secondly adjusting the clock amplitudes so that the potentials of the first and second nodes vary with a predetermined difference maintained therebetween; and thirdly outputting a voltage commensurate with the potential of the second node from the output transistor in response to a variation in potential.

* * * * *